US006824946B2

(12) United States Patent
Oohashi et al.

(10) Patent No.: US 6,824,946 B2
(45) Date of Patent: Nov. 30, 2004

(54) LITHOGRAPHIC PRINTING PLATE PRECURSOR

(75) Inventors: Hidekazu Oohashi, Shizuoka (JP); Kazuto Shimada, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 65 days.

(21) Appl. No.: 09/964,611

(22) Filed: Sep. 28, 2001

(65) Prior Publication Data

US 2002/0068241 A1 Jun. 6, 2002

(30) Foreign Application Priority Data

| | | |
|---|---|---|
| Oct. 3, 2000 | (JP) | P. 2000-303953 |
| Nov. 16, 2000 | (JP) | P. 2000-349715 |
| Dec. 8, 2000 | (JP) | P. 2000-374529 |
| Dec. 8, 2000 | (JP) | P. 2000-374530 |

(51) Int. Cl.[7] .......... G03F 7/021
(52) U.S. Cl. .......... 430/157; 430/163; 430/175; 430/176; 430/270.1; 430/302
(58) Field of Search .......... 430/157, 163, 430/175, 176, 270.1, 302

(56) References Cited

U.S. PATENT DOCUMENTS 5,846,685 A * 12/1998 Pappas et al. .............. 430/156

FOREIGN PATENT DOCUMENTS

| | | |
|---|---|---|
| EP | 0 945 264 A1 | 9/1999 |
| EP | 1 031 414 A1 | 8/2000 |
| EP | 1 048 457 A2 | 11/2000 |
| EP | 1 059 164 A2 | 12/2000 |

* cited by examiner

*Primary Examiner*—John S. Chu
(74) *Attorney, Agent, or Firm*—Burns, Doane, Swecker & Mathis, L.L.P.

(57) ABSTRACT

A lithographic printing plate precursor comprising a support having a hydrophilic surface having provided thereon an image-forming layer containing a hydrophobic high molecular compound having at least either a functional group represented by formula (1) or a functional group represented by formula (2):

(1)

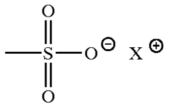

(2)

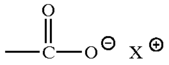

wherein $X^+$ represents an iodonium ion, a sulfonium ion or a diazonium ion.

2 Claims, No Drawings

LITHOGRAPHIC PRINTING PLATE PRECURSOR

FIELD OF THE INVENTION

The present invention relates to a lithographic printing plate precursor, and specifically a lithographic printing plate precursor comprising a support having provided thereon a photosensitive layer (also referred to as an image-forming layer) capable of plate-making by scanning exposure based on digital signals, and capable of water development, or capable of mounting on a printing machine for performing printing with requiring no development.

BACKGROUND OF THE INVENTION

A lithographic printing plate generally comprises a lipophilic image area which receives an ink and a hydrophilic non-image area which receives fountain solution during printing. As such a lithographic printing plate precursor, a PS plate (presensitized plate) comprising a hydrophilic support having provided thereon a lipophilic photosensitive resin layer has so far been widely used, and the plate-making method generally comprises performing mask exposure through a lith film and then dissolving and removing a non-image area with a developing solution to thereby obtain a printing plate.

Digitized techniques of electronically processing image data with a computer have prevailed in recent years, and various image output systems corresponding to these digitized techniques have been put to practical use. With such a trend, a computer-to-plate technique of directly making a printing plate by scanning digitized image data with highly directive actinic radiation such as laser beams without using a lith film has been earnestly desired, and it has become an important technical problem to obtain a printing plate precursor well adapted to this purpose.

On the other hand, the plate-making process of the PS plate hitherto in use is indispensably accompanied by wet process of dissolution and removal of a non-image area after exposure, this is another problem which has been desired to be improved. In particular, global environmental protection has been a matter of concern in the industry at large in recent years. There are hence increased demands for simplification of processing, switching over to dry process, and no processing from the viewpoint of environmental aspect and rationalization of the process with digitization.

As one plate-making method which does away with former processing steps, there is a development on machine system of using a photosensitive layer capable of removing the non-image area of a printing plate precursor in usual printing process without carrying out former development process, and effecting development after exposure on a printing machine to thereby obtain a final printing plate. However, one big problem of the development on machine system is that the printing plate precursor must be stored under a completely light-shielded state and/or under a constant temperature condition after exposure, e.g., during the period of time until the printing plate precursor is mounted on a printing machine, because the fixation of the photosensitive layer is not performed.

On the other hand, solid state lasers having high output, e.g., a semiconductor laser and a YAG laser are inexpensively available in recent years. As a result, a method of using these lasers is promising as a plate-making method by scanning exposure. In the method of high power density exposure using these high output lasers, various development systems can be utilized differing from photo-reactions used in photosensitive materials for low to middle power density exposure. Light energy absorbed by photosensitive materials is converted to heat and desired development is caused by the generated heat.

A big advantage of a plate-making method utilizing heat mode recording is that the material is not sensitized by exposure to light of general illuminance level and in normal atmospheric temperature, and fixation of the image after exposure is not essential. Accordingly, for example, when a photosensitive layer which is insolubilized or solubilized by heat mode exposure is used in a plate-making process by the on-press development system, it becomes possible to realize a system in which the image obtained is not influenced even development (removal of a non-image area) is performed after the printing plate precursor is exposed to atmospheric light for a certain period of time after image exposure.

Accordingly, if heat mode recording is utilized, it will be possible to obtain a lithographic printing plate precursor which is adapted to the on-press development system.

A method is suggested as one preferred plate-making method of a lithographic printing plate based on heat mode recording, which comprises the steps of providing a hydrophobic image-forming layer on a hydrophilic support, imagewise exposing the image-forming layer by heat mode exposure to convert the solubility/dispersibility of the hydrophobic image-forming layer, and removing a non-image area by wet development, according to necessity.

However, the image-forming layer as above is not sufficient in heat sensitivity, hence the sensitivity to heat mode scanning exposure is extremely unsatisfactory. Further, it is also a problem in practical use that the discrimination of hydrophobicity/hydrophilicity before and after exposure, i.e., the change in solubility, is small. It is almost impossible to perform plate-making by the on-press development system with poor discrimination.

SUMMARY OF THE INVENTION

Accordingly, an object of the present invention is to provide a lithographic printing plate precursor which is capable of plate-making by scanning exposure with a solid state laser and a semiconductor laser emitting infrared rays based on digital signals, which is high sensitivity, and causes no stains due to residual films.

Another object of the present invention is to provide a lithographic printing plate precursor which can be developed by water or an aqueous solution, or can be mounted on a printing machine to perform printing with requiring no development.

As a result of eager investigation of the present inventors for achieving the above objects, it has been found that the above problems have been solved by the following lithographic printing plate precursor, thus the present invention has been accomplished.

That is, the present invention is as follows.

(1) A lithographic printing plate precursor comprising a support having a hydrophilic surface having provided thereon an image-forming layer containing a hydrophobic high molecular compound having at least either a functional group represented by formula (1) or a functional group represented by formula (2):

(1)

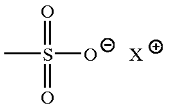

(2)

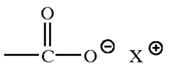

wherein $X^+$ represents an iodonium ion, a sulfonium ion or a diazonium ion.

(2) A lithographic printing plate precursor comprising a support having a hydrophilic surface having provided thereon an image-forming layer containing a hydrophobic infrared ray absorber having at least either a functional group represented by formula (1) or a functional group represented by formula (2):

(1)

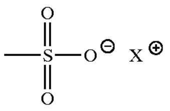

(2)

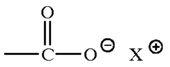

wherein $X^+$ represents an iodonium ion, a sulfonium ion or a diazonium ion.

(3) The lithographic printing plate precursor as described in the above item (1) or (2), wherein the image-forming layer contains a compound having at least either a functional group represented by formula (3) or a functional group represented by formula (4):

(3)

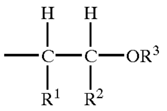

(4)

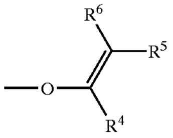

wherein $R^1$ and $R^2$ each represents a hydrogen atom, an alkyl group, an aryl group, an alkynyl group or an alkenyl group; $R^3$ represents an alkyl group, an aryl group, an alkynyl group or an alkenyl group; $R^4$ represents a hydrogen atom, an alkyl group, an aryl group, an alkynyl group or an alkenyl group; either $R^5$ or $R^6$represents a hydrogen atom and the other represents a hydrogen atom, an alkyl group, an aryl group, an alkynyl group or an alkenyl group; and arbitrary two of $R^1$, $R^2$ and $R^3$ may form a ring, and arbitrary two of $R^4$, $R^5$ and $R^6$ may form a ring.

The iodonium ion, sulfonium ion and diazonium ion represented by $X^+$ are well known in the industry as acid-generating agents and they form the acids of corresponding counter anions by irradiation with actinic rays and/or heating. In conventional lithographic printing plates, the thus-generated acids have been used in a crosslinking reaction or as the catalysts to cause the decomposition of acid-decomposable functional groups.

Contrary to this, according to the lithographic printing plate precursor of the present invention, a sulfonate group and a carboxylate group such as the above functional groups are converted to a sulfonic acid and a carboxylic acid respectively by irradiation with actinic rays or heating, and the originally hydrophobic high molecular compound changes to hydrophilic, by which the image-forming layer is also converted to hydrophilic. By developing the lithographic printing plate precursor with water, an aqueous liquid or a fountain solution on a printing machine, the image-forming layer of the heated area is dissolved and removed, thereby a lithographic printing plate is made.

Further, the infrared ray absorber contained in the image-forming layer has at least either a functional group represented by formula (1) or a functional group represented by formula (2), and the infrared ray absorber changes to hydrophilic by irradiation with actinic rays and/or heating due to having the functional group. Therefore, the infrared ray absorber does not remain as a residual color at the exposed area, or does not form scummy solid phase in a fountain solution during printing, thus an excellent lithographic printing plate which does not cause stains can be obtained.

Further, a compound having functional groups represented by formula (3) and/or (4) is contained in the image-forming layer of the lithographic printing plate precursor. By containing the compound, it is possible to change the image-forming layer to soluble in an aqueous liquid with less energy. The cause of this fact is not clear but it is thought due to the following mechanism.

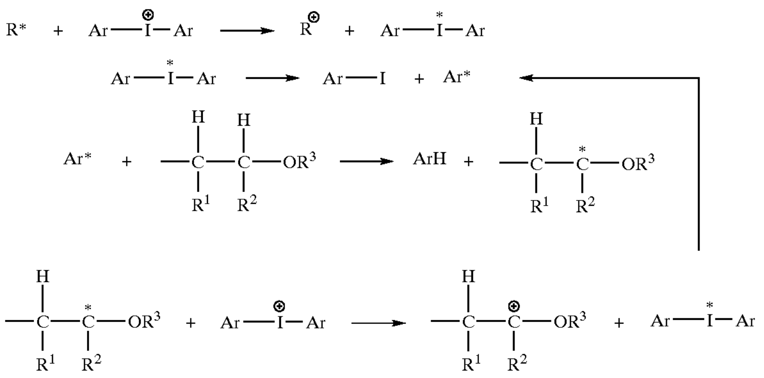

-continued

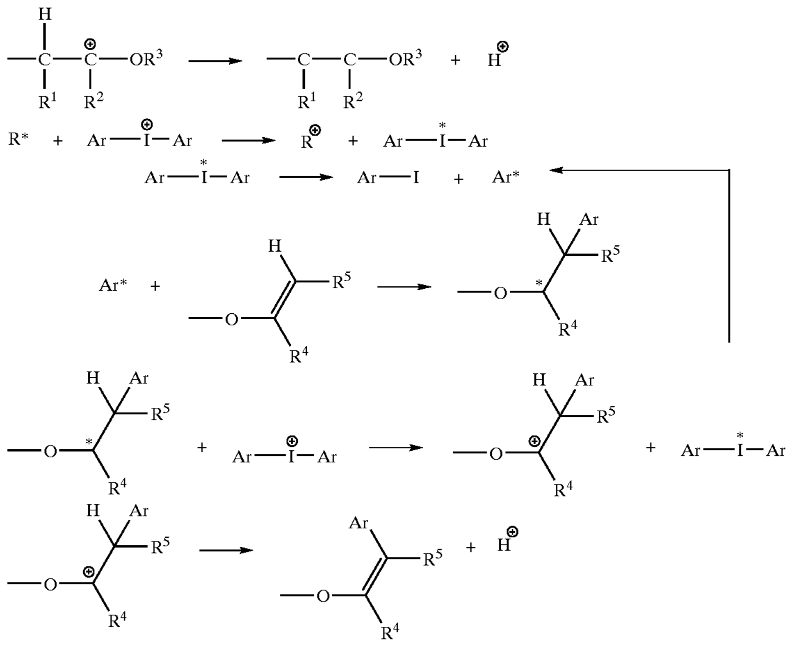

As described above, the lithographic printing plate precursor according to the present invention is capable of direct plate-making from digital data of a computer by recording with a thermal head, a solid state laser emitting infrared rays and a semiconductor laser, or a solid state laser emitting visible rays and a semiconductor laser, and a lithographic printing plate showing high sensitivity and high press life and not causing stains can be obtained.

DETAILED DESCRIPTION OF THE INVENTION

The present invention is described in detail below.

The lithographic printing plate precursor according to the present invention is:

(1) a lithographic printing plate precursor comprising a support having a hydrophilic surface having provided thereon an image-forming layer containing a hydrophobic high molecular compound having at least either a functional group represented by formula (1) or a functional group represented by formula (2), in which the compound is converted to hydrophilic by irradiation with actinic rays and/or heating (hereinafter referred to as the polarity conversion high molecular compound according to the present invention):

(1)

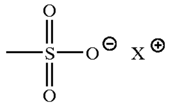

(2)

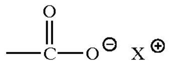

wherein $X^+$ represents an iodonium ion, a sulfonium ion or a diazonium ion;

(2) a lithographic printing plate precursor comprising a support having a hydrophilic surface having provided thereon an image-forming layer containing a hydrophobic infrared ray absorber having at least either a functional group represented by formula (1) or a functional group represented by formula (2) (hereinafter referred to as the infrared ray absorber according to the present invention):

(1)

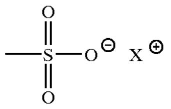

(2)

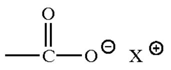

wherein $X^+$ represents an iodonium ion, a sulfonium ion or a diazonium ion; and (3) the lithographic printing plate precursor as described in the above item (1) or (2), wherein the image-forming layer contains a compound having at least either a functional group represented by formula (3) or a functional group represented by formula (4) (hereinafter referred to as a decomposition-accelerating compound):

(3)

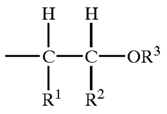

(4)

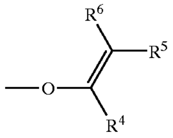

wherein $R^1$ and $R^2$ each represents a hydrogen atom, an alkyl group, an aryl group, an alkynyl group or an alkenyl group; $R^3$ represents an alkyl group, an aryl group, an alkynyl group or an alkenyl group; $R^4$ represents a hydrogen atom, an alkyl group, an aryl group, an alkynyl group or an alkenyl group; either $R^5$or $R^6$represents a hydrogen atom and the other represents a hydrogen atom, an alkyl group, an aryl group, an alkynyl group or an alkenyl group; and arbitrary two of $R^1$, $R^2$ and $R^3$ may form a ring, and arbitrary two of $R^4$, $R^5$ and $R^6$ may form a ring.

[Polarity Conversion High Molecular Compound According to the Present Invention]

"A polarity conversion high molecular compound" for use in the present invention is a hydrophobic high molecular compound having a functional group represented by formula (1) or (2) which is converted into hydrophilic by irradiation with actinic rays and/or heating. The conversion from hydrophobic to hydrophilic should be the conversion of the degree that a compound which does not show the affinity such as dissolution or swelling in water at normal temperature comes to show the affinity such as dissolution or swelling in water due to the conversion of a part of or the entire of the sulfonate group and/or the carboxylate group represented by formula (1) or (2) to a sulfonic acid and/or a carboxylic acid when the compound is irradiated with actinic rays or heat is applied to the compound by a thermal head.

The iodonium ion, sulfonium ion and diazonium ion represented by $X^+$ may be any compounds as long as they can make a polarity conversion high molecular compound hydrophobic before conversion and can make the polarity conversion high molecular compound hydrophilic after conversion. The iodonium ion, sulfonium ion and diazonium ion represented by the following formulae (5) to (7) are particularly preferred in view of the hydrophobicity of a polarity conversion high molecular compound before conversion and storage stability.

(5)

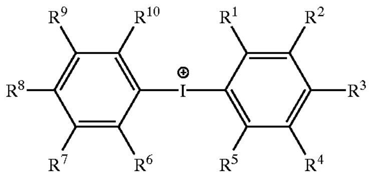

(6)

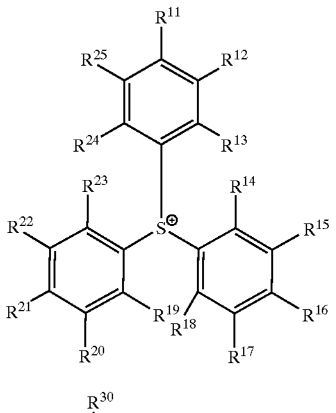

(7)

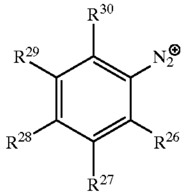

wherein $R^1$ to $R^{30}$ each represents a hydrogen atom, a halogen atom, a cyano group, a nitro group, an alkyl group, an aryl group, an alkynyl group, an alkenyl group, or a functional group represented by any of the following formulae; $R^{31}$, $R^{32}$ and $R^{33}$ each represents a hydrogen atom, an alkyl group, an aryl group, an alkynyl group or an alkenyl group; and arbitrary two of $R^1$ to $R^{10}$ may form a ring, arbitrary two of $R^{11}$ to $R^{25}$ may form a ring, and arbitrary two of $R^{26}$ to $R^{30}$ may form a ring.

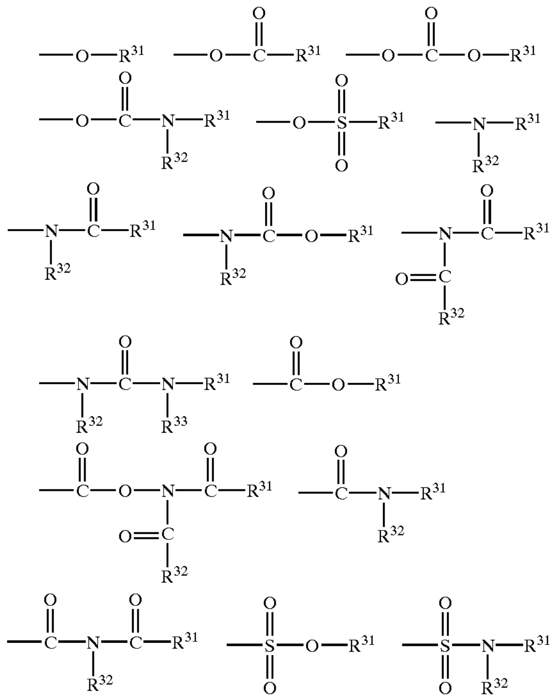

wherein $R^{31}$ and $R^{32}$ each represents a hydrogen atom, an alkyl group, an aryl group, an alkynyl group or an alkenyl group.

When $R^1$ to $R^{30}$ each represents an alkyl group, the alkyl group is a straight chain, branched or cyclic alkyl group having from 1 to 20 carbon atoms (e.g., methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl). Of these groups, a straight chain alkyl group having from 1 to 12 carbon atoms, a branched alkyl group having from 3 to 12 carbon atoms, and a cyclic alkyl group having from 5 to 10 carbon atoms are more preferred.

When $R^1$ to $R^{30}$ each represents a substituted alkyl group, monovalent nonmetallic atomic groups exclusive of a hydrogen atom are used as the substituents. The preferred examples of the substituents of the substituted alkyl group include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a phosphonato group), a dialkylphosphono group (—$PO_3$(alkyl)$_2$) a diarylphosphono group (—$PO_3$(aryl)$_2$), an alkylarylphosphono group (—$PO_3$(alkyl) (aryl)), a monoalkylphosphono group (—$PO_3H$ (alkyl)) and a conjugate base group thereof (hereinafter referred to as an alkylphosphonato group), a monoarylphosphono group (—$PO_3H$ (aryl)) and a conjugate base group thereof (hereinafter referred to as an arylphosphonato group), a phosphonooxy group (—$OPO_3H_2$) and a conjugate base group thereof (hereinafter referred to as a phosphonatooxy group), a dialkylphosphonooxy group (—$OPO_3$(alkyl)$_2$), a diarylphosphonooxy group (—$OPO_3$ (aryl)$_2$), an alkylarylphosphonooxy group (—$OPO_3$(alkyl) (aryl)), amonoalkylphosphonooxy group (—$OPO_3H$(alkyl)) and a conjugate base group thereof (hereinafter referred to as an alkylphosphonatooxy group), a monoarylphosphonooxy group (—$OPO_3H$(aryl)) and a conjugate base group thereof (hereinafter referred to as an arylphosphonatooxy group), a cyano group, a nitro group, an aryl group, an alkenyl group, and an alkynyl group.

As the specific examples of the alkyl groups in these substituents of the substituted alkyl groups, the above-described alkyl groups can be exemplified, and as the specific examples of the aryl groups in these substituents, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group can be exemplified.

As the examples of the alkenyl groups in these substituents, a vinyl group, a 1-propenyl group, a 1-butenyl group, a cinnamyl group and a 2-chloro-1-ethenyl group can be exemplified. As the examples of the alkynyl groups, an ethynyl group, a 1-propynyl group, a 1-butynyl group and a trimethylsilylethynyl group can be exemplified. As $R^{41}$ in the acyl group ($R^{41}$CO—), a hydrogen atom and the above-described alkyl groups and aryl groups can be exemplified.

Of these substituents, more preferred groups include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, and an alkenyl group.

On the other hand, as the alkylene group in the substituted alkyl groups, divalent organic residues obtained by removing any one hydrogen atom on the above-described alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms. The specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an a-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R^1$ to $R^{30}$ each represents an aryl group, the examples of the aryl groups include a condensed ring formed by 1 to 3 benzene rings and a condensed ring formed by a benzene ring and a 5-membered unsaturated ring, and the specific examples of such aryl groups include a phenyl group, a naphthyl group, an anthryl group, a phenanthryl group, an indenyl group, an acenaphthenyl group and a fluorenyl group. Of these groups, a phenyl group and a naphthyl group are more preferred. Heterocyclic aryl groups are included in the aryl group besides the above carbocyclic aryl groups. As the heterocyclic aryl groups, those containing from 3 to 20 carbon atoms and from 1 to 5 hetero atoms, e.g., a pyridyl group, a furyl group, and a quinolyl group, a benzofuryl group, a thioxanthone group and a carbazole group condensed with a benzene ring are used.

When $R^1$ to $R^{30}$ each represents a substituted aryl group, the substituted aryl groups are those having, as the substituents, monovalent nonmetallic atomic groups exclusive of a hydrogen atom on the ring-forming carbon atoms of the above-described aryl groups. As the preferred examples of the substituents, the above-described alkyl groups and substituted alkyl groups, and the groups described above as the examples of the substituents for the substituted alkyl groups can be exemplified.

The preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

When $R^1$ to $R^{30}$ each represents an alkenyl group, a substituted alkenyl group [—C($R^{42}$)═C($R^{43}$) ($R^{44}$)], an alkynyl group, or a substituted alkynyl group [—C≡C ($R^{45}$)], monovalent nonmetallic atomic groups can be used as $R^{42}$, $R^{43}$, $R^{44}$ and $R^{45}$.

The preferred examples of $R^{42}$, $R^{43}$, $R^{44}$ and $R^{45}$ include a hydrogen atom, a halogen atom, an alkyl group, a substituted alkyl group, an aryl group and a substituted aryl group, and the above exemplified groups can be used as the specific examples of these groups. $R^{42}$, $R^{43}$, $R^{44}$ and $R^{45}$ each more preferably represents a hydrogen atom, a halogen atom, or a straight chain, branched or cyclic alkyl group having from 1 to 10 carbon atoms.

The specific examples of the alkenyl groups, substituted alkenyl groups, alkynyl groups, and substituted alkynyl groups include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethyl group.

Of these groups, the preferred functional groups represented by $R^1$ to $R^{30}$ from the viewpoint of storage stability and the hydrophobicity of a polarity conversion high molecular compound before conversion are a hydrogen atom, a halogen atom, an alkyl group, an aryl group, an alkynyl group, an alkenyl group, a cyano group, and functional groups represented by the following formulae.

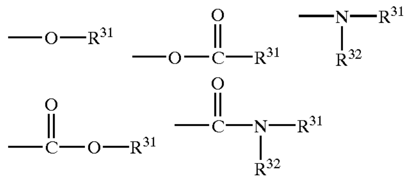

wherein $R^{31}$ and $R^{32}$ each represents a hydrogen atom, an alkyl group, an aryl group, an alkynyl group or an alkenyl group.

The specific examples of iodonium ions, sulfonium ions and diazonium ions are shown below, but the present invention is not limited thereto.

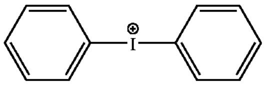

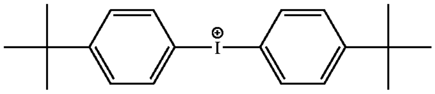

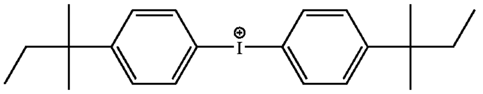

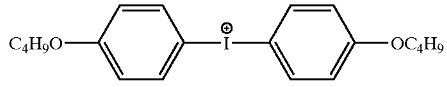

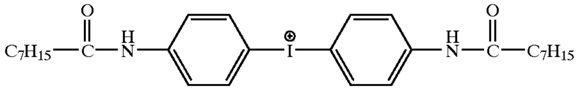

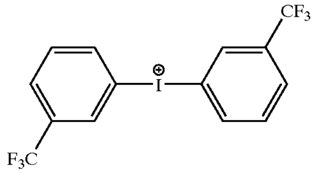

-continued

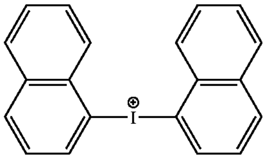

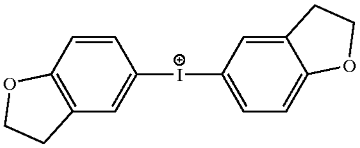

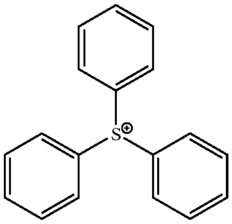

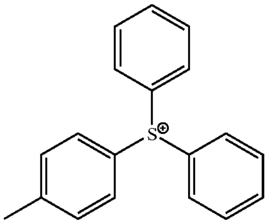

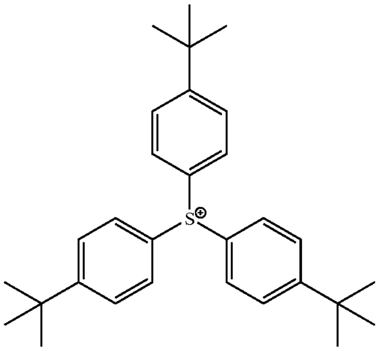

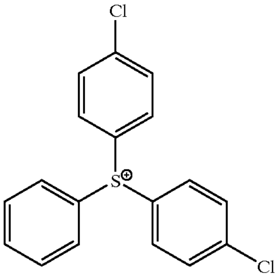

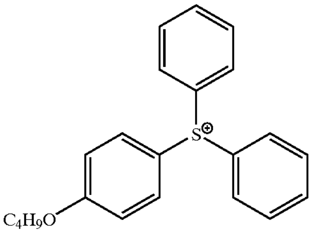

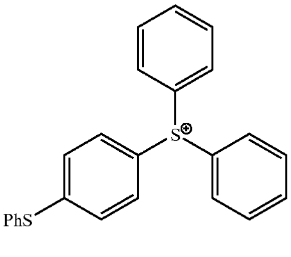

-continued

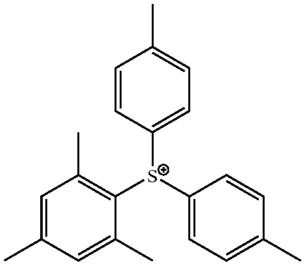

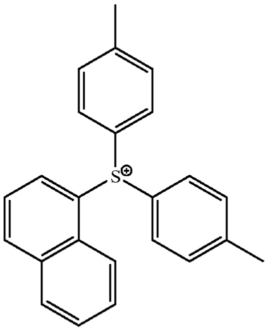

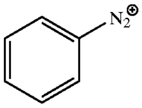

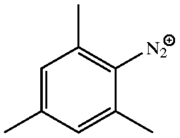

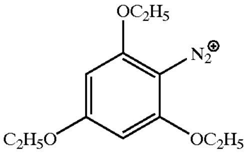

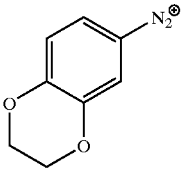

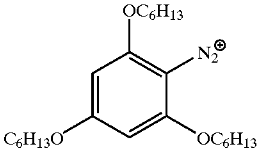

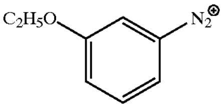

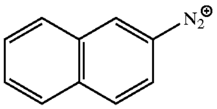

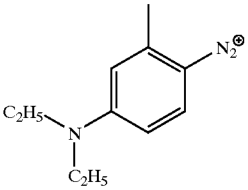

The polarity conversion high molecular compound for use in the present invention can be synthesized by homopolymerization or copolymerization of a monomer having a functional group represented by formula (1) or (2), or copolymerization with other monomers. However, from the viewpoint of polymerizability, it is preferred to synthesize a high molecular compound by using a monomer having a functional group capable of converting to a functional group represented by formula (1) or (2) (hereinafter referred to as "a precursor monomer"), and then introduce the functional group of the synthesized compound to a functional group represented by formula (1) or (2).

The specific examples of the precursor monomers for use in radical polymerization are shown below, but the present invention is not limited thereto.

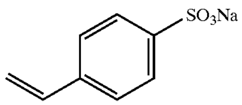
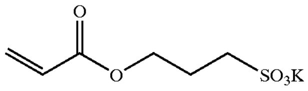
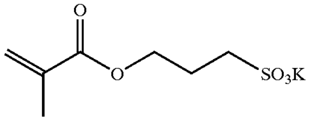
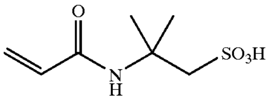
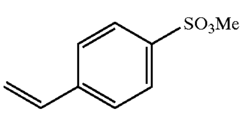
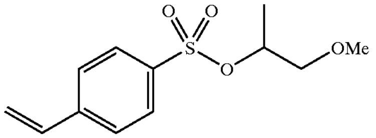
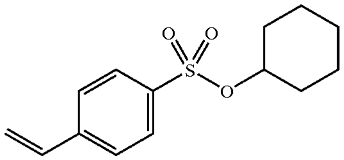
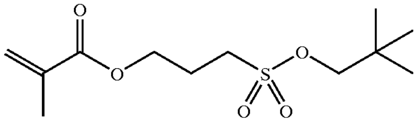
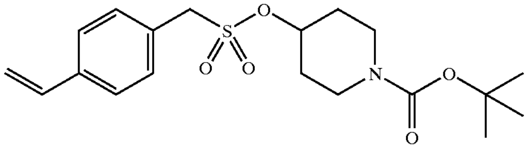
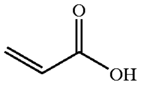
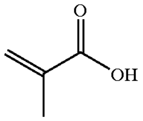
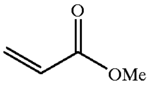
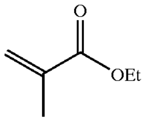
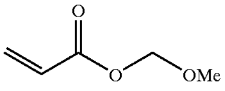
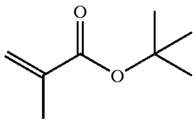
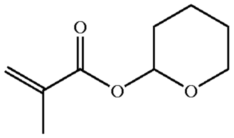
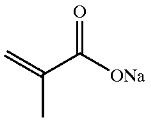
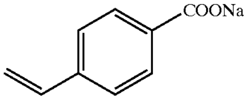

The polarity conversion high molecular compound for use in the present invention can be derived from the high molecular compounds obtained by homopolymerizing a precursor monomer as described above or copolymerizing two or more precursor monomers, but the polarity conversion high molecular compound can be derived from the high molecular compound obtained by copolymerizing a precursor monomer and other high molecular compound as long as the effect of the present invention is not hindered. As such radical polymerizable monomers, the following monomers can be exemplified.

As other radical polymerizable monomers which can be used in the copolymers, the following well-known monomers can be exemplified, e.g., acrylic acid, acrylates, acrylamides, methacrylic acid, methacrylates, methacrylamides, maleic acid, maleic anhydride, maleates, maleic acid amides, maleic acid imides, itaconic acid, itaconic anhydride, itaconates, itaconic acid amides, itaconic acid imides, crotonic acid, crotonates, crotonic acid amides, fumaric acid, fumarates, fumaric acid amides, mesaconic acid, mesaconates, mesaconic acid amides, α,β-unsaturated lactones, α,β-unsaturated lactams, unsaturated hydrocarbons, vinyl ethers, vinyl esters, α,β-unsaturated ketones, and styrenes.

The specific examples of acrylates include methyl acrylate, ethyl acrylate, (n- or i-)propyl acrylate, (n-, i-, sec- or t-)butyl acrylate, pentyl acrylate, hexyl acrylate, heptyl acrylate, octyl acrylate, nonyl acrylate, decyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

The specific examples of acrylamides include acrylamide, N-methylacrylamide, N-ethylacrylamide, N-(n- or i-)propylacrylamide, N-(n-, i-, sec- or t-)acrylamide, N-benzylacrylamide, N-hydroxyethylacrylamide, N-phenylacrylamide, N-tolylacrylamide, N-(hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide, and N-hydroxyethyl-N-methylacrylamide.

The specific examples of methacrylates include methyl methacrylate, ethyl methacrylate, (n- or i-)propyl methacrylate, (n-, i-, sec- or t-)butyl methacrylate, pentyl methacrylate, hexyl methacrylate, heptyl methacrylate, octyl methacrylate, nonyl methacrylate, decyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

The specific examples of methacrylamides include methacrylamide, N-methylmethacrylamide, N-ethylmethacrylamide, N-(n- or i-)propylmethacrylamide, N-(n-, i-, sec- or t-)methacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl) methacrylamide, N-(phenylsulfonyl)methacrylamide, N-(tolylsulfonyl)methacrylamide, N,N-dimethylmethacrylamide, N-methyl-N-phenylmethacrylamide, and N-hydroxyethyl-N-methylmethacrylamide.

The specific examples of crotonates include methyl crotonate, ethyl crotonate, (n- or i-)propyl crotonate, (n-, i-, sec- or t-)butyl crotonate, pentyl crotonate, hexyl crotonate, heptyl crotonate, octyl crotonate, nonyl crotonate, decyl crotonate, amyl crotonate, 2-ethylhexyl crotonate, dodecyl crotonate, chloroethyl crotonate, 2-hydroxyethyl crotonate, 2-hydroxypropyl crotonate, 5-hydroxypentyl crotonate, cyclohexyl crotonate, allyl crotonate, trimethylolpropane monocrotonate, pentaerythritolmonocrotonate, benzyl crotonate, methoxybenzyl crotonate, chlorobenzyl crotonate, hydroxybenzyl crotonate, hydroxyphenethyl crotonate, dihydroxyphenethyl crotonate, furfuryl crotonate, tetrahydrofurfuryl crotonate, phenyl crotonate, hydroxyphenyl crotonate, chlorophenyl crotonate, sulfamoylphenyl crotonate, and 2-(hydroxyphenylcarbonyloxy)ethyl crotonate.

The specific examples of crotonic acid amides include crotonic acid amide, N-methylcrotonic acid amide, N-ethylcrotonic acid amide, N-(n- or i-)propylcrotonic acid amide, N-(n-, i-, sec- or t-)crotonic acid amide, N-benzylcrotonic acid amide, N-hydroxyethylcrotonic acid amide, N-phenylcrotonic acid amide, N-tolylcrotonic acid amide, N-(hydroxyphenyl)crotonic acid amide, N-(sulfamoylphenyl)crotonic acid amide, N-(phenylsulfonyl)crotonic acid amide, N-(tolylsulfonyl) crotonic acid amide, N,N-dimethylcrotonic acid amide, N-methyl-N-phenylcrotonic acid amide, and N-hydroxyethyl-N-methylcrotonic acid amide.

The specific examples of maleates include dimethyl maleate, diethyl maleate, di-(n- or i-)propyl maleate, di-(n-, i-, sec- or t-)butyl maleate, diphenyl maleate, diallyl maleate, monomethyl maleate, monoethyl maleate, mono-(n- or i-)propyl maleate, mono-(n-, i-, sec- or t-)butyl maleate, dibenzyl maleate, monobenzyl maleate, methylethyl maleate, methylpropyl maleate, and ethylpropyl maleate.

The specific examples of maleic acid amides include maleic acid amide, N-methylmaleic acid amide, N-ethylmaleic acid amide, N-(n- or i-)propylmaleic acid amide, N-(n-, i-, sec- or t-)butylmaleic acid amide, N-benzylmaleic acid amide, N-hydroxyethylmaleic acid amide, N-phenylmaleic acid amide, N-tolylmaleic acid amide, N-(hydroxyphenyl)maleic acid amide, N-(sulfamoylphenyl)maleic acid amide, N-(phenylsulfonyl) maleic acid amide, N-(tolylsulfonyl)maleic acid amide, N,N-dimethylmaleic acid amide, N-methyl-N-phenylmaleic acid amide, N-hydroxyethyl-N-methylmaleic acid amide, N-methylmaleic acid monoamide, N-ethylmaleic acid monoamide, N,N-dimethylmaleic acid monoamide, N-methyl-N'-ethylmaleic acid amide, and N-methyl-N'-phenylmaleic acid amide.

The specific examples of maleic acid imides include maleic acid imide, N-methylmaleic acid imide, N-ethylmaleic acid imide, N-(n- or i-)propylmaleic acid imide, N-(n-, i-, sec- or t-)butylmaleic acid imide, N-benzylmaleic acid imide, N-hydroxyethylmaleic acid imide, N-phenylmaleic acid imide, N-tolylmaleic acid imide, N-(hydroxyphenyl)maleic acid imide, N-(sulfamoylphenyl)maleic acid imide, N-(phenylsulfonyl) maleic acid imide, and N-(tolylsulfonyl)maleic acid imide.

The specific examples of itaconates include dimethyl itaconate, diethyl itaconate, di-(n- or i-)propyl itaconate, di-(n-, i-, sec- or t-)butyl itaconate, diphenyl itaconate, diallyl itaconate, monomethyl itaconate, monoethyl itaconate, mono-(n-or i-)propyl itaconate, mono-(n-, i-, sec- or t-)butyl itaconate, dibenzyl itaconate, monobenzyl itaconate, methylethyl itaconate, methylpropyl itaconate and ethylpropyl itaconate.

The specific examples of itaconic acid amides include itaconic acid amide, N-methylitaconic acid amide, N-ethylitaconic acid amide, N-(n- or i-)propylitaconic acid amide, N-(n-, i-, sec- or t-)butylitaconic acid amide, N-benzylitaconic acid amide, N-hydroxyethylitaconic acid amide, N-phenylitaconic acid amide, N-tolylitaconic acid amide, N-(hydroxyphenyl)itaconic acid amide, N-(sulfamoylphenyl)itaconic acid amide, N-(phenylsulfonyl)itaconic acid amide, N-(tolylsulfonyl) itaconic acid amide, N,N-dimethylitaconic acid amide, N-methyl-N-phenylitaconic acid amide, N-hydroxyethyl-N-methylitaconic acid amide, N-methylitaconic acid monoamide, N-ethylitaconic acid monoamide, N,N-dimethylitaconic acid monoamide, N-methyl-N'-ethylitaconic acid amide, and N-methyl-N'-phenylitaconic acid amide.

The specific examples of itaconic acid imides include itaconic acid imide, N-methylitaconic acid imide, N-ethylitaconic acid imide, N-(n- or i-)propylitaconic acid imide, N-(n-, i-, sec- or t-)butylitaconic acid imide, N-benzylitaconic acid imide, N-hydroxyethylitaconic acid imide, N-phenylitaconic acid imide, N-tolylitaconic acid imide, N-(hydroxyphenyl)itaconic acid imide, N-(sulfamoylphenyl)itaconic acid imide, N-(phenylsulfonyl)itaconic acid imide, and N-(tolylsulfonyl)itaconic acid imide.

The specific examples of fumarates include dimethyl fumarate, diethyl fumarate, di-(n- or i-)propyl fumarate, di-(n-, i-, sec- or t-)butyl fumarate, diphenyl fumarate, diallyl fumarate, monomethyl fumarate, monoethyl fumarate, mono-(n- or i-)propyl fumarate, mono-(n-, i-, sec- or t-)butyl fumarate, dibenzyl fumarate, monobenzyl fumarate, methylethyl fumarate, methylpropyl fumarate, and ethylpropyl fumarate.

The specific examples of fumaric acid amides include fumaric acid amide, N-methylfumaric acid amide, N-ethylfumaric acid amide, N-(n- or i-)propylfumaric acid amide, N-(n-, i-, sec- or t-)butylfumaric acid amide, N-benzylfumaric acid amide, N-hydroxyethylfumaric acid amide, N-phenylfumaric acid amide, N-tolylfumaric acid amide, N-(hydroxyphenyl)fumaric acid amide, N-(sulfamoylphenyl)fumaric acid amide, N-(phenylsulfonyl)fumaric acid amide, N-(tolylsulfonyl) fumaric acid amide, N,N-dimethylfumaric acid amide, N-methyl-N-phenylfumaric acid amide, N-hydroxyethyl-N-methylfumaric acid amide, N-methylfumaric acid monoamide, N-ethylfumaric acid monoamide, N,N-dimethylfumaric acid monoamide, N-methyl-N'-ethylfumaric acid amide, and N-methyl-N'-phenylfumaric acid amide.

The specific examples of mesaconates include dimethyl mesaconate, diethyl mesaconate, di-(n- or i-)propyl mesaconate, di-(n-, i-, sec- or t-)butyl mesaconate, diphenyl mesaconate, diallyl mesaconate, monomethyl mesaconate, monoethyl mesaconate, mono-(n- or i-)propyl mesaconate, mono-(n-, i-, sec- or t-)butyl mesaconate, dibenzyl mesaconate, monobenzyl mesaconate, methylethyl mesaconate, methylpropyl mesaconate, and ethylpropyl mesaconate.

The specific examples of mesaconic acid amides include mesaconic acid amide, N-methylmesaconic acid amide, N-ethylmesaconic acid amide, N-(n- or i-)propylmesaconic acid amide, N-(n-, i-, sec- or t-)butylmesaconic acid amide, N-benzylmesaconic acid amide, N-hydroxyethylmesaconic acid amide, N-phenylmesaconic acid amide, N-tolylmesaconic acid amide, N-(hydroxyphenyl) mesaconic acid amide, N-(sulfamoylphenyl)mesaconic acid amide, N-(phenylsulfonyl)mesaconic acid amide, N-(tolylsulfonyl)mesaconic acid amide, N,N-dimethylmesaconic acid amide, N-methyl-N-phenylmesaconic acid amide, N-hydroxyethyl-N-methylmesaconic acid amide, N-methylmesaconic mesaconic acid monoamide, N-ethylmesaconic acid monoamide, N,N-dimethylmesaconic acid monoamide, N-methyl-N'-ethylmesaconic acid amide, and N-methyl-N'-phenylmesaconic acid amide.

The specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene, and sodium 4-vinylbenzenesulfonate.

As the specific examples of α,β-unsaturated lactones, the following compounds can be exemplified.

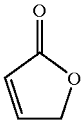
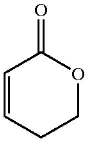
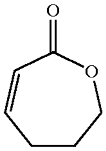
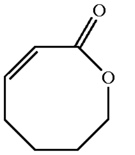
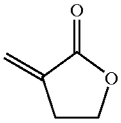
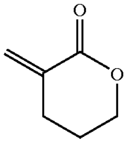
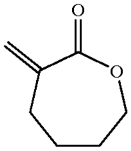
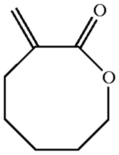
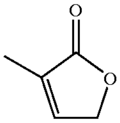
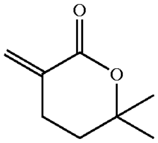
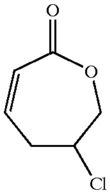
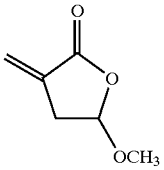
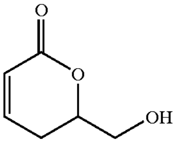
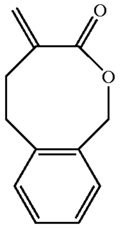
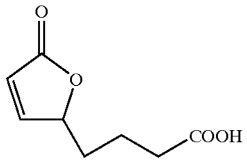
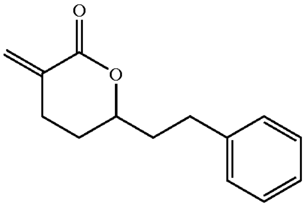
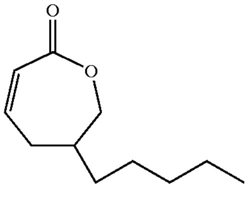
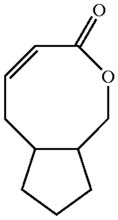

As the specific examples of α,β-unsaturated lactams, the following compounds can be exemplified.

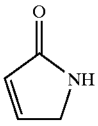
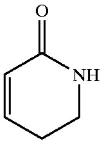
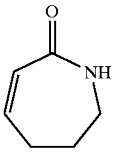
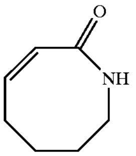
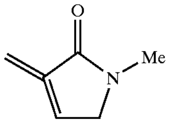
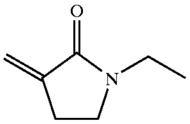
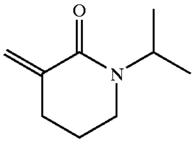
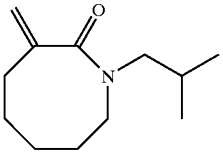
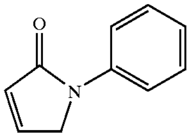
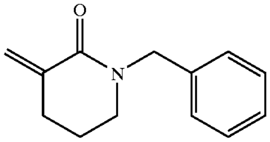
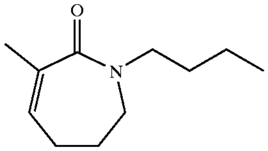
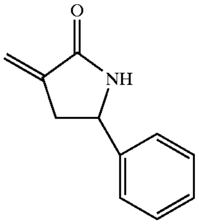
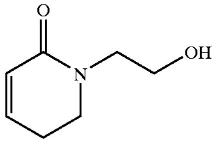
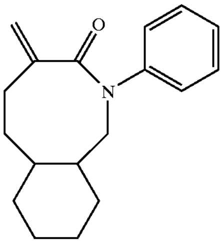
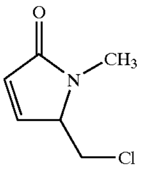
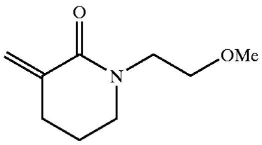
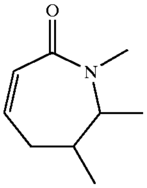
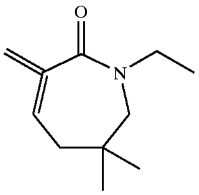
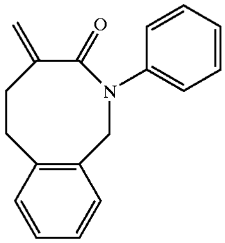

As the specific examples of unsaturated hydrocarbons, the following compounds can be exemplified.

$H_2C{=}CH_2$ $H_2C{=}CHCH_2$ $HC{=}CH$ $HC{=}CCH_3$

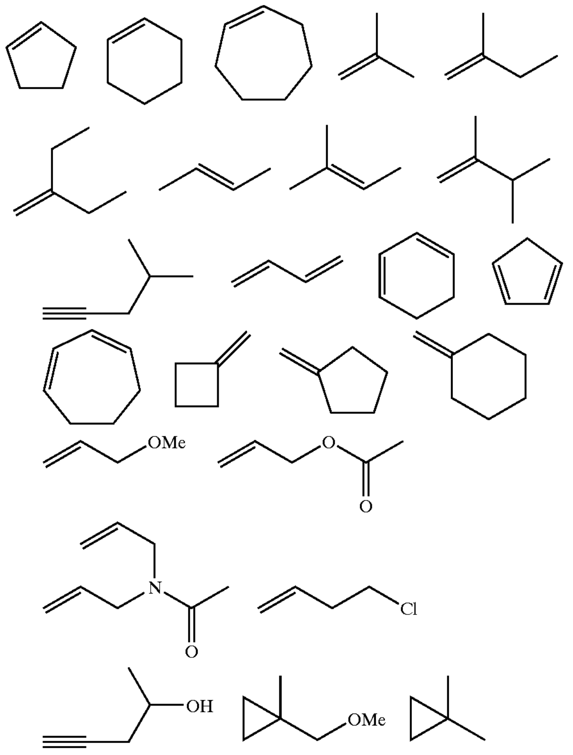

As the specific examples of vinyl ethers, the following compounds can be exemplified.

$H_2C{=}CHOCH_3$ $H_2C{=}CHOCH_2CH_3$ 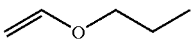

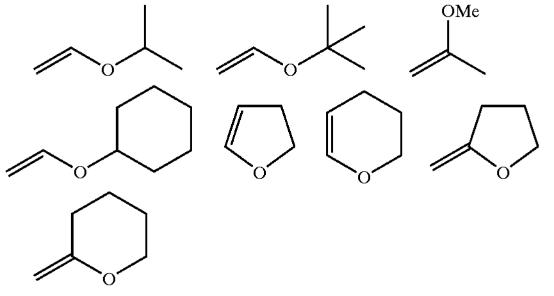

As the specific examples of vinyl esters, the following compounds can be exemplified.

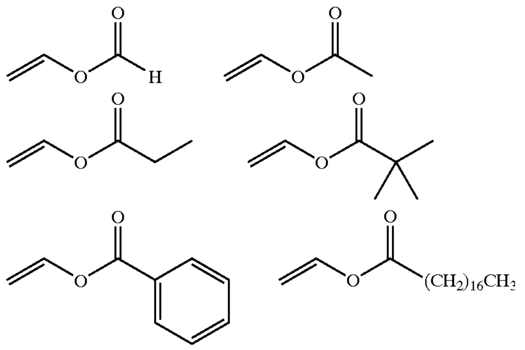

-continued

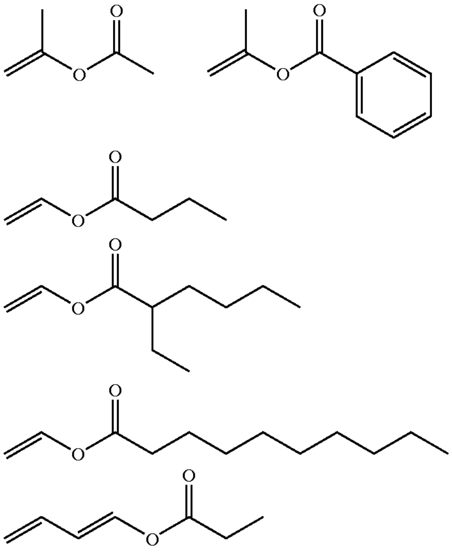

As the specified examples of α,β-unsaturated ketones, the following compounds can be exemplified.

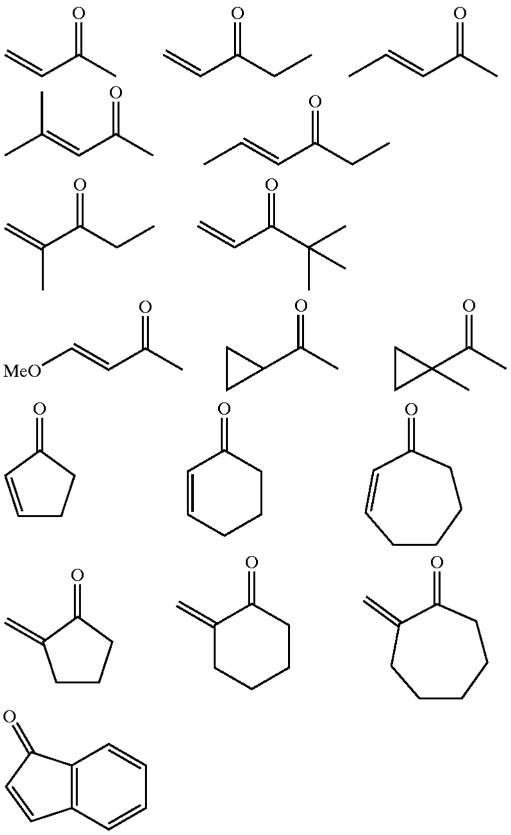

The proportion of the precursor monomer which is used for synthesizing the polarity conversion high molecular compound for use in the present invention is preferably 5 wt % or more, more preferably from 10 to 90 wt %. When the proportion of the precursor monomer is less than 5 wt %, the polarity conversion high molecular compound is not converted into hydrophilic, even if all the sulfonate group and the carboxylate group represented by formula (1) or (2) are converted into a sulfonic acid and a carboxylic acid. As a result, the image-forming layer cannot be removed by an aqueous liquid and a printing plate cannot be formed. Further, when other monomers are used besides the precursor monomers in the synthesis of the polarity conversion high molecular compound for use in the present invention, the proportion of copolymerizable other monomers is not particularly restricted as long as the precursor monomers are used in a preferred amount. These copolymerizable other monomers may be used alone or two or more of the monomers may be used as mixture.

The polarity conversion high molecular compound for use in the present invention can be obtained by heating a homopolymer of the precursor monomer, a copolymer of two or more precursor monomers, or a copolymer of the precursor monomer and other copolymer in the presence of an acid catalyst or a base catalyst, in an appropriate solvent if necessary, and then introducing the product to an iodonium salt, a sulfonium salt or a diazonium salt.

The specific examples of the polarity conversion high molecular compounds for use in the present invention are shown below, but the present invention is not limited thereto.

(1)

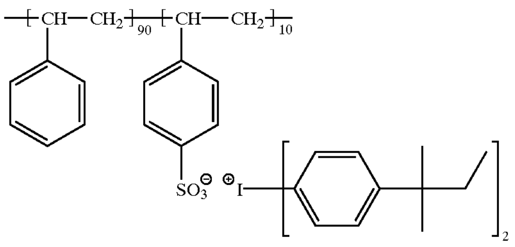

(2)

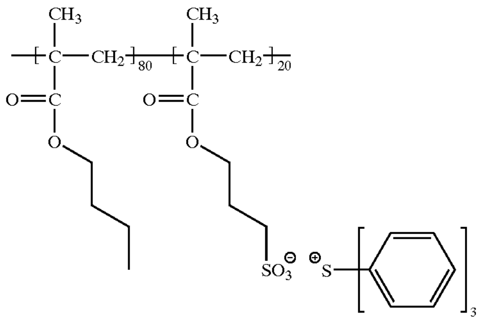

(3)

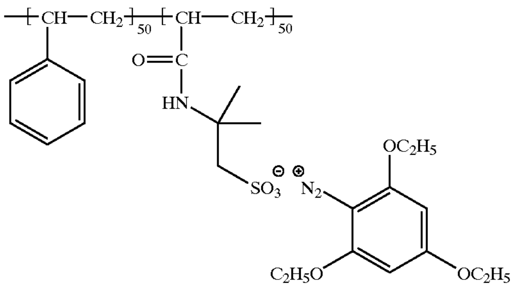

-continued (4)

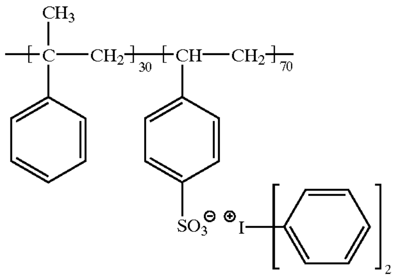

(5)

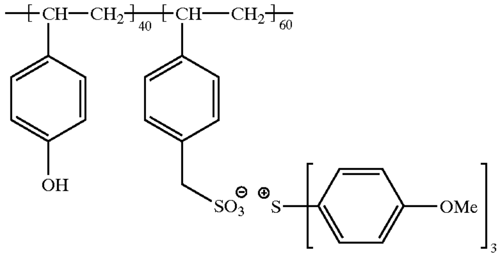

(6)

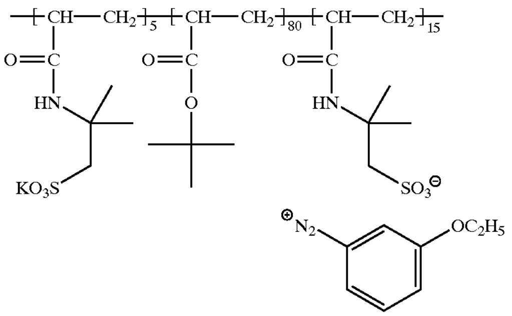

(7)

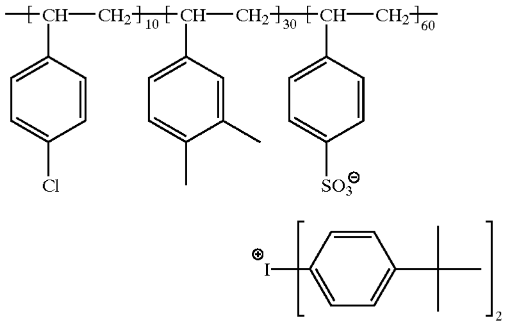

-continued
(8)
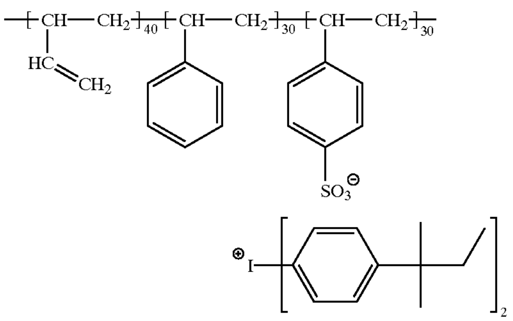
(9)
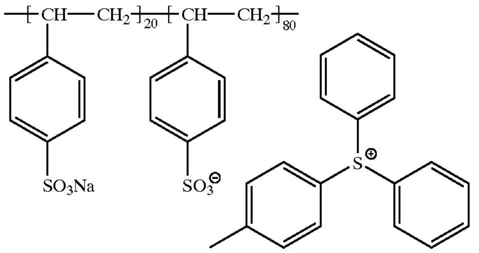
(10)
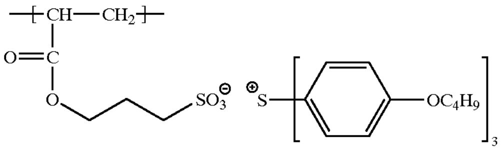
(11)
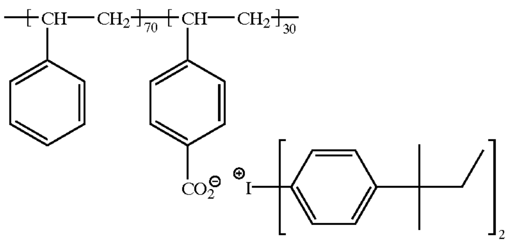
(12)
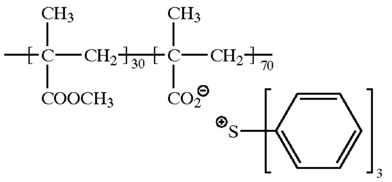
(13)
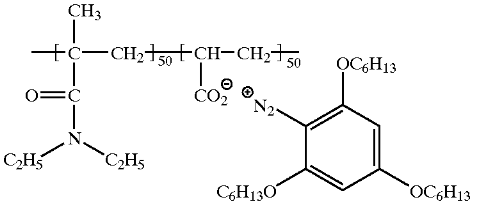
-continued
(14)
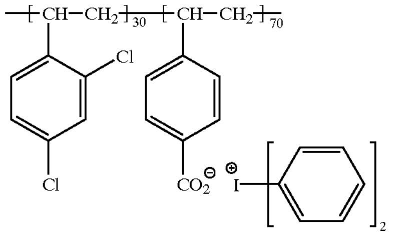
(15)
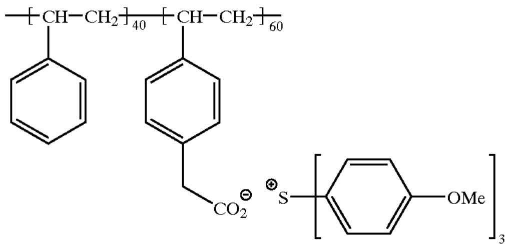
(16)
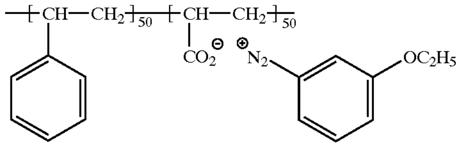
(17)
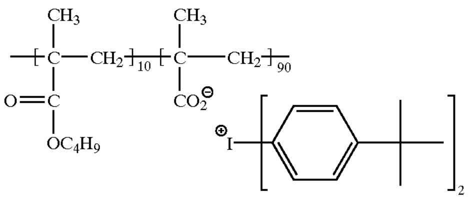
(18)
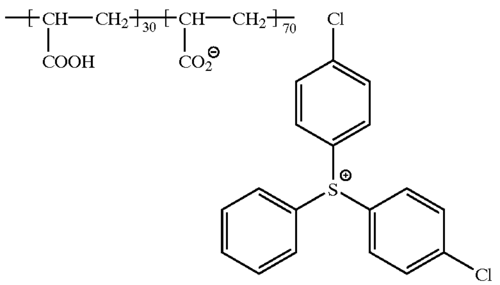
(19)
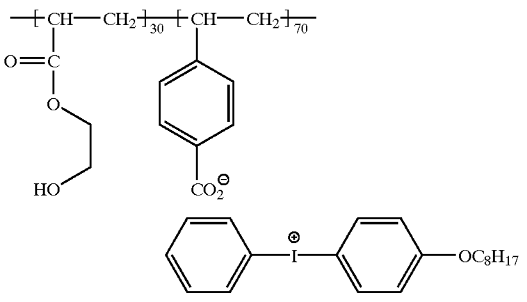

-continued (20)

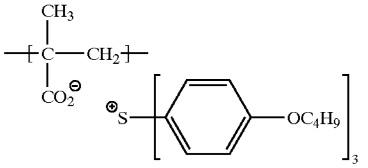

The polarity conversion high molecular compounds for use in the lithographic printing plate precursor of the present invention preferably have a weight average molecular weight measured by GPC (gel permeation chromatography) of preferably 2,000 or more, more preferably from 5,000 to 300,000, and a number average molecular weight of preferably 800 or more, more preferably from 1,000 to 250,000. The degree of polydispersion (a weight average molecular weight/a number average molecular weight) of the high molecular compounds is preferably 1 or more, more preferably from 1.1 to 10.

These polarity conversion high molecular compounds may be any of a random polymer, a block polymer and a graft polymer but a random polymer is preferred.

As the solvents which are used for synthesizing the polarity conversion high molecular compound of the present invention, tetrahydrofuran, ethylenedichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, and water can be exemplified. These solvents may be used alone or two or more of them may be used as mixture.

Well-known compounds such as azo-series initiators and peroxide initiators can be used as the radical polymerization initiator for the synthesis of the polarity conversion high molecular compound for use in the present invention.

When the polarity conversion high molecular compound as described above is contained in an image-forming layer, the polarity conversion high molecular compound may be used alone or two or more of the compounds may be used as mixture.

The proportion of the polarity conversion high molecular compound contained in an image-forming layer is preferably 40 wt % or more, more preferably 50 wt % or more. When the content is less than 40 wt %, the image strength becomes poor and the press life is deteriorated.

The synthesis examples of the polarity conversion high molecular compounds for use in the present invention are shown below, but the present invention is not limited thereto.

(a) Synthesis of Triphenylsulfonium Iodide (the Following Structure (1))

Diphenyl sulfoxide (50.9 g) was dissolved in 800 ml of benzene, 200 g of aluminum chloride was added to the solution, and the solution was stirred for 24 hours under reflux. The obtained reaction solution was poured into 2 liters of ice-cooled water little by little, and then 400 ml of a concentrated hydrochloric acid was added thereto. The temperature of the reaction solution was raised to 70° C. and heating was performed for 10 minutes. The aqueous solution was allowed to be cooled, washed with 500 ml of ethyl acetate and filtered. To the filtrate was gently added an aqueous solution containing 400 ml of water having dissolved therein 200 g of ammonium iodide, thereby a solid was precipitated. The solid precipitated was filtered, washed with water and ethyl acetate in this order, and dried under reduced pressure, thereby 70 g of triphenylsulfonium iodide was obtained.

(b) Synthesis of Di(4-t-amylphenyl)iodonium Iodide (the Following Structure (2))

t-Amylbenzene (60 g), 39.5 g of potassium iodate, 81 g of acetic anhydride and 170 ml of dichloromethane were mixed, and 66.8 g of concentrated sulfuric acid was gently added to the mixture with ice-cooling. The mixture was stirred with ice-cooling for 2 hours, and then at room temperature for 10 hours.

The thus-obtained reaction solution was cooled with ice, and 500 ml of water was added to the solution. After the solution was stirred thoroughly, a water phase and a dichloromethane phase were separated. Dichloromethane (200 ml) was added to the obtained water phase, and the reaction system was stirred thoroughly, and a water phase and a dichloromethane phase were separated again. The obtained dichloromethane solutions were together washed with an aqueous solution of sodium bicarbonate, water and an aqueous solution of sodium chloride in order. The thus-obtained dichloromethane solution was thoroughly dehydrated with anhydrous magnesium sulfate, filtered and concentrated, to thereby obtain di(4-t-amylphenyl)iodonium sulfate. The sulfate was added to an aqueous solution containing an excess amount of potassium iodide. The thus-obtained aqueous solution was extracted with dichloromethane, the dichloromethane solution was washed with water, and the obtained product was concentrated, thereby 75 g of di(4-t-amylphenyl)iodonium iodide (2) was obtained.

(c) Synthesis of Polarity Conversion High Molecular Compound (the Following Structure (3))

A three-necked flask having a capacity of 500 ml was charged with 240 g of methyl ethyl ketone and the content was stirred at 65° C. in a nitrogen gas stream. A mixture of 93.74 g of styrene, 26.64 g of 4-vinylbenzenesulfonic acid cyclohexyl ester and 1.99 g of 2,2'-azobis(2,4-dimethylvaleronitrile) was dropwise added thereto over 2 hours. After completion of the dropwise addition, 0.5 g of 2,2'-azobis(2,4-dimethylvaleronitrile) was further added, followed by stirring for further 2 hours, thereby a styrene-4-vinylbenzenesulfonic acid cyclohexyl ester copolymer was obtained. After the reaction mixture was poured into an egg-plant type flask having a capacity of 1 liter and concentrated, 300 g of MFG was added thereto, the reaction mixture was heated for 3 hours with refluxing MFG, thereby sulfonic acid cyclohexyl ester was decomposed to obtain a sulfonic acid. The obtained reaction mixture was cooled to room temperature and poured into a beaker containing 3 liters of water, thus an aqueous solution of a high molecular compound was prepared.

Triphenylsulfonium iodide (1) (39.03 g) was dissolved in 1,000 ml of methanol, 24.44 g of silver oxide was added to the solution and the solution was stirred at room temperature for 4 hours. The reaction solution was filtered and gently poured into the above aqueous solution of a high molecular compound which had been vigorously stirred, thus a solid was precipitated. The solid precipitated was filtered, washed with distilled water, and dried under reduced pressure, thereby 140 g of polarity conversion high molecular compound (3) was obtained.

(d) Synthesis of Polarity Conversion High Molecular Compound (the Following Structure (4))

A three-necked flask having a capacity of 500 ml was charged with 240 g of methyl ethyl ketone and the content was stirred at 65° C. in a nitrogen gas stream. A mixture of 93.74 g of styrene, 26.64 g of 4-vinylbenzenesulfonic acid cyclohexyl ester and 1.99 g of 2,2'-azobis(2,4-dimethylvaleronitrile) was dropwise added thereto over 2 hours. After completion of the dropwise addition, 0.5 g of 2,2'-azobis(2,4-dimethylvaleronitrile) was further added, followed by stirring for further 2 hours, thereby a styrene-4-vinylbenzenesulfonic acid cyclohexyl ester copolymer was obtained. After the reaction mixture was poured into an egg-plant type flask having a capacity of liter and concentrated, 300 g of MFG was added thereto, the reaction mixture was heated for 3 hours with refluxing MFG, thereby sulfonic acid cyclohexyl ester was decomposed to obtain a sulfonic acid. The obtained reaction mixture was cooled to room temperature and poured into a beaker containing 3 liters of water, thus an aqueous solution of a high molecular compound was prepared.

Di(4-t-amylphenyl)iodonium iodide (2) (54.83 g) was dissolved in 2,000 ml of methanol, 24.82 g of silver oxide was added to the solution and the solution was stirred at room temperature for 4 hours. The reaction solution was filtered and gently poured into the above aqueous solution of a high molecular compound which had been vigorously stirred, thus a solid was precipitated. The solid precipitated was filtered, washed with distilled water and dried under reduced pressure, thereby 145 g of polarity conversion high molecular compound (4) was obtained.

(e) Synthesis of Polarity Conversion High Molecular Compound (the Following Structure (5))

A three-necked flask having a capacity of 500 ml was charged with 240 g of methyl ethyl ketone and the content was stirred at 65° C. in a nitrogen gas stream. A mixture of 93.74 g of styrene, 26.64 g of 4-vinylbenzenesulfonic acid cyclohexyl ester and 1.99 g of 2,2'-azobis(2,4-dimethylvaleronitrile) was dropwise added thereto over 2 hours. After completion of the dropwise addition, 0.5 g of 2,2'-azobis(2,4-dimethylvaleronitrile) was further added, followed by stirring for further 2 hours, thereby a styrene-4-vinylbenzenesulfonic acid cyclohexyl ester copolymer was obtained. After the reaction mixture was poured into an egg-plant type flask having a capacity of 1 liter and concentrated, 300 g of MFG was added thereto, the reaction mixture was heated for 3 hours with refluxing MFG, thereby sulfonic acid cyclohexyl ester was decomposed to obtain a sulfonic acid. The obtained reaction mixture was cooled to room temperature and poured into a beaker containing 3 liters of water, thus an aqueous solution of a high molecular compound was prepared.

2-Nitrobenzene-1,3,5-triol (12 g) obtained by nitrating 1,3,5-benzenetriol according to an ordinary method was subjected to reaction at 80° C. for 5 hours with 33 g of ethyl iodide, 29 g of potassium carbonate in 30 ml of N,N-dimethylacetamide. The reaction solution was poured into 300 ml of water, a solid precipitated was filtered and washed with water, thereby 13.4 g of 2-nitro-1,3,5-triethoxybenzene was obtained.

2-Nitro-1,3,5-triethoxybenzene (12.8 g) was dissolved in 80 ml of isopropyl alcohol, and 28 g of iron powder, 2.85 g of ammonium chloride and 8.4 ml of water were added thereto, and after the mixture was allowed to react at 90° C. for 2 hours, the reaction solution was extracted with ethyl acetate. The ethyl acetate solution was dried over anhydrous magnesium sulfate, the solvent was distilled off, 6 ml of a concentrated hydrochloric acid was added to the residue, and the reaction system was washed with a small amount of acetone, thereby 4.7 g of 2,4,6-ethoxyaniline.hydrochloride was obtained.

2,4,6-Ethoxyaniline.hydrochloride (24.37 g) was dissolved in 400 ml of methanol and cooled with ice. The solution was acidified with 20 ml of a concentrated hydrochloric acid. A solution comprising 90 ml of water having dissolved therein 13.12 g of sodium nitrite was gently added to the above solution, followed by stirring for 2 hours. After 2 hours, the reaction solution was gently poured into the above-prepared aqueous solution of a high molecular compound, thereby a solid was precipitated. The solid precipitated was filtered, washed with distilled water and dried under reduced pressure, thereby 118 g of polarity conversion high molecular compound (5) was obtained.

Other polarity conversion high molecular compounds can also be synthesized in similar methods.

(1)

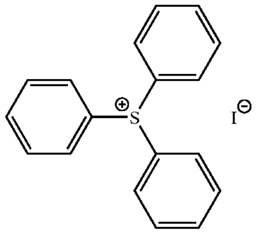

(2)

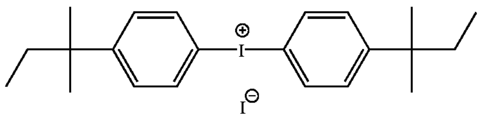

(3)

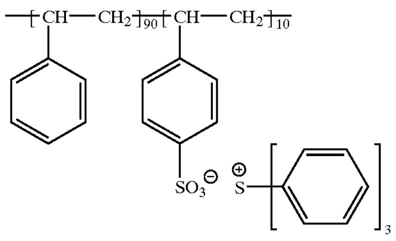

(4)

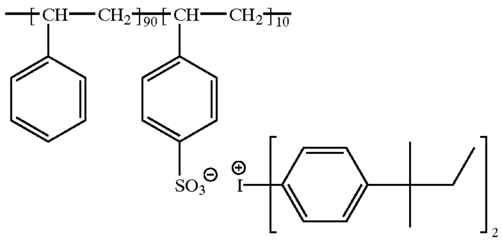

(5)

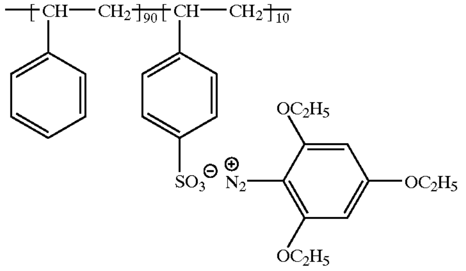

Further, an iodonium iodide can be obtained according to the methods described in *Bull. Chem. Soc. Jpn.*, 70, pp. 219 to 224 (1997), *Bull. Chem. Soc. Jpn.*, 70, pp. 1665 to 1669 (1997), *Bull. Chem. Soc. Jpn.*, 70, pp. 115 to 120 (1999), *J. Amer. Chem. Soc.*, 82, pp. 725–731 (1960), and *J. Amer. Chem. Soc.*, 81, pp. 342 to 346 (1959).

A sulfonium iodide can also be obtained according to the method described in *J. Amer. Chem. Soc.*, 91, pp. 145 to 150 (1969).

[Infrared Ray Absorber According to the Present Invention]

The infrared ray absorbers for use in the present invention are dyes or pigments, which have at least either a functional group represented by formula (1) or a functional group represented by formula (2), and are converted into hydrophilic by irradiation with actinic rays and/or heating. The conversion from hydrophobic to hydrophilic is required to be the conversion of the degree that an infrared ray absorber which does not show the affinity such as dissolution in water before irradiation with actinic rays and/or heating comes to show the affinity such as dissolution in water due to the decomposition of at least either a functional group represented by formula (1) or a functional group represented by formula (2) by irradiation with actinic rays and/or heating.

The iodonium ion, sulfonium ion and diazonium ion represented by $X^+$ in a functional group represented by formula (1) and a functional group represented by formula (2) are well known in the industry as acid-generating agents and they form the acids of corresponding counter anions by irradiation with actinic rays and/or heating. The thus-generated acids have been used in a crosslinking reaction or as catalysts to cause the decomposition of acid-decomposable functional groups in conventional lithographic printing plates.

Contrary to this, according to the lithographicprinting plate precursor of the present invention, a sulfonate group and a carboxylate group such as the above functional groups are converted to a sulfonic acid and a carboxylic acid respectively by irradiation with actinic rays and/or heating, and the originally hydrophobic infrared ray absorber changes to hydrophilic. Due to this mechanism, when the exposed lithographic printing plate precursor is development processed with water, an aqueous liquid or a fountain solution on a printing machine, the infrared ray absorber contained in the image-forming layer of the heated area is easily removed, and a printing plate having no residual color and excellent in staining resistance can be obtained.

The iodonium ion, sulfonium ion and diazonium ion represented by $X^+$ may be any compounds as long as they can make an infrared ray absorber hydrophobic before conversion and can make the infrared ray absorber hydrophilic after conversion. The iodonium ion, sulfonium ion and diazonium ion represented by the following formulae (3) to (5) are particularly preferred in view of the hydrophobicity of an infrared ray absorber before conversion and storage stability. That is, the iodonium ion, sulfonium ion and diazonium ion represented by the above formulae (5) to (7) are particularly preferred.

(3)

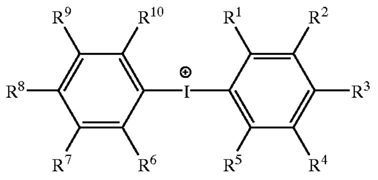

-continued (4)

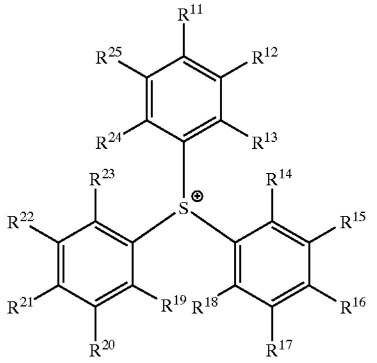

(5)

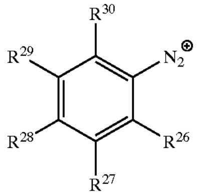

wherein $R^1$ to $R^{30}$ each represents a hydrogen atom, a halogen atom, a cyano group, a nitro group, an alkyl group, an aryl group, an alkynyl group, an alkenyl group, or a functional group represented by any of the following formulae; $R^{31}$, $R^{32}$ and $R^{33}$ each represents a hydrogen atom, an alkyl group, an aryl group, an alkynyl group or an alkenyl group; and arbitrary two of $R^1$ to $R^{10}$ may form a ring, arbitrary two of $R^{11}$ to $R^{25}$ may form a ring, and arbitrary two of $R^{26}$ to $R^{30}$ may form a ring.

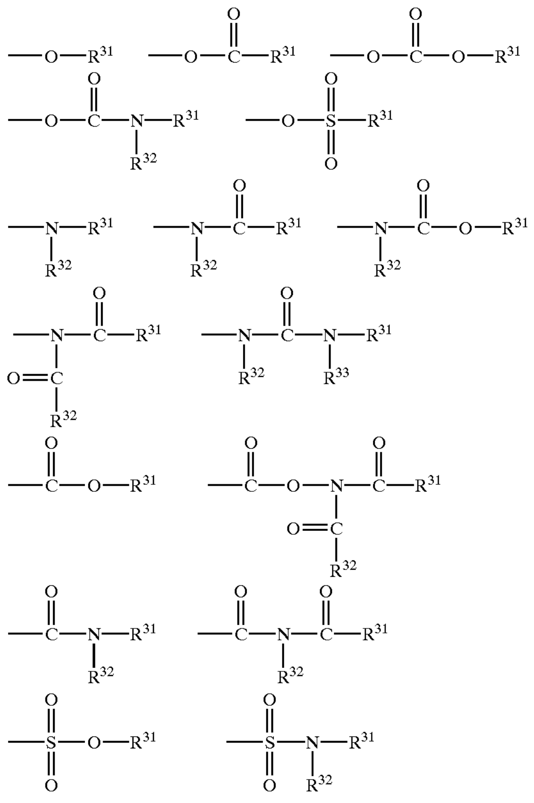

wherein $R^{31}$ and $R^{32}$ each represents a hydrogen atom, an alkyl group, an aryl group, an alkynyl group or an alkenyl group.

When $R^1$ to $R^{30}$ each represents an alkyl group, the alkyl group is a straight chain, branched or cyclic alkyl group having from 1 to 20 carbon atoms (e.g., methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl). Of these groups, a straight chain alkyl group having from 1 to 12 carbon atoms, a branched alkyl group having from 3 to 12 carbon atoms, and a cyclic alkyl group having from 5 to 10 carbon atoms are more preferred.

When $R^1$ to $R^{30}$ each represents a substituted alkyl group, monovalent nonmetallic atomic groups exclusive of a hydrogen atom are used as the substituents. The preferred examples of the substituents of the substituted alkyl group include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N,N'-diaryl-N-arylureido group, an N-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N, N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a phosphonato group), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$ (alkyl)) and a conjugate base group thereof (hereinafter referred to as an alkylphosphonato group), a monoarylphosphono group (—$PO_3H$ (aryl)) and a conjugate base group thereof (hereinafter referred to as an arylphosphonato group), a phosphonooxy group (—$OPO_3H_2$) and a conjugate base group thereof (hereinafter referred to as a phosphonatooxy group), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and a conjugate base group thereof (hereinafter referred to as an alkylphosphonatooxy group), a monoarylphosphonooxy group (—$OPO_3H$(aryl)) and a conjugate base group thereof (hereinafter referred to as an arylphosphonatooxy group), a cyano group, a nitro group, an aryl group, an alkenyl group, and an alkynyl group.

As the specific examples of the alkyl groups in these substituents of the substituted alkyl groups, the above-described alkyl groups can be exemplified, and as the specific examples of the aryl groups in these substituents, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl and a phosphonatophenyl can be exemplified.

As the examples of the alkenyl groups in these substituents, a vinyl group, a 1-propenyl group, a 1-butenyl group, a cinnamyl group and a 2-chloro-1-ethenyl group can be exemplified. As the examples of the alkynyl groups, an ethynyl group, a 1-propynyl group, a 1-butynyl group and a trimethylsilylethynyl group can be exemplified. As $R^{41}$ in the acyl group ($R^{41}$CO—), a hydrogen atom and the above-described alkyl groups and aryl groups can be exemplified.

Of these substituents, more preferred groups include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, and an alkenyl group.

On the other hand, as the alkylene group in the substituted alkyl groups, divalent organic residues obtained by removing any one hydrogen atom on the above-described alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms. The specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R^1$ to $R^{30}$ each represents an aryl group, the examples of the aryl groups include a condensed ring formed by 1 to 3 benzene rings and a condensed ring formed by a benzene ring and a 5-membered unsaturated ring, and the specific examples of such aryl groups include a phenyl group, a naphthyl group, an anthryl group, a phenanthryl group, an indenyl group, an acenaphthenyl group and a fluorenyl group. Of these groups, a phenyl group and a naphthyl group are more preferred. Heterocyclic aryl groups are included in the aryl group besides the above carbocyclic aryl groups. As the heterocyclic aryl groups, those containing from 3 to 20 carbon atoms and from 1 to 5 hetero atoms, e.g., a pyridyl group, a furyl group, and a quinolyl group, a benzofuryl group, a thioxanthone group and a carbazole group condensed with a benzene ring are used.

When $R^1$ to $R^{30}$ each represents a substituted aryl group, the substituted aryl groups are those having, as the substituents, monovalent nonmetallic atomic groups exclusive of a hydrogen atom on the ring-forming carbon atoms of the above-described aryl groups. As the preferred examples of the substituents, the above-described alkyl groups and substituted alkyl groups, and the groups described above as the examples of the substituents for the substituted alkyl groups can be exemplified.

The preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

When $R^1$ to $R^{30}$ each represents an alkenyl group, a substituted alkenyl group [$—C(R^{42})═C(R^{43})(R^{44})$], an alkynyl group, or a substituted alkynyl group [$—C≡C(R^{45})$], monovalent nonmetallic atomic groups can be used as $R^{42}$, $R^{43}$, $R^{44}$ and $R^{45}$.

The preferred examples of $R^{42}$, $R^{43}$, $R^{44}$ and $R^{45}$ include a hydrogen atom, a halogen atom, an alkyl group, a substituted alkyl group, an aryl group and a substituted aryl group, and the above exemplified groups can be used as the specific examples of these groups. $R^{42}$, $R^{43}$, $R^{44}$ and $R^{45}$ each more preferably represents a hydrogen atom, a halogen atom, or a straight chain, branched or cyclic alkyl group having from 1 to 10 carbon atoms.

The specific examples of the alkenyl groups, substituted alkenyl groups, alkynyl groups, and substituted alkynyl groups include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethyl group.

Of these groups, the preferred functional groups represented by $R^1$ to $R^{30}$ from the viewpoint of storage stability and the hydrophobicity of a polarity conversion high molecular compound before conversion are a hydrogen atom, a halogen atom, an alkyl group, an aryl group, an alkynyl group, an alkenyl group, a cyano group, and functional groups represented by the following formulae.

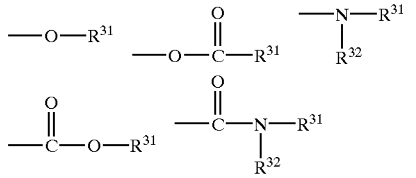

wherein $R^{31}$ and $R^{32}$ each represents a hydrogen atom, an alkyl group, an aryl group, an alkynyl group or an alkenyl group.

The specific examples of iodonium ions, sulfonium ions and diazonium ions are shown below, but the present invention is not limited thereto.
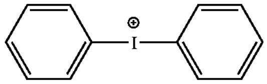
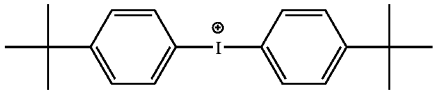
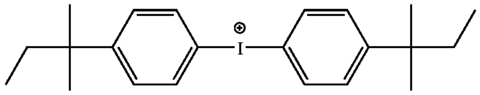
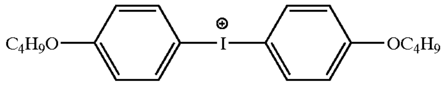
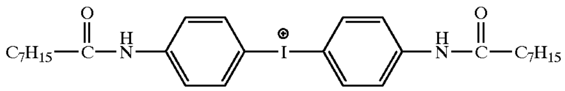
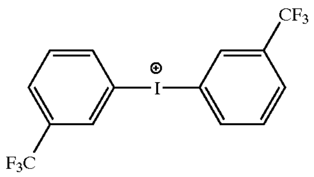
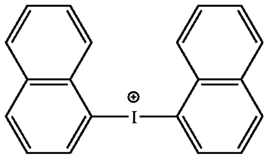
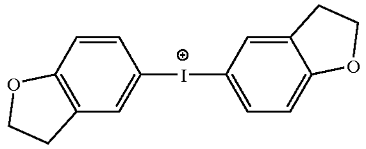
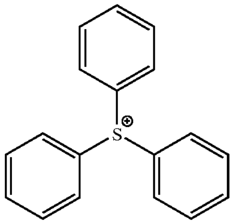
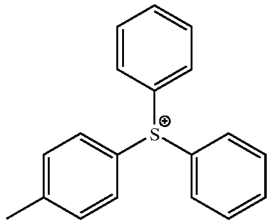
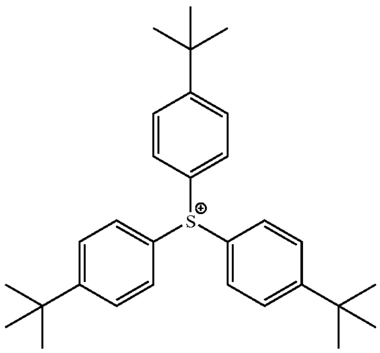
-continued
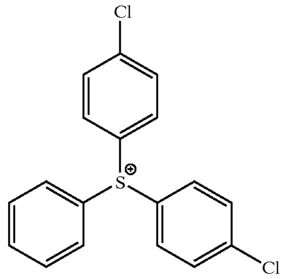
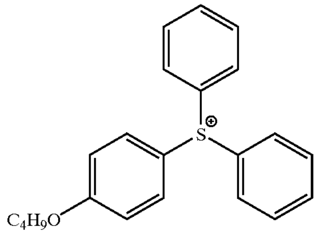
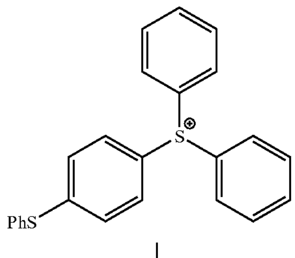
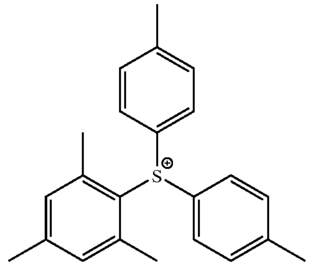
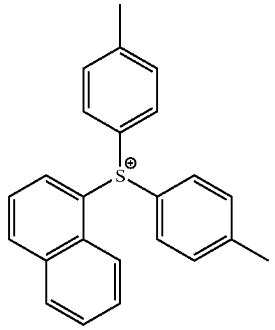
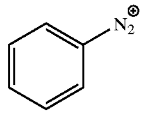
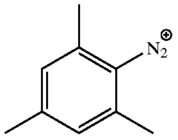
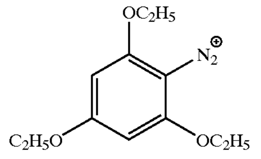
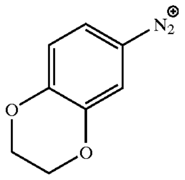

-continued

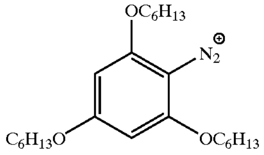

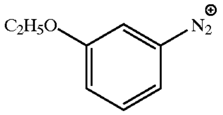

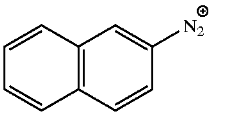

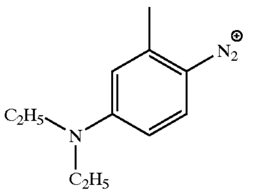

Any dyes and pigments having a mother nucleus which absorbs light of wavelength of 700 to 1,200 nm are preferably used in the present invention as infrared ray absorbers. The preferred examples of such mother nuclei are a polymethine dye, a cyanine dye, a squarylium dye, a pyrylium dye, a diimmonium dye, a phthalocyanine compound, a triarylmethane dye, and metal dithiolene. The more preferred mother nuclei of these are a polymethine dye, a cyanine dye, a squarylium dye, a pyrylium dye, a diimmonium dye, and a phthalocyanine compound, and a polymethine dye, a cyanine dye and a phthalocyanine compound are most preferred from the viewpoint of aptitude for synthesis.

The specific examples of the mother nuclei of dyes and pigments having absorption at wavelength of 700 to 1,200 nm which can be used in the present invention are shown below, but the present invention is not limited thereto.

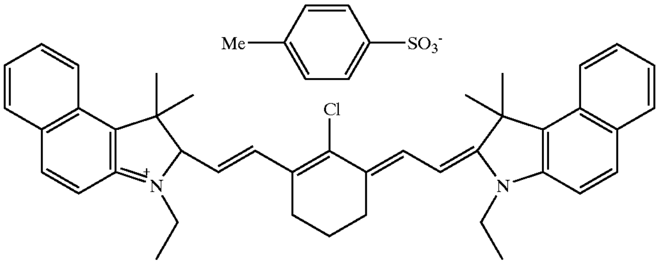

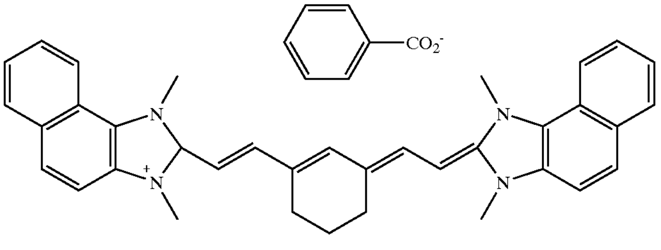

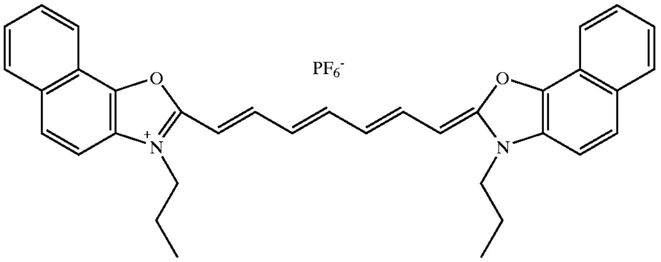

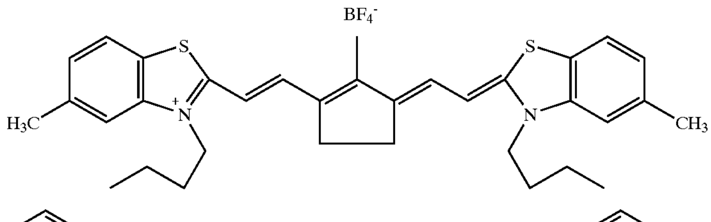

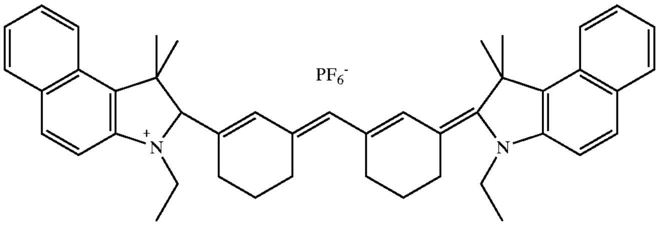

-continued
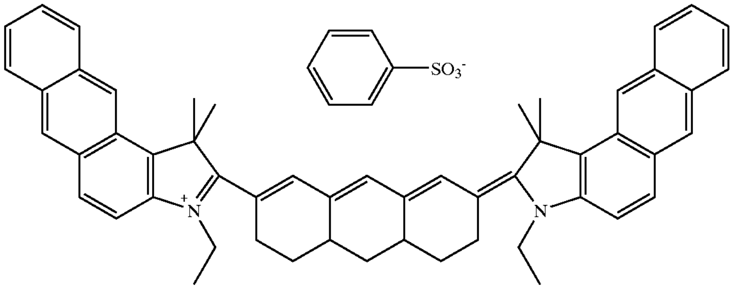
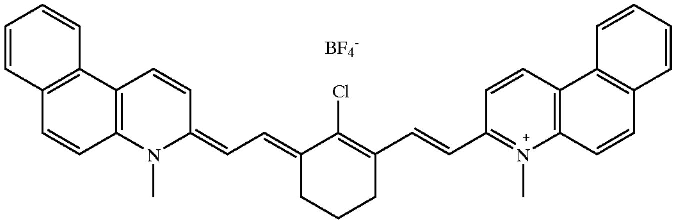
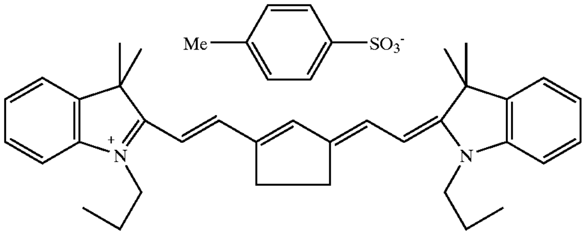
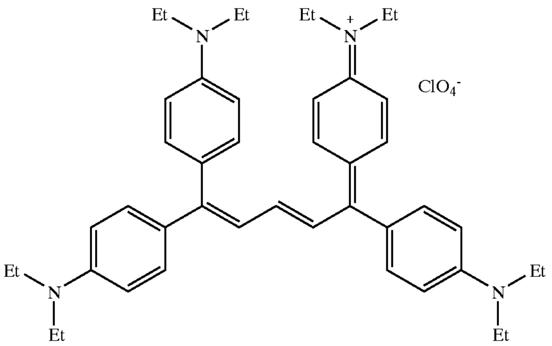
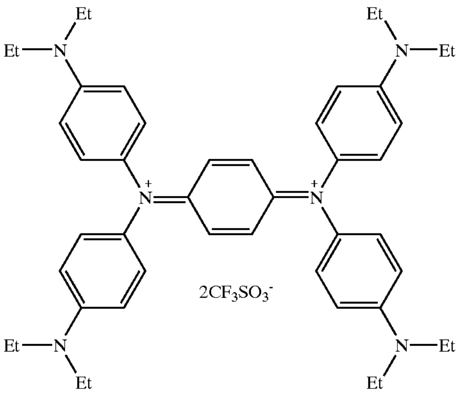

-continued
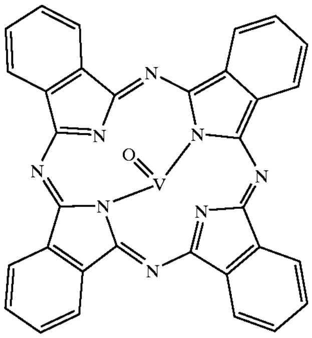
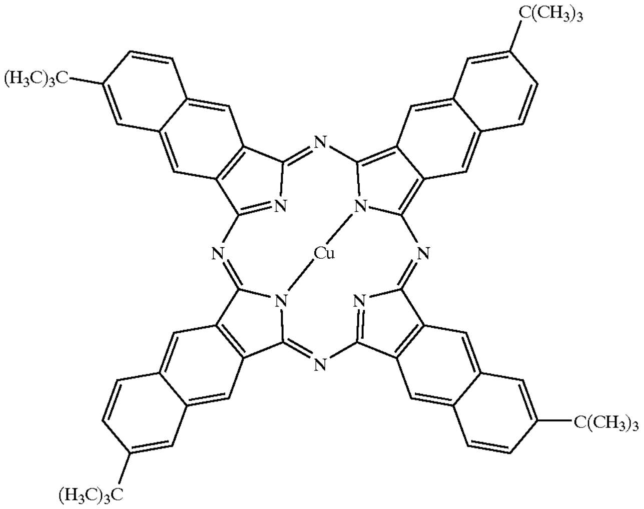
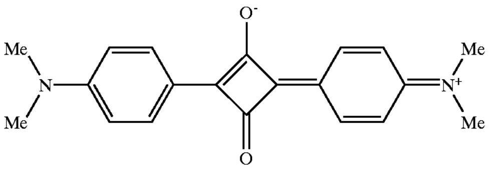
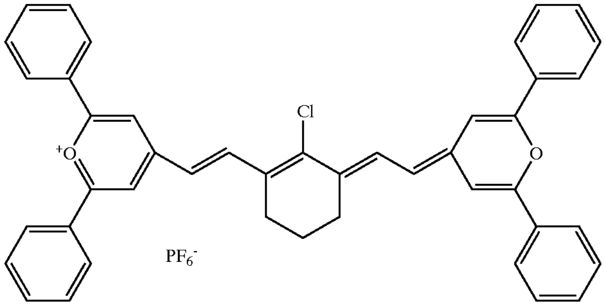
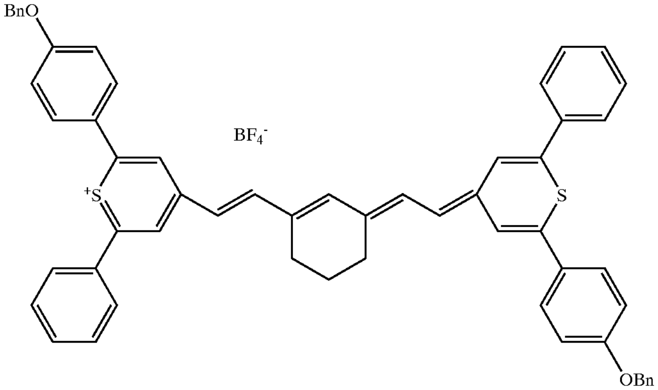

-continued

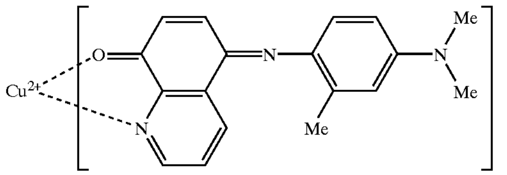

$2ClO_4^-$

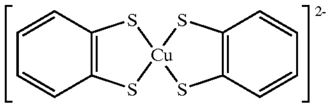

$2Na^+$

The infrared ray absorbers for use in the present invention are dyes and pigments having absorption at 700 to 1,200 nm as described above, and the dyes and pigments having at least either a functional group represented by formula (1) or a functional group represented by formula (2) can be preferably used. The specific examples of the infrared ray absorbers which can be used in the present invention are shown below, but the present invention is not limited thereto.

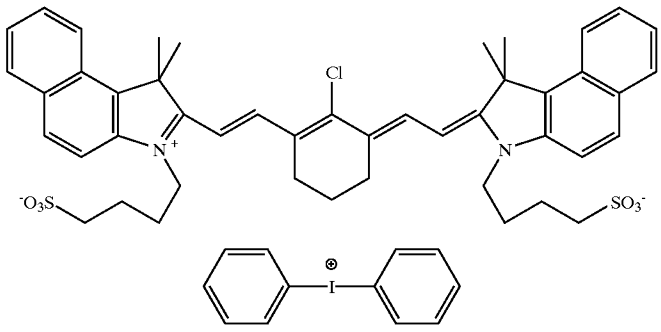

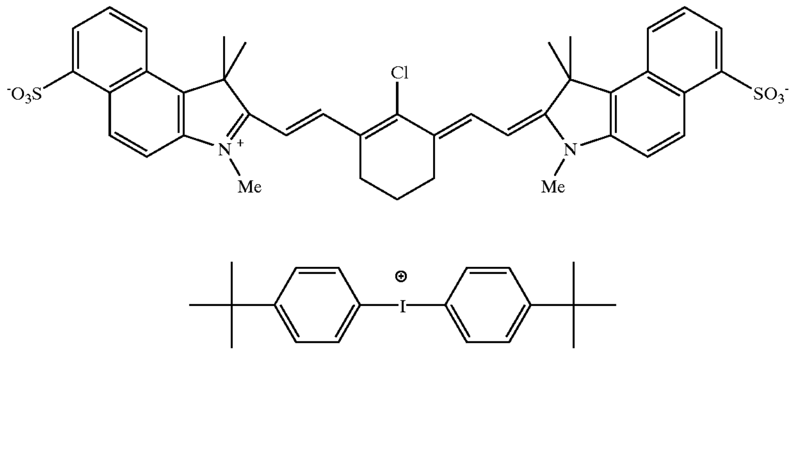

-continued
3 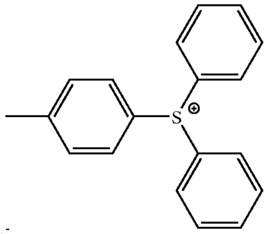
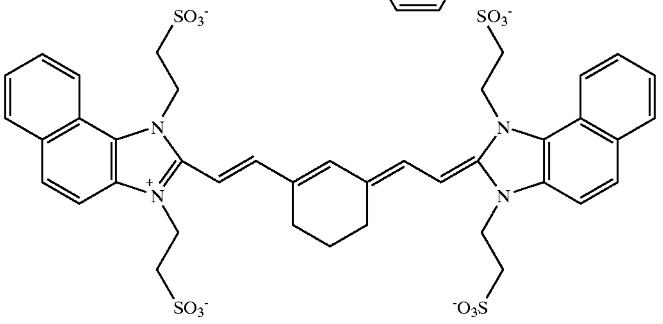
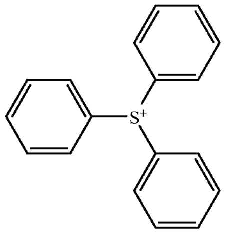
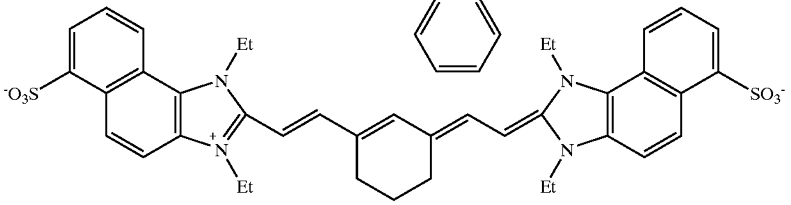
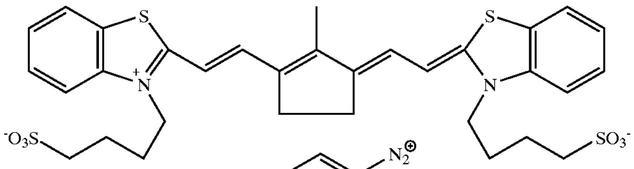
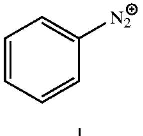
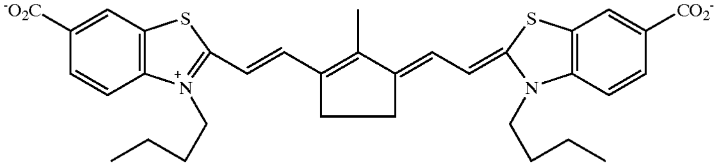
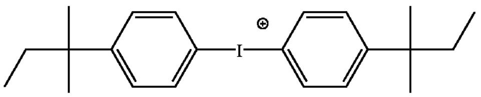
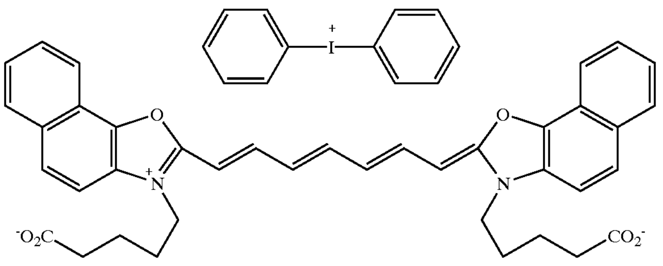

-continued
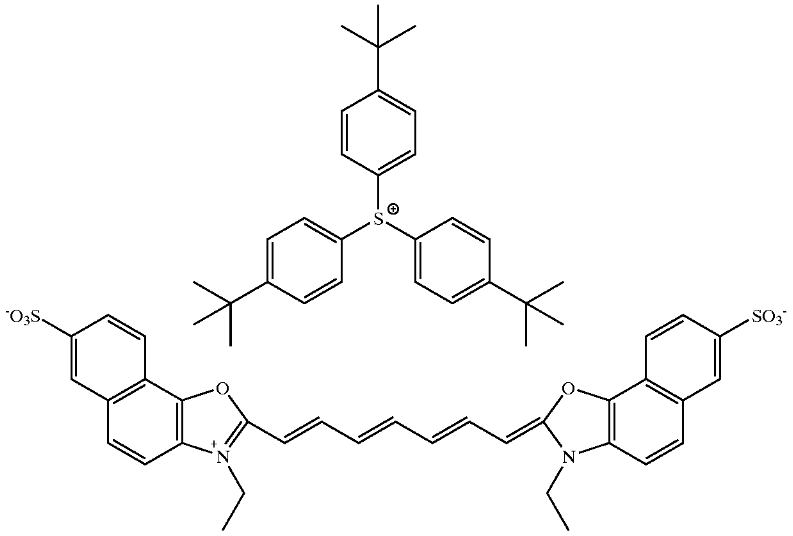
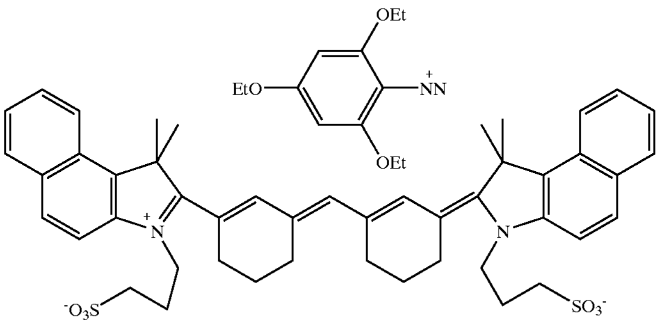
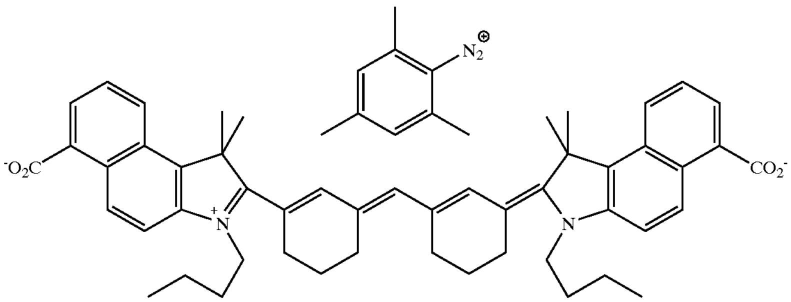
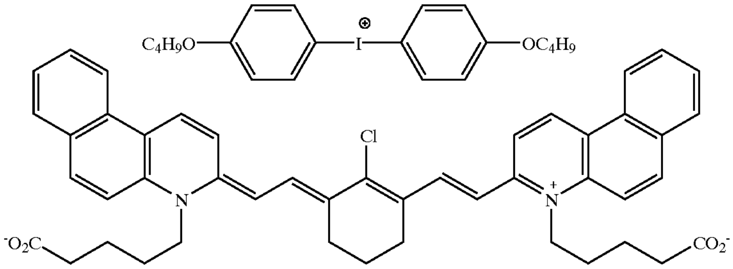

-continued
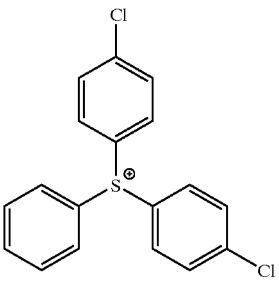
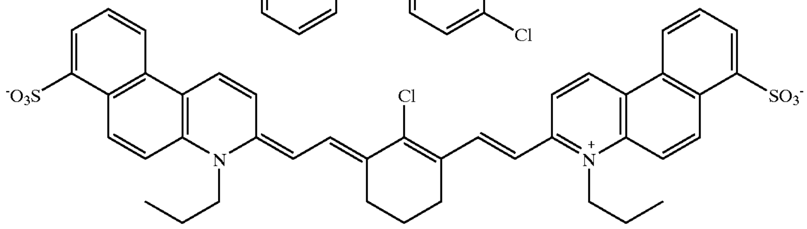
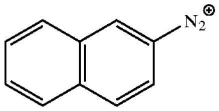
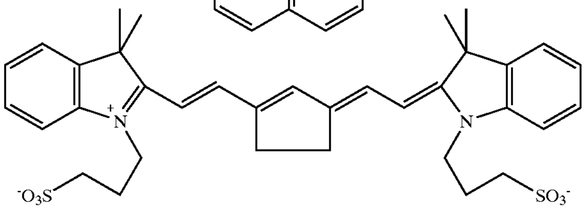
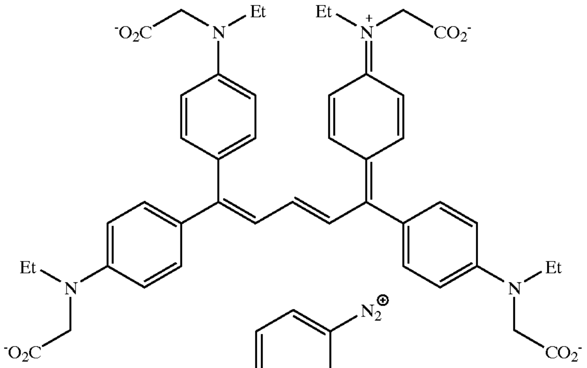
3 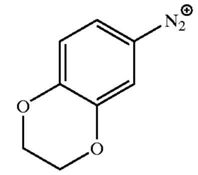
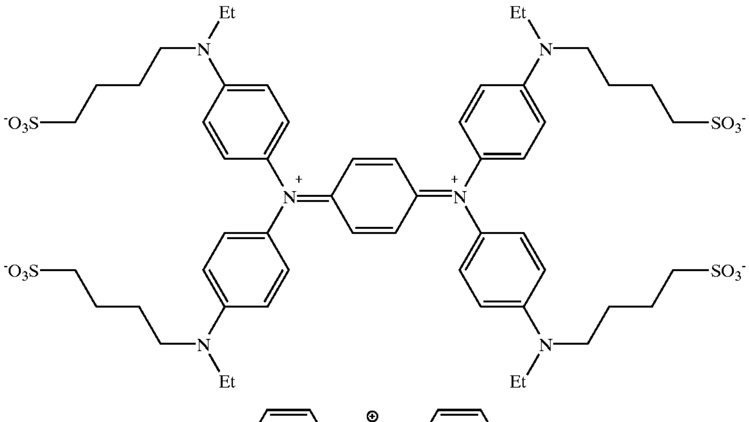
2 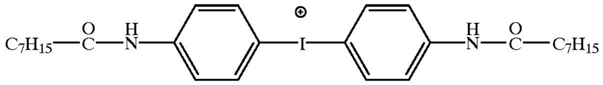

-continued
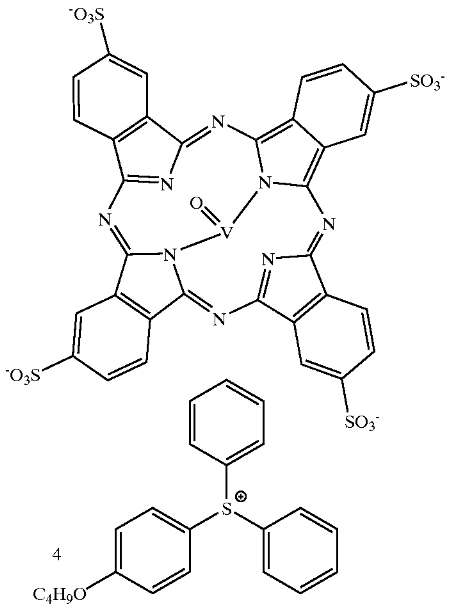
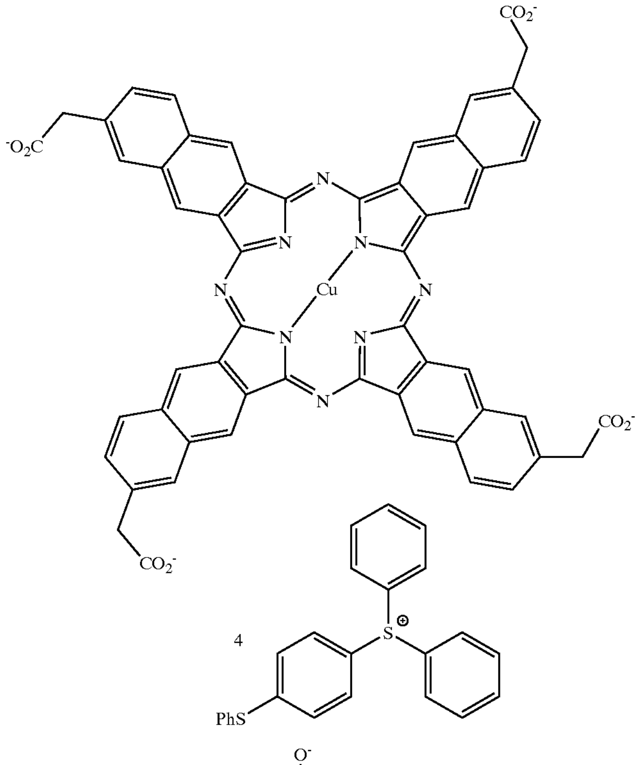
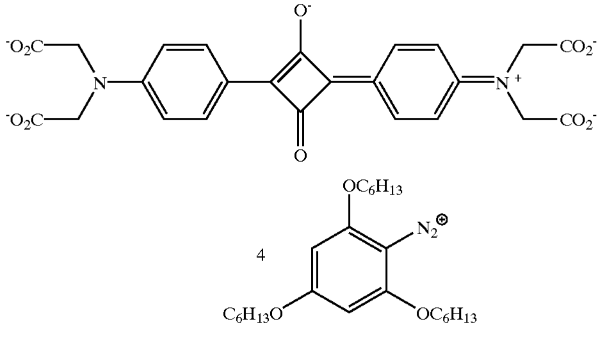

-continued

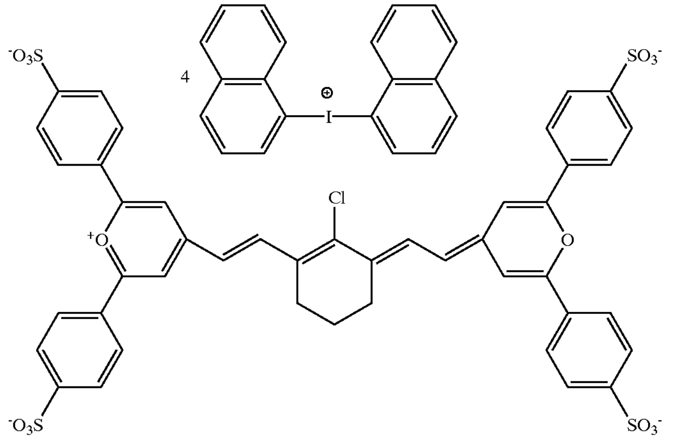

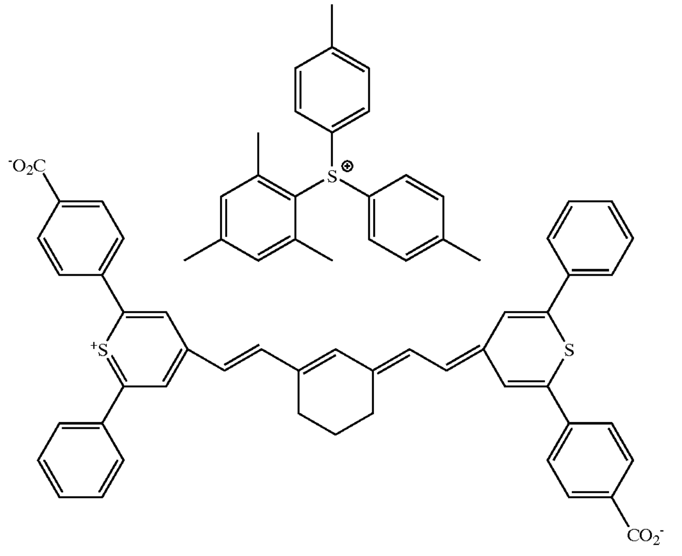

The synthesis methods of the infrared ray absorbers for use in the present invention are specifically shown below, but the present invention is not limited thereto.

(a) Synthesis of Di(4-t-amylphenyl)iodonium Iodide (1)

t-Amylbenzene (60 g), 39.5 g of potassium iodate, 81 g of acetic anhydride and 170 ml of dichloromethane were mixed, and 66.8 g of concentrated sulfuric acid was gently added to the mixture with ice-cooling. The mixture was stirred with ice-cooling for 2 hours, and then at room temperature for 10 hours.

The thus-obtained reaction solution was cooled with ice, and 500 ml of water was added to the solution. After the solution was stirred thoroughly, a water phase and a dichloromethane phase were separated. Dichloromethane (200 ml) was added to the obtained water phase, and the reaction system was stirred thoroughly, and a water phase and a dichloromethane phase were separated again. The obtained dichloromethane solutions were together washed with an aqueous solution of sodium bicarbonate, water and an aqueous solution of sodium chloride in order. The thus-obtained dichloromethane solution was thoroughly dehydrated with anhydrous magnesium sulfate, filtered and concentrated, to thereby obtain di(4-t-amylphenyl)iodonium sulfate. The sulfate was added to an aqueous solution containing an excess amount of potassium iodide. The thus-obtained aqueous solution was extracted with dichloromethane, the dichloromethane solution was washed with water, and the obtained product was concentrated, thereby 75 g of di(4-t-amylphenyl)iodonium iodide (1) (having the following structure) was obtained.

(b) Synthesis of Infrared Ray Absorber (2)

A three-necked flask having a capacity of 500 ml was charged with 52.32 g of trimethylbenzindolenine (3) (having the following structure), 40.85 g of 1,4-butanesultone and 50 ml of toluene and the content was stirred for 9 hours with refluxing toluene. After the reaction solution was cooled to room temperature, a solid precipitated was filtered, washed with toluene, and dried under reduced pressure, thereby 64.8 g of compound (4) (having the following structure) was obtained.

A three-necked flask having a capacity of 1 liter was charged with 36.81 g of the above-obtained compound (4), 19.14 g of compound (5) (having the following structure) and 100 ml of methanol, and the content was stirred at room temperature. Acetic anhydride (21.76 g) was added to the above reaction solution, and then 21.56 g of triethylamine was added little by little over 1 hour. After completion of the addition, stirring was continued for further 2 hours, and then methanol was added to make the total volume 300 ml. This methanol solution was dropwise added over 5 hours to 8 liters of ethyl acetate which had been vigorously stirred contained in a plastic container having a capacity of 10 liters. After completion of the dropwise addition, stirring was further continued for 1 hour as it was, and a solid precipitated was filtered out. The obtained solid was dried under reduced pressure, thereby 45.29 g of infrared ray absorber (2) (having the following structure) was obtained.

(c) Synthesis of Infrared Ray Absorber (6)

Infrared ray absorber (2) (92.87 g) was dissolved in 2 liters of distilled water to prepare an aqueous solution of infrared ray absorber.

On the other hand, di(4-t-amylphenyl)iodonium iodide (1) (54.83 g) was dissolved in 2,000 ml of methanol, 24.82 g of silver oxide was added to the solution and the solution was stirred at room temperature for 4 hours. The reaction solution was filtered and gently poured into the above aqueous solution of an infrared ray absorber which had been vigorously stirred, thus a solid was precipitated. The solid precipitated was filtered, washed with distilled water and dried under reduced pressure, thereby 99.8 g of infrared ray absorber (6) (having the following structure) was obtained.

(1)

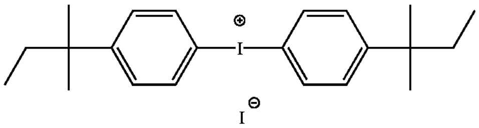

(2)

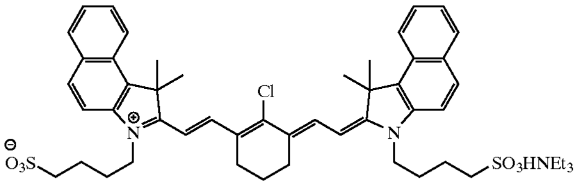

(3)

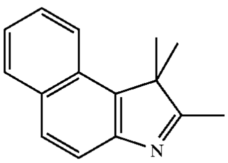

(4)

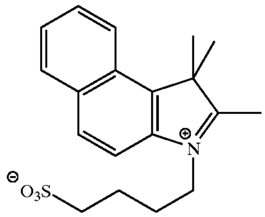

(5)

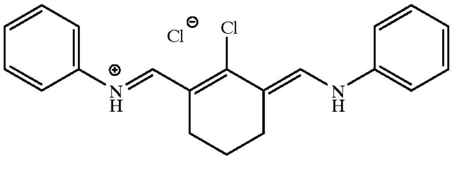

-continued (6)

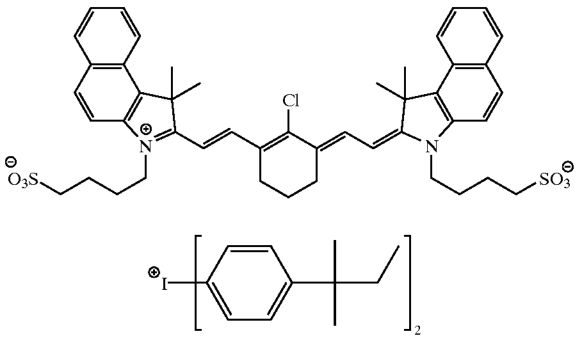

The content of these infrared ray absorbers in the present invention is from 0.05 to 50 wt % or so in the entire solid contents in the image-forming layer, preferably from 0.5 to 25 wt %, and particularly preferably from 1 to 20 wt %. When the content of infrared ray absorbers is less than 0.1 wt %, sensitivity becomes low and a residual film is liable to occur, while when the content exceeds 50 wt %, it becomes impossible to convert the infrared ray absorbers completely hydrophilic, as a result the infrared ray absorbers remain in the image-forming layer to cause residual color and staining.

[Decomposition Accelerating Compound]

A "decomposition accelerating compound" for use in the present invention is a compound having the functional group represented by formula (3) and/or formula (4):

(3)

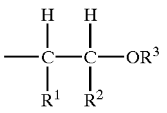

(4)

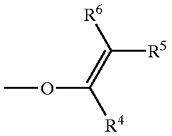

wherein $R^1$ and $R^2$ each represents a hydrogen atom, an alkyl group, an aryl group, an alkynyl group or an alkenyl group; $R^3$ represents an alkyl group, an aryl group, an alkynyl group or an alkenyl group; $R^4$ represents a hydrogen atom, an alkyl group, an aryl group, an alkynyl group or an alkenyl group; either $R^5$ or $R^6$ represents a hydrogen atom and the other represents a hydrogen atom, an alkyl group, an aryl group, an alkynyl group or an alkenyl group; and arbitrary two of $R^1$, $R^2$ and $R^3$ may form a ring, and arbitrary two of $R^4$, $R^5$ and $R^6$ may form a ring.

When $R^1$, $R^2$, $R^3$, $R^4$, $R^5$ and $R^6$ each represents an alkyl group, an aryl group, an alkynyl group or an alkenyl group, the same groups as described above in $R^1$ to $R^{30}$ of the onium compounds represented by formulae (5) to (7) can be exemplified as the specific examples of these groups.

The decomposition accelerating compounds for use in the present invention may integral type compounds with the above-described polarity conversion high molecular compounds.

The specific examples of decomposition accelerating compounds are shown below but the present invention is not limited thereto.

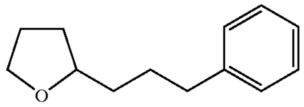

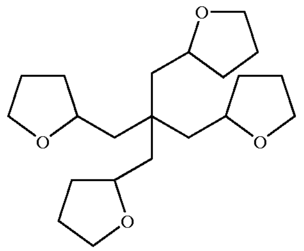

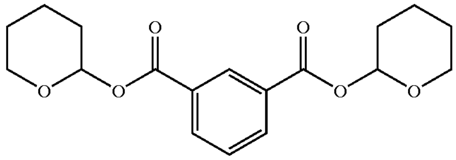

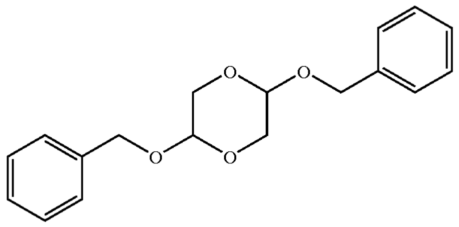

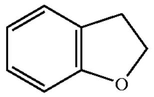

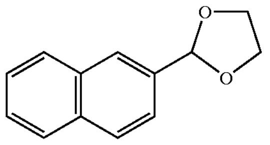

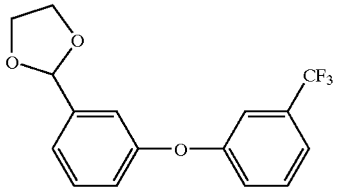

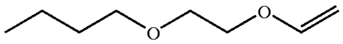

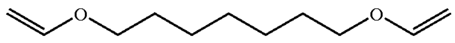

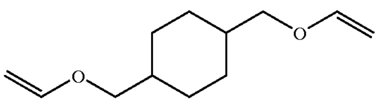

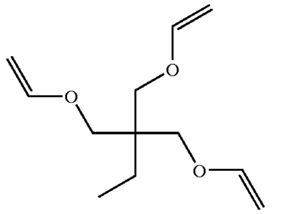

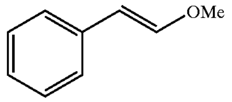

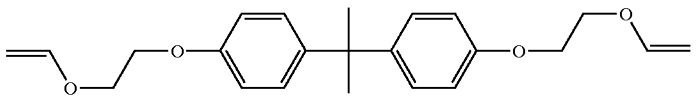

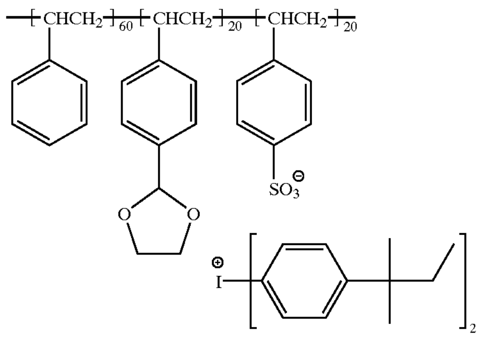

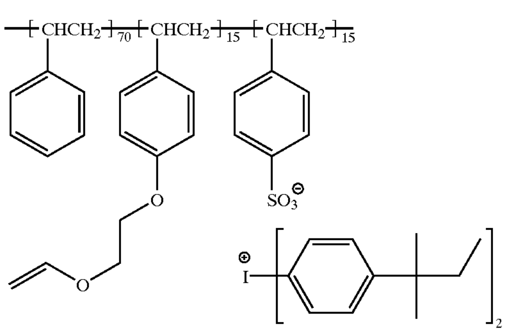

The proportion of the decomposition accelerating compounds contained in the image-forming layer of the lithographic printing plate precursor of the present invention is preferably 10 mol % or more to the mol number of the functional group represented by formula (1) and/or formula (2). When the content is 10 mol % or more, the polarity conversion high molecular compound and the infrared ray absorber according to the present invention can be converted into sufficiently hydrophilic by the mol number of the functional group represented by formula (1) and/or formula (2) in the polarity conversion high molecular compound decomposedby the presumed decomposition mechanism as described above.

Other constitutional components which can be contained in an image-forming layer are described below.

[Other Infrared Ray Absorber]

The image-forming layer of the lithographic printing plate precursor according to the present invention may comprise a polarity conversion high molecular compound alone, or an image may be formed by irradiation with actinic radiation having arbitrary wavelength through a film. However, it is preferred to add a light-to-heat converting agent to an image-forming layer to obtain a lithographic printing plate precursor well adapted to a computer-to-plate technique of directly making a printing plate using highly directive actinic radiation such as laser beams of recent years without using a lith film.

The light-to-heat converting agents preferably used in the present invention are the infrared ray absorbers according to the present invention, but other dyes and pigments which effectively absorb light of wavelength of from 760 to 1,200 nm can also be preferably used.

As dyes for this purpose, commercially available dyes and well-known dyes described, for example, in *Senryo Binran* (*Dye Handbook*), compiled by Yuki Gosei Kagaku Kyokai (1970) can be utilized. The specific examples of these dyes include an azo dye, a metal complex azo dye, a pyrazolone azo dye, an anthraquinone dye, a phthalocyanine dye, a carbonium dye, a quinoneimine dye, a methine dye, a cyanine dye and a metal thiolate complex.

A cyanine dye, a methine dye, a naphthoquinone dye and a squarylium dye can be exemplified as preferred dyes.

Further, a near infrared ray-absorbing sensitizer, a substituted arylbenzo(thio)pyrylium salt, a trimethine thiapyrylium salt, a pyrylium-series compound, a cyanine dye, a pentamethine thiopyrylium salt, and a pyrylium compound are also preferably used in the present invention.

As other examples of preferred dyes, near infrared ray-absorbing dyes which are disclosed as formulae (I) and (II) in U.S. Pat. No. 4,756,993 can be exemplified.

Of the above-described dyes, especially preferred dyes are a cyanine dye, a squarylium dye, a pyrylium salt, and a nickel thiolate complex.

As the pigments for use in the present invention, commercially available pigments and pigments described in Color Index (C.I.) Handbook, *Saishin Ganryo Binran* (*The Latest Pigment Handbook*), compiled by Nippon Ganryo Gijutsu Kyokai (1977), *Saishin Ganryo Oyo Gijutsu* (*The Latest Pigment Applied Technique*), published by CMC Publishing Co. (1986), *Insatsu Ink Gijutsu* (*Printing Ink Technique*), CMC Publishing Co. (1984) can be used.

Various kinds of pigments can be used, e.g., black pigments, yellow pigments, orange pigments, brown pigments, red pigments, purple pigments, blue pigments, green pigments, fluorescent pigments, metal powder pigments, and polymer-attaching pigments can be exemplified. Specifically, an insoluble azo pigment, an azo lake pigment, a condensation azo pigment, a chelate azo pigment, a phthalocyanine-series pigment, an anthraquinone-series pigment, a perylene-series pigment, aperinone-series pigment, a thioindigo-series pigment, a quinacridone-series pigment, a dioxazine-series pigment, an isoindolinone-series pigment, a quinophthalone-series pigment, a dyeing lake pigment, an azine pigment, a nitroso pigment, a nitro pigment, a natural pigment, a fluorescent pigment, an inorganic pigment, and a carbon black can be used. Of these pigments, a carbon black is preferred.

These pigments can be used without surface treatment or may be surface-treated. As methods of surface treatments, a method of surface-coating with a resin and a wax, a method of adhering a surfactant, and a method of attaching a reactive substance (e.g., a silane coupling agent, an epoxy compound and polyisocyanate) on the surface of a pigment can be exemplified. These surface treatment methods are described in *Kinzoku Sekken no Seishitsu to Oyo* (*Natures and Applications of Metal Soaps*), Saiwai Shobo Co., *Insatsu Ink Gijutsu* (*Printing Ink Technique*), CMC Publishing Co. (1984), and *Saishin Ganryo Oyo Gijutsu* (*The Latest Pigment Applied Technique*), CMC Publishing Co. (1986).

These pigments have a particle size of preferably from 0.01 to 10 $\mu$m, more preferably from 0.05 to 1 $\mu$m, and particularly preferably from 0.1 to 1 $\mu$m. When the particle size of these pigments is less than 0.01 $\mu$m, it is difficult to obtain the stability of dispersoid in the coating solution of an image-forming layer, while when it exceeds 10 $\mu$m, the uniformity of an image-forming layer after coating cannot be obtained.

Well-know dispersion methods used in the manufacture of inks and toners can be used as the dispersing methods of pigments. Examples of dispersing apparatus include an ultrasonic disperser, a sand mill, an attritor, a pearl mill, a super-mill, a ball mill, an impeller, a disperser, a KD mill, a colloid mill, a dynatron, a three-roll mill, and a pressure kneader, and details are described in *Saishin Ganryo Oyo Gijutsu* (*The Latest Pigment Applied Technique*), CMC Publishing Co. (1986).

These dyes or pigments can be used in an amount of from 0.01 to 50 wt %, preferably from 0.1 to 10 wt %, based on the entire solid contents in the image-forming layer of the lithographic printing plate precursor of the present invention, and in the case of dyes, particularly preferably the amount of from 0.5 to 10 wt % can be used, and in the case of pigments, particularly preferably the amount of from 1.0 to 10 wt % can be used. If the addition amount of pigments or dyes is less than 0.01 wt %, the sensitivity lowers, and when the amount exceeds 50 wt %, a non-image area is liable to be stained during printing.

[High Molecular Compound]

The lithographic printing plate precursor according to the present invention can contain a high molecular compound besides the polarity conversion high molecular compound of the present invention. Any high molecular compounds can be used as long as they do not hinder the dissolution of an image-forming layer at least in water or an aqueous solution by heat. The high molecular compounds particularly preferably used in the present invention include hydrophobic high molecular compounds which are converted into hydrophilic by heat (hereinafter sometimes referred to as positive polarity conversion high molecular compounds) and resins soluble in an alkali aqueous solution.

[Positive Polarity Conversion High Molecular Compound]

Positive polarity conversion high molecular compounds for use in the present invention are hydrophobic high molecular compounds which are converted into hydrophilic by heat as described above. As such high molecular compounds, hydrophobic high molecular compounds having a hydrophobic functional group on the side chain which is converted into hydrophilic by heat can be exemplified. This conversion is required to be conversion of the degree that a compound which does not show the affinity such as dissolving or swelling in water at normal temperature comes to show the affinity such as dissolving or swelling in water due to the conversion of a part of or the entire of the polarity conversion functional group of the side chain when heat is applied to the compound by light-to-heat conversion after laser exposure.

The process that the hydrophobic functional group of a hydrophobic high molecular compound is converted into hydrophilic by heat is regarded to be classified into a process that an originally hydrophobic functional group of the side chain is converted into hydrophilic by the reaction by heat, and a process that an originally hydrophobic functional group of the side chain is decomposed by heat and the compound is converted into hydrophilic by losing the hydrophobic functional group.

As the former process of an originally hydrophobic functional group of the side chain being converted into hydrophilic by the reaction by heat, there are a process that the hydrophobic functional group reacts with other functional group in the same polymer by heat and the hydrophobic functional group is converted into hydrophilic, and a process that the hydrophobic functional group reacts by heat with other compound on the outside of the polymer and the hydrophobic functional group is converted into hydrophilic, and functional groups may undergo the conversion into hydrophilic by these two kinds of processes in combination.

Of the above processes, a process that an originally hydrophobic functional group of the side chain is decomposed by heat and the compound is converted into hydrophilic by losing the hydrophobic functional group is preferred from the viewpoint of reactivity.

In the present invention, it is more preferred for the polarity conversion functional group of the side chain of a polarity conversion high molecular compound to be entirely converted into hydrophilic, but if the conversion occurs to a degree that the polarity conversion high molecular compound comes to show the affinity such as dissolving or swelling in water, the polarity conversion functional group need not be entirely converted into hydrophilic.

The specific examples of the hydrophobic functional groups for use in the present invention are shown below.

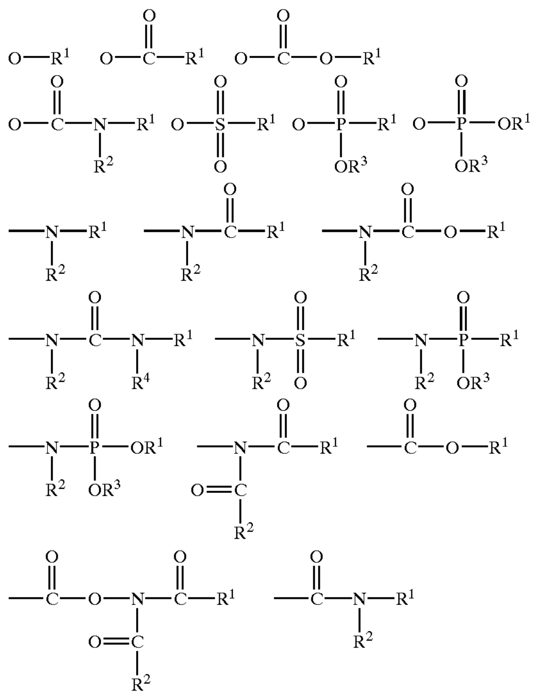

-continued

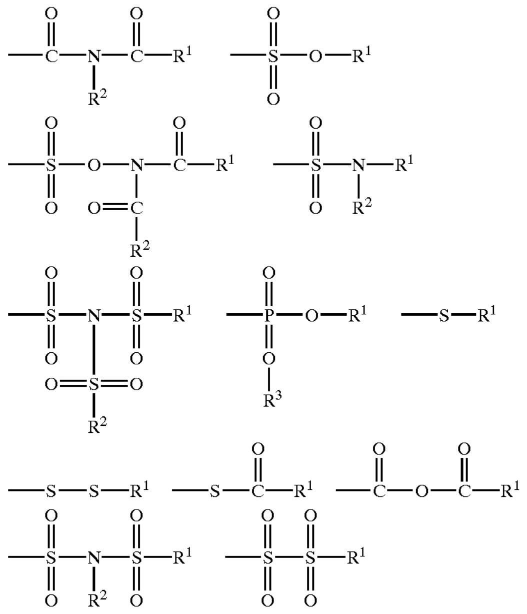

wherein $R^1$ and $R^3$ each represents an alkyl group, an aryl group, an alkenyl group or an alkynyl group; $R^2$ and $R^4$ each represents a hydrogen atom, an alkyl group, an aryl group, an alkenyl group or an alkynyl group; $R^1$ and $R^2$, $R^1$ and $R^3$, and $R^1$ and $R^4$ may form a ring.

Specific examples of the hydrophilic functional groups for use in the present invention are shown below.

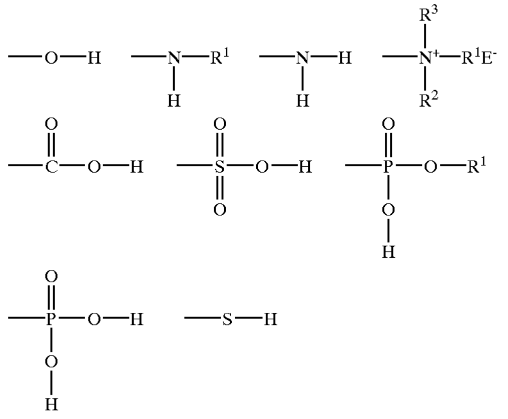

wherein $R^1$, $R^2$ and $R^3$ each represents a hydrogen atom, an alkyl group, an aryl group, an alkenyl group or an alkynyl group, and arbitrary two of $R^1$, $R^2$ and $R^3$ may form a ring; and $E^-$ represents a counter anion.

When $R^1$, $R^2$, $R^3$ and $R^4$ each represents an alkyl group, the alkyl group is a straight chain, branched or cyclic alkyl group having from 1 to 20 carbon atoms (e.g., methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl). Of these groups, a straight chain alkyl group having from 1 to 12 carbon atoms, a branched alkyl group having from 3 to 12 carbon atoms, and a cyclic alkyl group having from 5 to 10 carbon atoms are more preferred.

When $R^1$, $R^2$, $R^3$ and $R^4$ each represents a substituted alkyl group, monovalent nonmetallic atomic groups exclusive of a hydrogen atom are used as the substituents. The preferred examples of the substituents of the substituted alkyl group include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H$-(alkyl)) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonooxy group ($—OPO_3H_2$) and a conjugate base group thereof (hereinafter referred to as a phosphonatooxy group), a dialkylphosphonooxy group ($—OPO_3(alkyl)_2$), a diarylphosphonooxy group ($—OPO_3(aryl)_2$) an alkylarylphosphonooxy group ($—OPO_3(alkyl)(aryl)$), a monoalkylphosphonooxy group ($—OPO_3H(alkyl)$) and a conjugate base group thereof (hereinafter referred to as an alkylphosphonatooxy group), a monoarylphosphonooxy group ($—OPO_3H(aryl)$) and a conjugate base group thereof (hereinafter referred to as an arylphosphonatooxy group), a cyano group, a nitro group, an aryl group, an alkenyl group, and an alkynyl group.

As the specific examples of the alkyl groups in these substituents of the substituted alkyl groups, the above-described alkyl groups can be exemplified, and as the specific examples of the aryl groups in these substituents, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl and a phosphonatophenyl can be exemplified.

As the examples of the alkenyl groups in these substituents, a vinyl group, a 1-propenyl group, a 1-butenyl group, a cinnamyl group and a 2-chloro-1-ethenyl group can be exemplified. As the examples of the alkynyl groups, an ethynyl group, a 1-propynyl group, a 1-butynyl group and a trimethylsilylethynyl group can be exemplified. As $R^{41}$ in the acyl group ($R^{41}CO—$), a hydrogen atom and the above-described alkyl groups and aryl groups can be exemplified.

Of these substituents, more preferred groups include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-aryl-sulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, and an alkenyl group.

On the other hand, as the alkylene group in the substituted alkyl groups, divalent organic residues obtained by removing any one hydrogen atom on the above-described alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms. The specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl) carbamoylethyl group, an N-methyl-N-(sulfophenyl) carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an $\alpha$-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R^1$, $R^2$, $R^3$ and $R^4$ each represents an aryl group, the examples of the aryl groups include a condensed ring formed by 1 to 3 benzene rings and a condensed ring formed by a benzene ring and a 5-membered unsaturated ring, and the specific examples of such aryl groups include a phenyl group, a naphthyl group, an anthryl group, a phenanthryl group, an indenyl group, an acenaphthenyl group and a fluorenyl group. Of these groups, a phenyl group and a naphthyl group are more preferred. Heterocyclic aryl groups are included in the aryl group besides the above carbocyclic aryl groups. As the heterocyclic aryl groups, those containing from 3 to 20 carbon atoms and from 1 to 5 hetero atoms, e.g., a pyridyl group, a furyl group, and a quinolyl group, a benzofuryl group, a thioxanthone group and a carbazole group condensed with a benzene ring are used.

When $R^1$, $R^2$, $R^3$ and $R^4$ each represents a substituted aryl group, the substituted aryl groups are those having, as the substituents, monovalent nonmetallic atomic groups exclusive of a hydrogen atom on the ring-forming carbon atoms of the above-described aryl groups. As the preferred examples of the substituents, the above-described alkyl groups and substituted alkyl groups, and the groups described above as the examples of the substituents for the substituted alkyl groups can be exemplified.

The preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

When $R^1$, $R^2$, $R^3$ and $R^4$ each represents an alkenyl group, a substituted alkenyl group [$-C(R^{42})=C(R^{43})(R^{44})$], an alkynyl group, or a substituted alkynyl group [$-C\equiv C(R^{45})$], monovalent nonmetallic atomic groups can be used as $R^{42}$, $R^{43}$, $R^{44}$ and $R^{45}$.

The preferred examples of $R^{42}$, $R^{43}$, $R^{44}$ and $R^{45}$ include a hydrogen atom, a halogen atom, an alkyl group, a substituted alkyl group, an aryl group and a substituted aryl group, and the above exemplified groups can be used as the specific examples of these groups. $R^{42}$, $R^{43}$, $R^{44}$ and $R^{45}$ each more preferably represents a hydrogen atom, a halogen atom, or a straight chain, branched or cyclic alkyl group having from 1 to 10 carbon atoms.

The specific examples of the alkenyl groups, substituted alkenyl groups, alkynyl groups, and substituted alkynyl groups include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethyl group.

Of the above groups, $R^1$ and $R^3$ each preferably represents an alkyl group, a substituted alkyl group, an aryl group, or a substituted aryl group, and $R^2$ and $R^4$ each preferably represents a hydrogen atom, an alkyl group, a substituted alkyl group, an aryl group, or a substituted aryl group.

The counter anions represented by $E^-$ are anions having negative electric charge and form an ion pair with the positive electric charge in an ammonium group ($-N^+R^1R^2R^3$) which is a hydrophilic functional group. Therefore, the counter anions represented by $E^-$ are present in mol number equivalent to the positive electric charge present in the ammonium group.

More specific examples of counter anions include $F^-$, $Cl^-$, $Br^-$, $I^-$, $HO^-$, $CN^-$, $SO_4^{2-}$, $HSO_4^-$, $SO_3^{2-}$, $HSO_3^-$, $NO_3^-$, $CO_3^{2-}$, $HCO_3^-$, $PF_6^-$, $BF_4^-$, $ClO_4^-$, $ClO_3^-$, $ClO_2^-$, $ClO^-$, $BrO_4^-$, $BrO_3^-$, $BrO_2^-$, $BrO^-$, $IO_4^-$, $IO_3^-$, $IO_2^-$, $IO^-$, a sulfonic acid anion, a carboxylic acid anion, a phosphonic acid anion, and a phosphoric acid anion.

As specific examples of the sulfonic acid anions, the following compounds can be exemplified, but it should not be construed as the present invention is limited thereto.

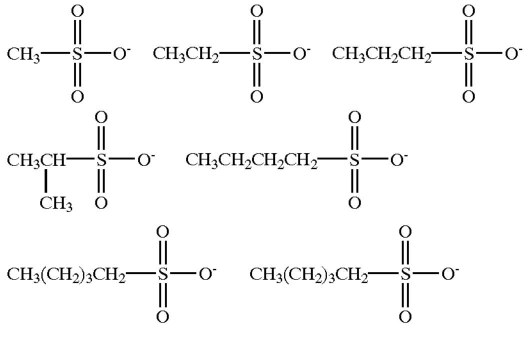

-continued
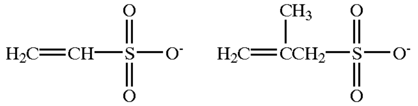
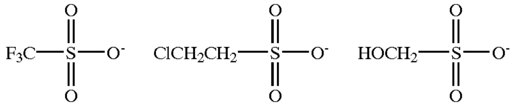
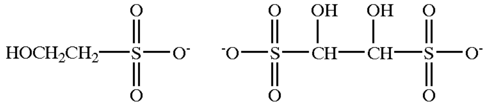
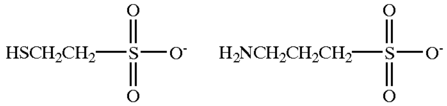
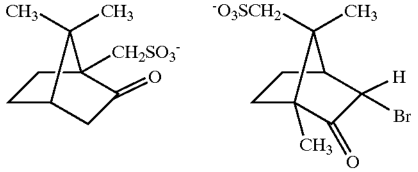
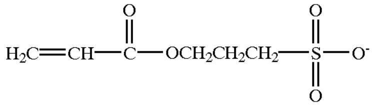
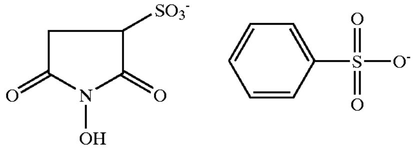
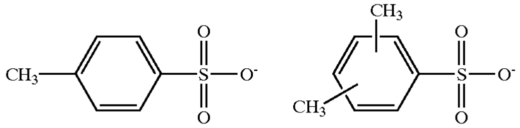
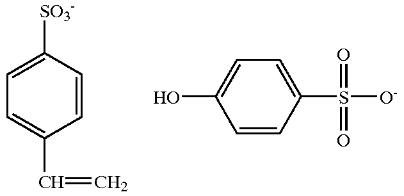
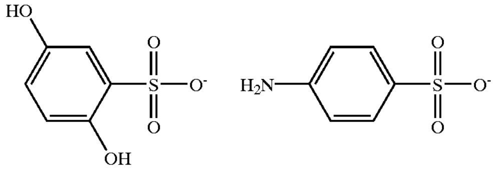
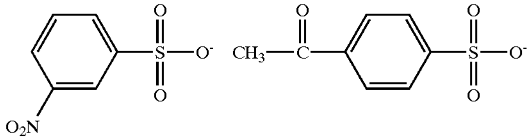
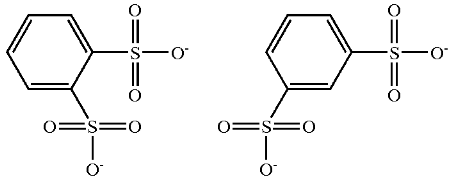
-continued
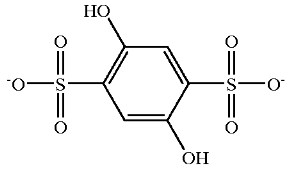
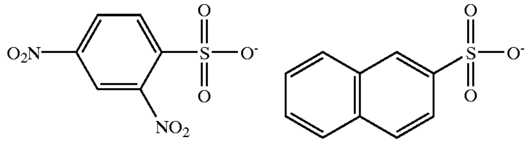
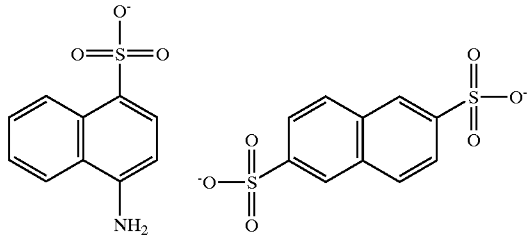
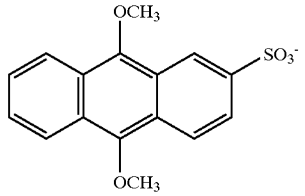
As specific examples of the carboxylic acid anions, the following compounds can be exemplified, but it should not be construed as the present invention is limited thereto.
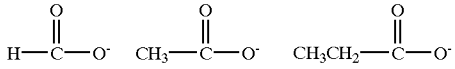
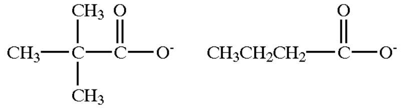
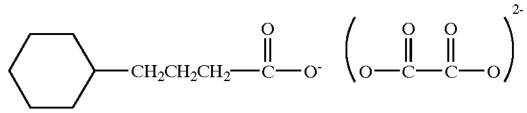
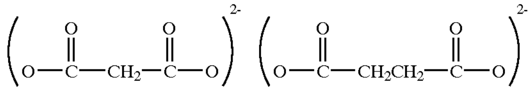
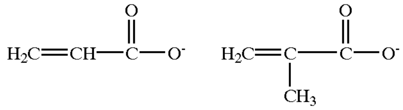
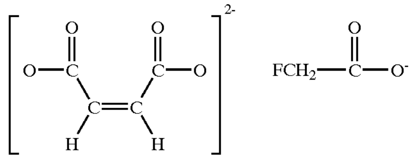
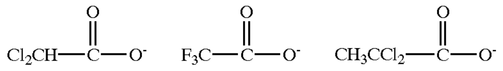

-continued
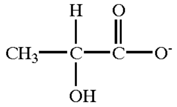
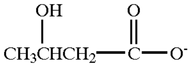
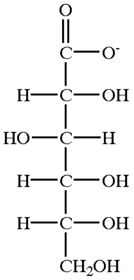
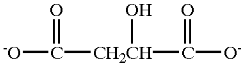
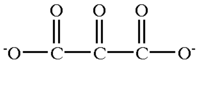
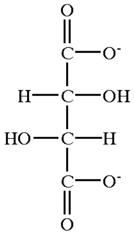
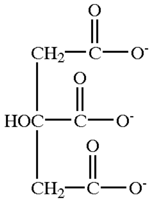
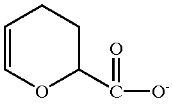
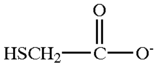
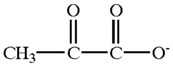
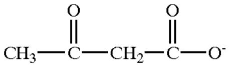
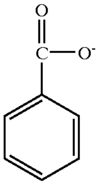
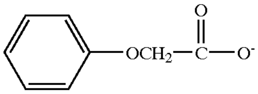
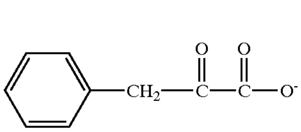
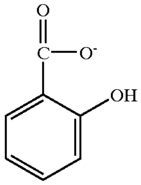
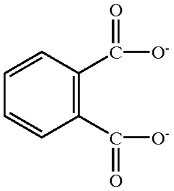
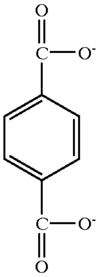
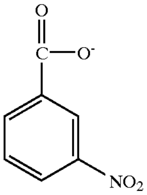
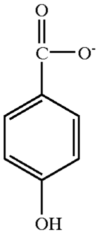
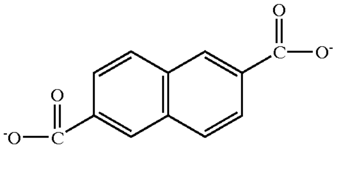
As specific examples of the phosphonic acid anions, the following compounds can be exemplified, but it should not be construed as the present invention is limited thereto.
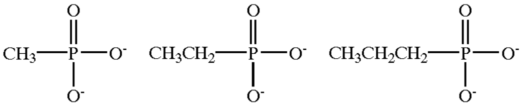
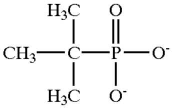
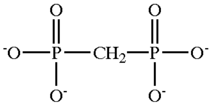
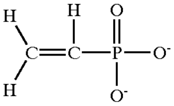
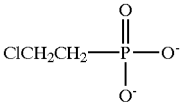
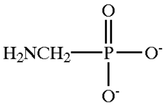
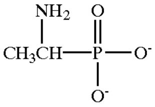
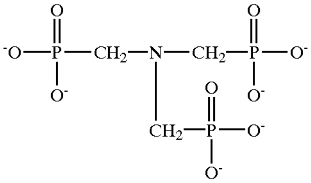
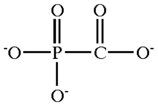
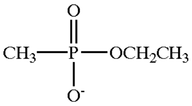
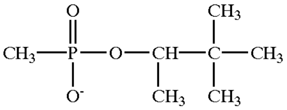
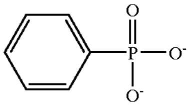
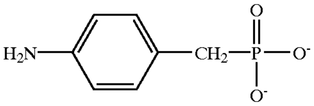
As specific examples of the phosphoric acid anions, the following compounds can be exemplified, but it should not be construed as the present invention is limited thereto.
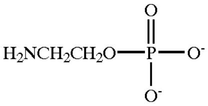
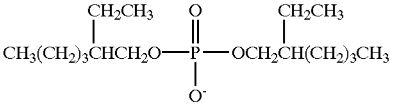
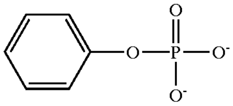
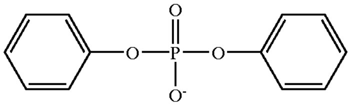
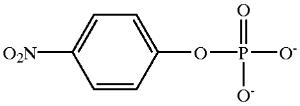
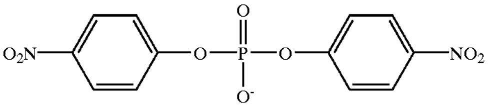

-continued

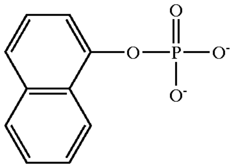

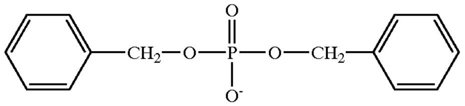

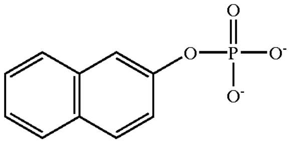

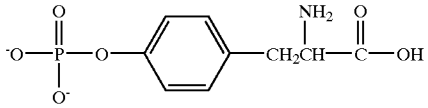

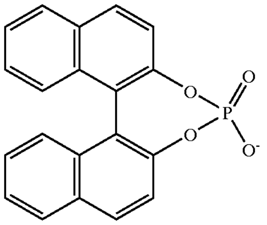

$PO_4^{3-}$, $HPO_4^{2-}$, $H_2PO_4^-$,

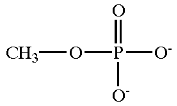

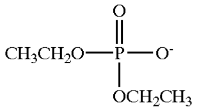

Of these anions, $Cl^-$, $Br^-$, $I^-$, $CN^-$, $SO_4^{2-}$, $PF_6^-$, $BF_4^-$, $ClO_4^-$, a sulfonic acid anion, a carboxylic acid anion, a phosphonic acid anion, and a phosphoric acid anion are preferably used in the present invention.

Of these hydrophobic functional groups which are converted into hydrophilic by heat, the functional groups represented by the following formulae (6) to (10) are particularly preferred in view of reactivity, storage stability and hydrophilic/hydrophobic discriminability.

(6)

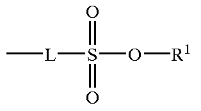

(7)

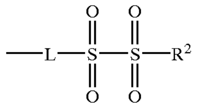

(8)

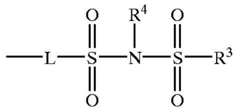

(9)

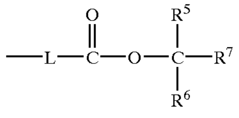

-continued (10)

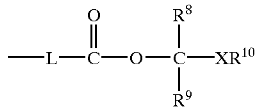

wherein L represents a polyvalent linking group comprising nonmetallic atoms; $R^1$ represents an alkyl group, an aryl group, an alkenyl group, an alkynyl group, or a cyclic imido group; $R^2$ and $R^3$ each represents an alkyl group, an aryl group, an alkenyl group, or an alkynyl group; $R^4$ represents an alkyl group, an aryl group, an alkenyl group, an alkynyl group, or —$SO_2$—$R^{11}$; $R^5$, $R^6$ and $R^7$ each represents an alkyl group, an aryl group, an alkenyl group, or an alkynyl group; either $R^8$ or $R^9$ represents a hydrogen atom, and the other represents a hydrogen atom, an alkyl group, an aryl group, an alkenyl group, or an alkynyl group; $R^{10}$ represents an alkyl group, an alkenyl group, or an alkynyl group; $R^{11}$ represents an alkyl group, an aryl group, an alkenyl group, or an alkynyl group; arbitrary two or three of $R^5$, $R^6$ and $R^7$ may form a ring, and $R^8$ and $R^{10}$, or $R^9$ and $R^{10}$ may form a ring; and X represents O or S.

When $R^1$ to $R^{11}$ each represents an alkyl group, the above-described functional groups can be exemplified as the alkyl group.

When $R^1$ to $R^{11}$ each represents a substituted alkyl group, the above-described functional groups can be exemplified as the substituents.

When $R^1$ to $R^9$ and $R^{11}$ each represents an aryl group, the above-described functional groups can be exemplified as the aryl group.

When $R^1$ to $R^9$ and $R^{11}$ each represents a substituted aryl group, the above-described functional groups can be exemplified as the substituted aryl group.

When $R^1$ to $R^{11}$ each represents an alkenyl group, a substituted alkenyl group [—C($R^{13}$)═C($R^{14}$)($R^{15}$)], an alkynyl group, or a substituted alkynyl group [—C≡C($R^{16}$)], monovalent nonmetallic atomic groups can be used as $R^{13}$, $R^{14}$, $R^{15}$ and $R^{16}$.

$R^{13}$, $R^{14}$, $R^{15}$ and $R^{16}$ each preferably represents a hydrogen atom, a halogen atom, an alkyl group, a substituted alkyl group, an aryl group or a substituted aryl group. As the specific examples of these groups, those described above as examples can be exemplified.

When $R^1$ represents a cyclic imido group, succinic acid imide, phthalic acid imide, cyclohexanedicarboxylic acid imide, and norbornenedicarboxylic acid imide each having from 4 to 20 carbon atoms can be used as the cyclic imido groups.

$R^1$ particularly preferably represents an alkyl group, a substituted alkyl group or a cyclic imido group.

$R^2$, $R^3$, $R^4$ and $R^{11}$ each particularly preferably represents an alkyl group substituted with an electron attracting group such as halogen, cyano or nitro, an aryl group substituted with an electron attracting group such as halogen, cyano or nitro, or a secondary or tertiary branched alkyl group.

$R^5$, $R^6$, $R^7$, $R^8$ and $R^9$ each preferably represents an alkyl group, a substituted alkyl group, an aryl group or a substituted aryl group, $R^{10}$ preferably represents an alkyl group or a substituted alkyl group, it is preferred that arbitrary two or three of $R^5$, $R^6$ and $R^7$ form a ring, and $R^8$ and $R^{10}$, or $R^9$ and $R^{10}$ form a ring.

The polyvalent linking group comprising nonmetallic atoms represented by L is a polyvalent linking group comprising from 1 to 60 carbon atoms, from 0 to 10 nitrogen atoms, from 0 to 50 oxygen atoms, from 1 to 100 hydrogen atoms, and from 0 to 20 sulfur atoms. As more specific examples of the linking groups, those comprising the following structural units in combination can be exemplified.

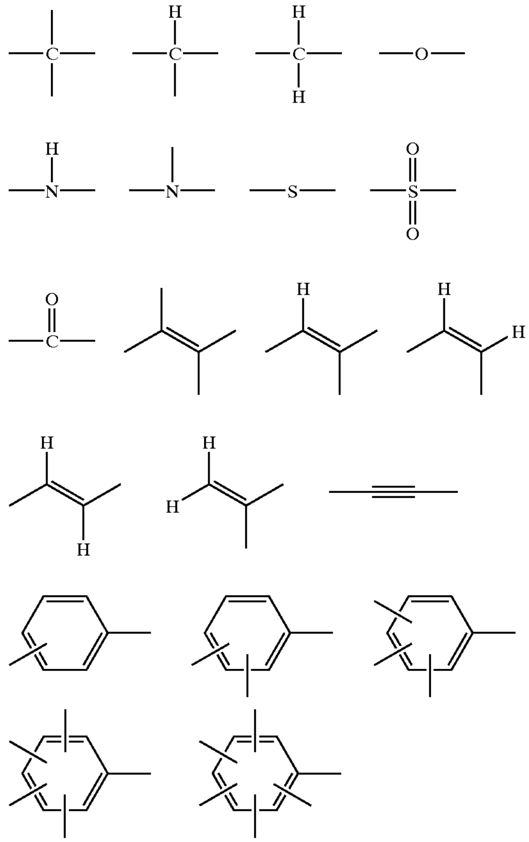

When the polyvalent linking group has a substituent, an alkyl group having from 1 to 20 carbon atoms, e.g., methyl and ethyl, an aryl group having from 6 to 16 carbon atoms, e.g., phenyl and naphthyl, a hydroxyl group, a carboxyl group, a sulfonamido group, an N-sulfonylamido group, an acyloxy group having from 1 to 6 carbon atoms, e.g., acetoxy, an alkoxyl group having from 1 to 6 carbon atoms, e.g., methoxy and ethoxy, a halogen atom, e.g., chlorine and bromine, an alkoxycarbonyl group having from 2 to 7 carbon atoms, e.g., methoxycarbonyl, ethoxycarbonyl, and cyclohexyloxycarbonyl, a cyano group, and carbonic acid ester, e.g., t-butylcarbonate can be used as the substituent.

The specific examples of the radical polymerizable monomers having a hydrophobic functional group converted into hydrophilic by heat which are preferably used for synthesizing a positive polarity conversion high molecular compound of the present invention are shown below, but the present invention should not be construed as being limited thereto.

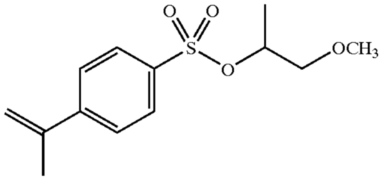

-continued

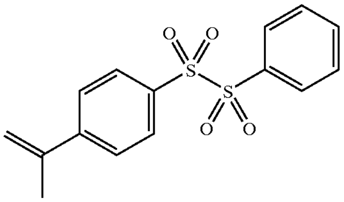

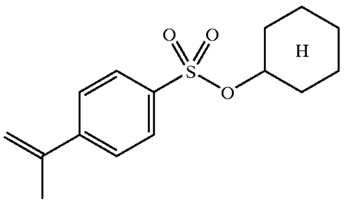

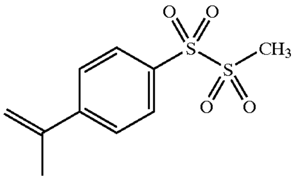

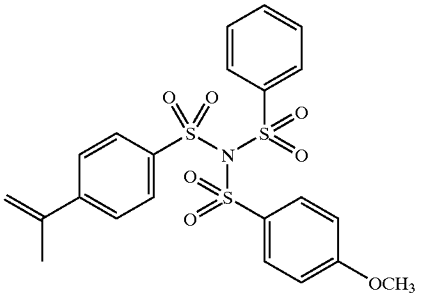

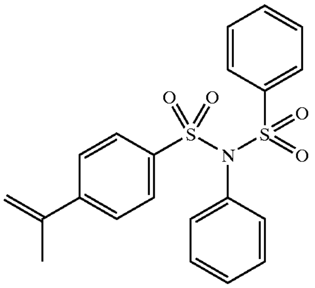

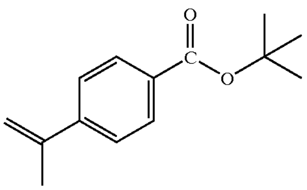

-continued
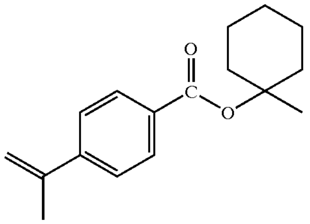
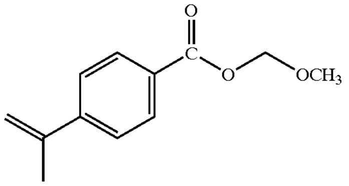
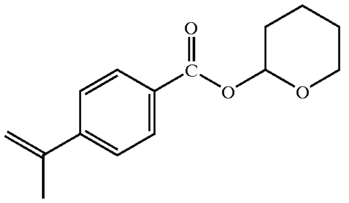
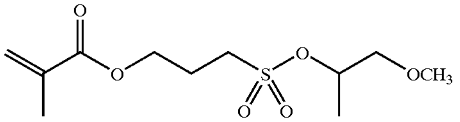
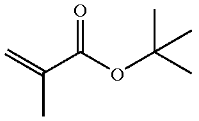
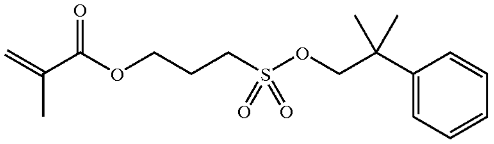
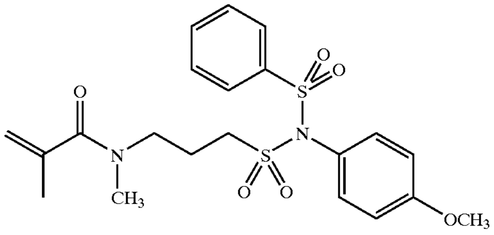
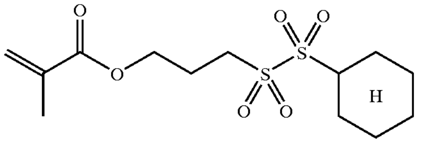
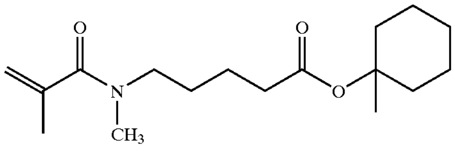
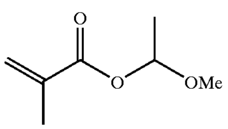
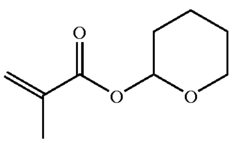
-continued
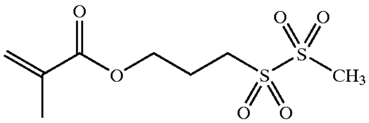
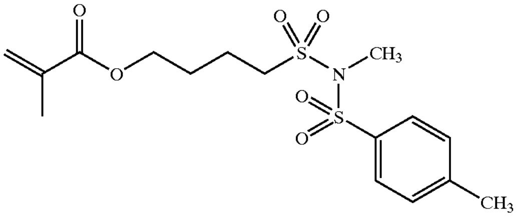
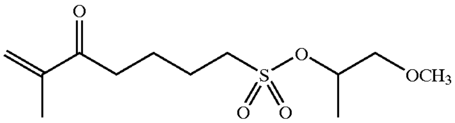
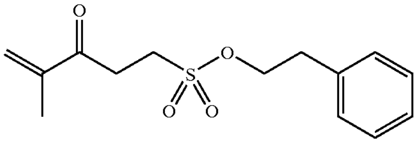
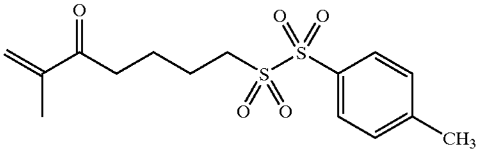
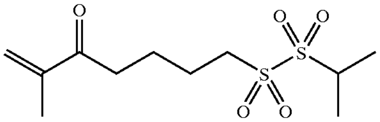
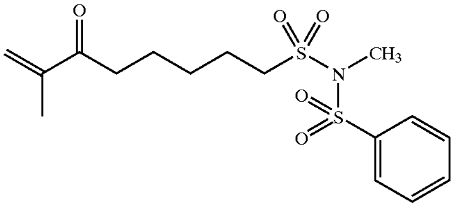
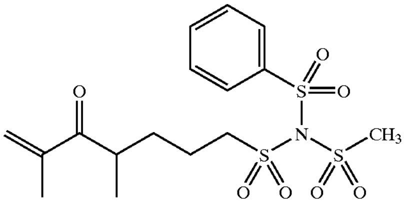
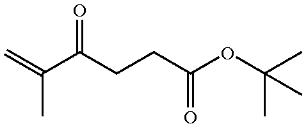
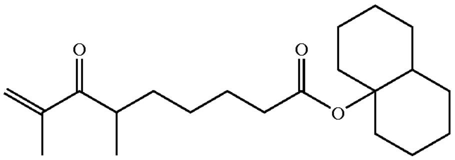

-continued
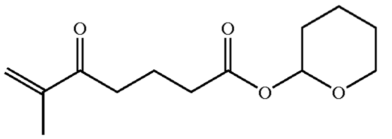
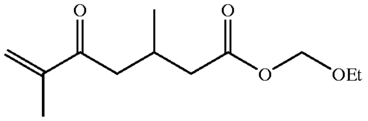
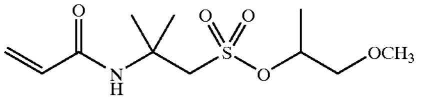
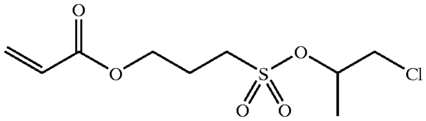
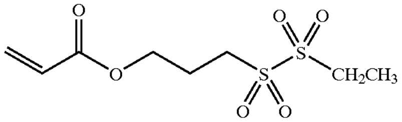
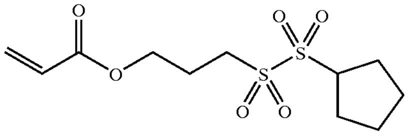
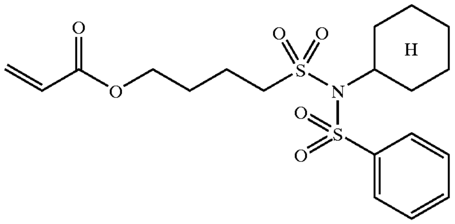
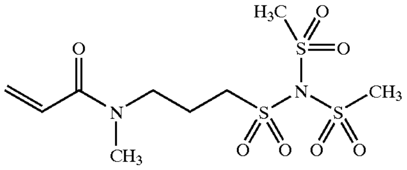
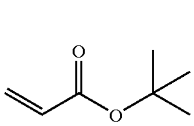
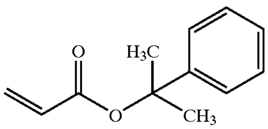
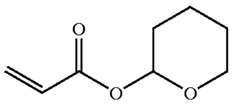
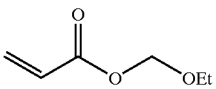
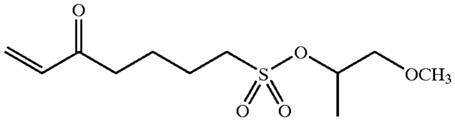
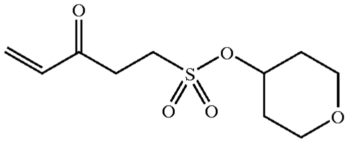
-continued
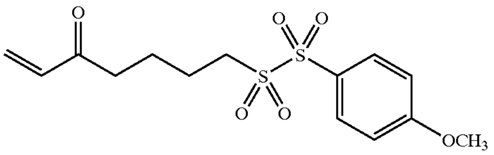
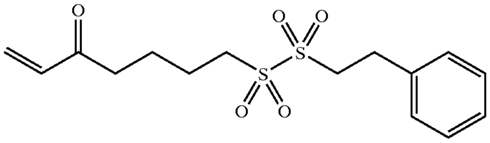
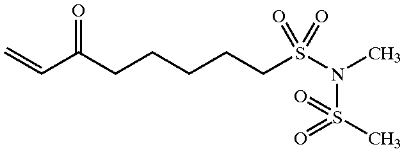
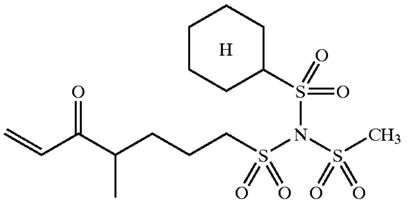
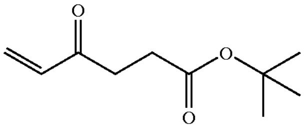
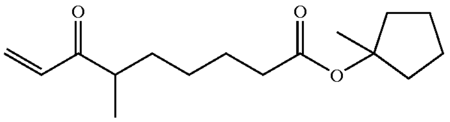
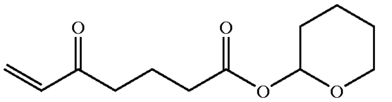
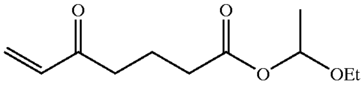
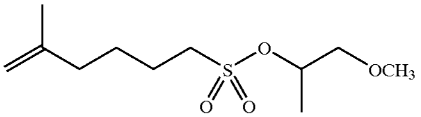
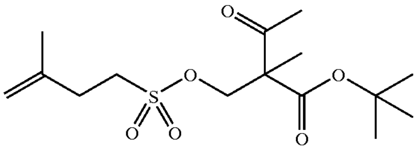
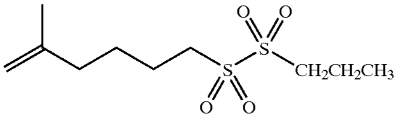
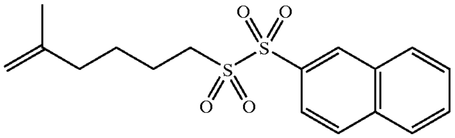

-continued
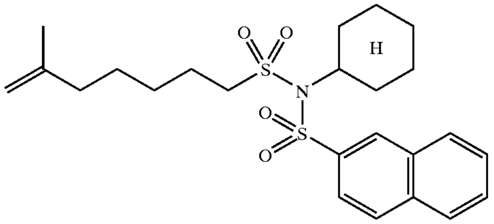
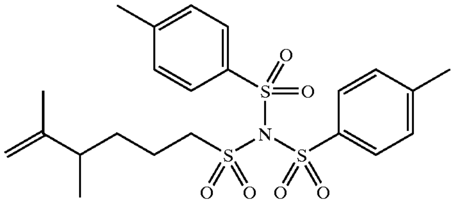
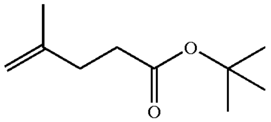
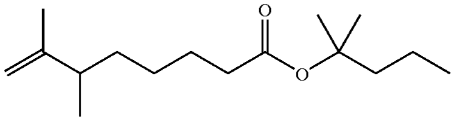
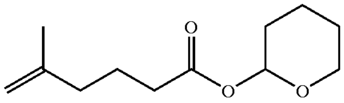
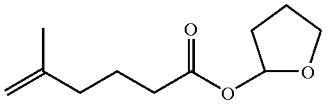
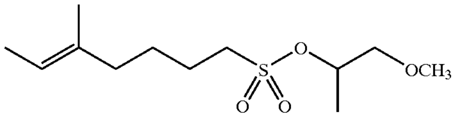
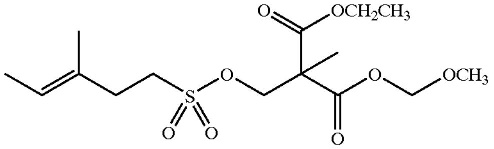
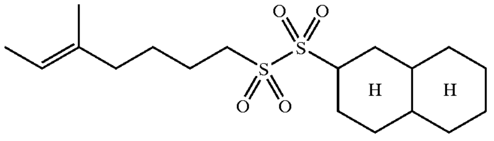
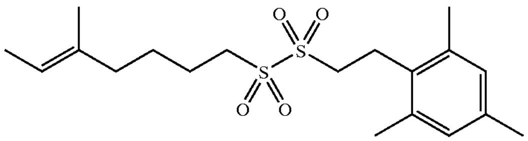
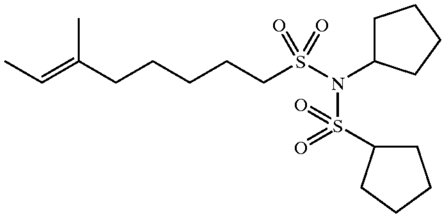
-continued
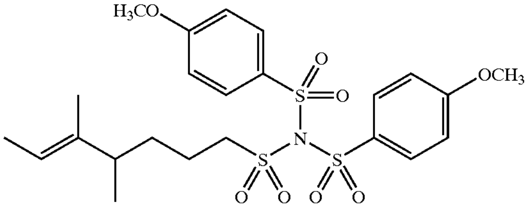
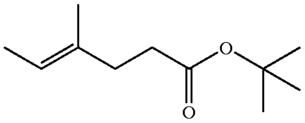
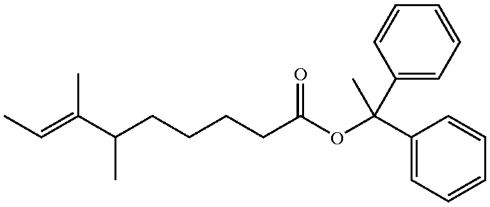
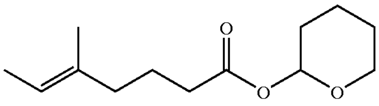
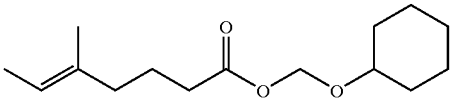
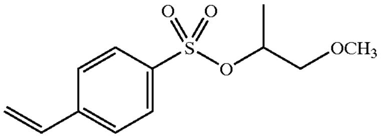
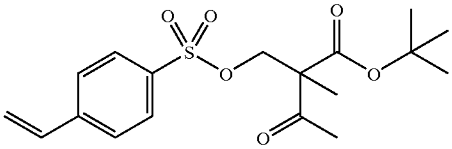
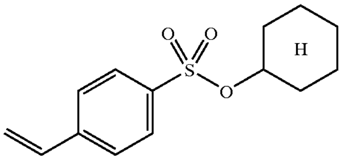
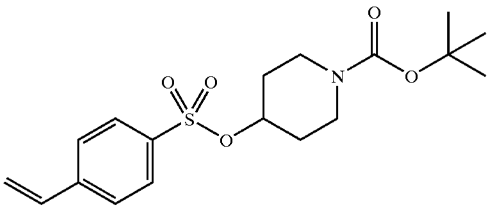
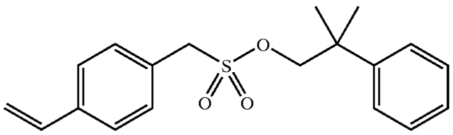
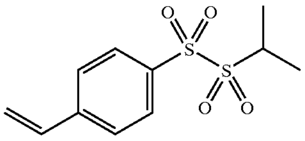

-continued
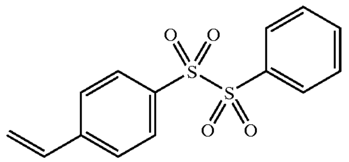
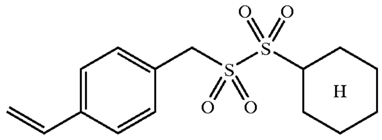
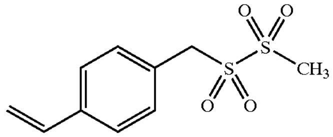
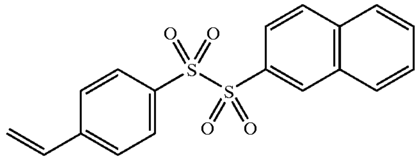
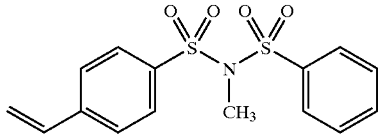
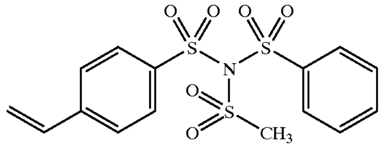
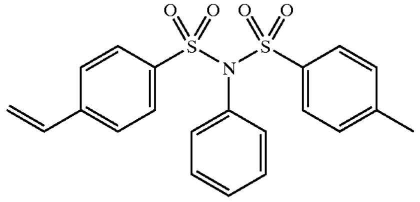
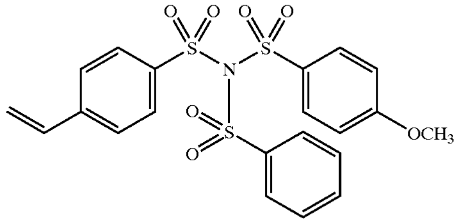
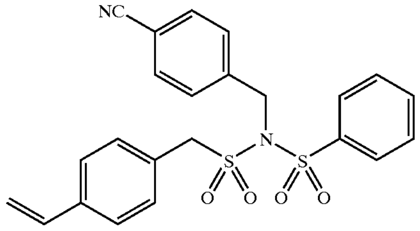
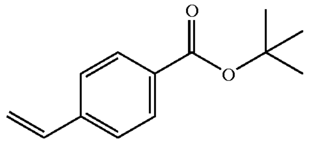
-continued
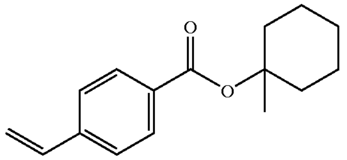
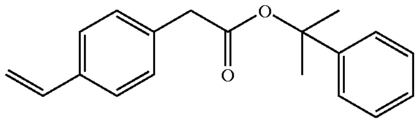
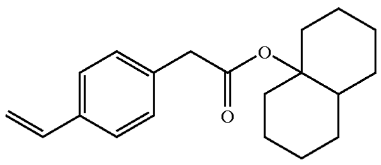
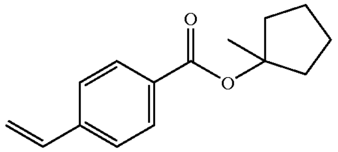
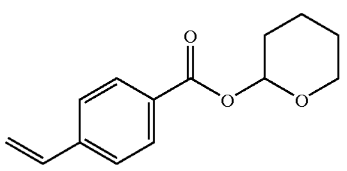
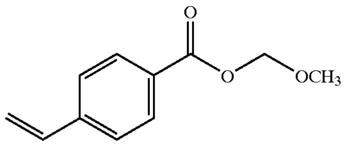
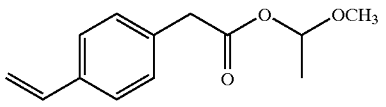
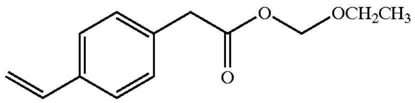
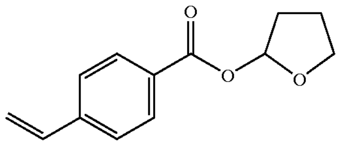
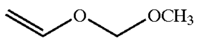
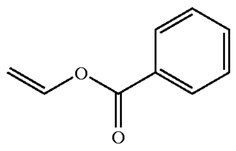
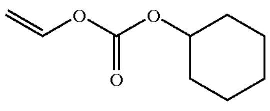
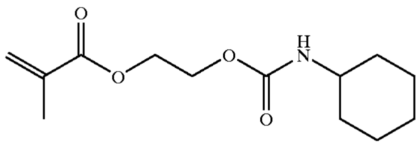

-continued

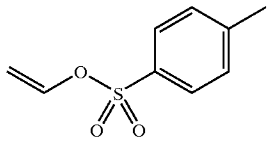

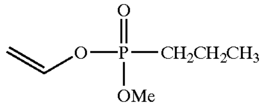

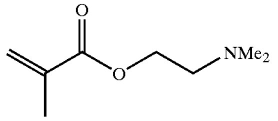

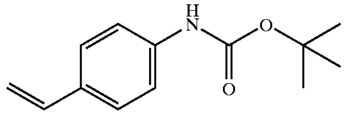

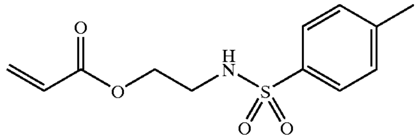

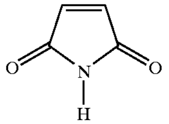

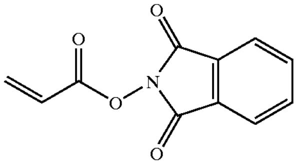

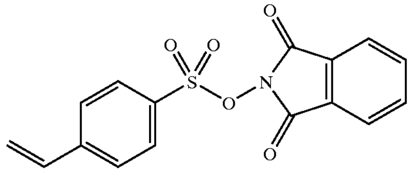

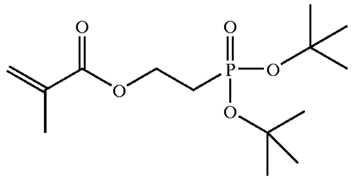

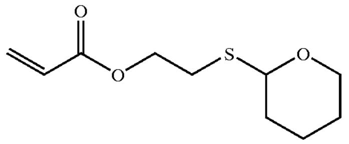

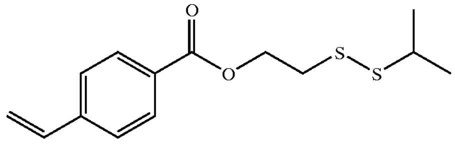

The positive polarity conversion high molecular compounds are not particularly restricted as long as they have a hydrophobic functional group which is converted into hydrophilic by heat on at least a part of the side chain, and the compounds may have on the side chain a functional group besides the hydrophobic functional group converted into hydrophilic by heat. Consequently, a copolymer with a monomer having a functional group other than a hydrophobic functional group which is converted into hydrophilic by heat can be preferably used in the present invention so long as the copolymer does not inhibit the effect of the present invention. The following monomers can be exemplified as the radical polymerizable monomers having such a side chain.

As other radical polymerizable monomers which can be used in the copolymers, the following well-known monomers can be exemplified, e.g., acrylic acid, acrylates, acrylamides, methacrylic acid, methacrylates, methacrylamides, maleic acid, maleic anhydride, maleates, maleic acid amides, maleic acid imides, itaconic acid, itaconic anhydride, itaconates, itaconic acid amides, itaconic acid imides, crotonic acid, crotonates, crotonic acid amides, fumaric acid, fumarates, fumaric acid amides, mesaconic acid, mesaconates, mesaconic acid amides, α,β-unsaturated lactones, α,β-unsaturated lactams, unsaturated hydrocarbons, vinyl ethers, vinyl esters, α,β-unsaturated ketones, and styrenes.

The specific examples of acrylates include methyl acrylate, ethyl acrylate, (n- or i-)propyl acrylate, (n-, i-, sec- or t-)butyl acrylate, pentyl acrylate, hexyl acrylate, heptyl acrylate, octyl acrylate, nonyl acrylate, decyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

The specific examples of acrylamides include acrylamide, N-methylacrylamide, N-ethylacrylamide, N-(n- or i-)propylacrylamide, N-(n-, i-, sec- or t-)acrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl)acrylamide, N-(tolylsulfonyl)acrylamide, N,N-dimethylacrylamide, N-methyl-N-phenylacrylamide, and N-hydroxyethyl-N-methylacrylamide.

The specific examples of methacrylates include methyl methacrylate, ethyl methacrylate, (n- or i-)propyl methacrylate, (n-, i-, sec- or t-)butyl methacrylate, pentyl methacrylate, hexyl methacrylate, heptyl methacrylate, octyl methacrylate, nonyl methacrylate, decyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

The specific examples of methacrylamides include methacrylamide, N-methylmethacrylamide, N-ethylmethacrylamide, N-(n- or i-)propylmethacrylamide, N-(n-, i-, sec- or t-)methacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl)methacrylamide, N-(phenylsulfonyl)methacrylamide, N-(tolylsulfonyl)methacrylamide, N,N-dimethylmethacrylamide, N-methyl-N-phenylmethacrylamide, and N-hydroxyethyl-N-methylmethacrylamide.

The specific examples of crotonates include methyl crotonate, ethyl crotonate, (n- or i-)propyl crotonate, (n-, i-, sec- or t-)butyl crotonate, pentyl crotonate, hexyl crotonate, heptyl crotonate, octyl crotonate, nonyl crotonate, decyl crotonate, amyl crotonate, 2-ethylhexyl crotonate, dodecyl crotonate, chloroethyl crotonate, 2-hydroxyethyl crotonate, 2-hydroxypropyl crotonate, 5-hydroxypentyl crotonate, cyclohexyl crotonate, allyl crotonate, trimethylolpropane monocrotonate, pentaerythritolmonocrotonate, benzyl crotonate, methoxybenzyl crotonate, chlorobenzyl crotonate, hydroxybenzyl crotonate, hydroxyphenethyl crotonate, dihydroxyphenethyl crotonate, furfuryl crotonate, tetrahydrofurfuryl crotonate, phenyl crotonate, hydroxyphenyl crotonate, chlorophenyl crotonate, sulfamoylphenyl crotonate, and 2-(hydroxyphenylcarbonyloxy)ethyl crotonate.

The specific examples of crotonic acid amides include crotonic acid amide, N-methylcrotonic acid amide, N-ethylcrotonic acid amide, N-(n- or i-)propylcrotonic acid amide, N-(n-, i-, sec- or t-)crotonic acid amide, N-benzylcrotonic acid amide, N-hydroxyethylcrotonic acid amide, N-phenylcrotonic acid amide, N-tolylcrotonic acid amide, N-(hydroxyphenyl)crotonic acid amide, N-(sulfamoylphenyl)crotonic acid amide, N-(phenylsulfonyl)crotonic acid amide, N-(tolylsulfonyl) crotonic acid amide, N,N-dimethylcrotonic acid amide, N-methyl-N-phenylcrotonic acid amide, and N-hydroxyethyl-N-methylcrotonic acid amide.

The specific examples of maleates include dimethyl maleate, diethyl maleate, di-(n- or i-)propyl maleate, di-(n-, i-, sec- or t-)butyl maleate, diphenyl maleate, diallyl maleate, monomethyl maleate, monoethyl maleate, mono-(n- or i-)propyl maleate, mono-(n-, i-, sec- or t-)butylmaleate, dibenzylmaleate, monobenzyl maleate, methylethyl maleate, methylpropyl maleate, and ethylpropyl maleate.

The specific examples of maleic acid amides include maleic acid amide, N-methylmaleic acid amide, N-ethylmaleic acid amide, N-(n- or i-)propylmaleic acid amide, N-(n-, i-, sec- or t-)butylmaleic acid amide, N-benzylmaleic acid amide, N-hydroxyethylmaleic acid amide, N-phenylmaleic acid amide, N-tolylmaleic acid amide, N-(hydroxyphenyl)maleic acid amide, N-(sulfamoylphenyl)maleic acid amide, N-(phenylsulfonyl) maleic acid amide, N-(tolylsulfonyl)maleic acid amide, N,N-dimethylmaleic acid amide, N-methyl-N-phenylmaleic acid amide, N-hydroxyethyl-N-methylmaleic acid amide, N-methylmaleic acid monoamide, N-ethylmaleic acid monoamide, N,N-dimethylmaleic acid monoamide, N-methyl-N'-ethylmaleic acid amide, and N-methyl-N'-phenylmaleic acid amide.

The specific examples of maleic acid imides include maleic acid imide, N-methylmaleic acid imide, N-ethylmaleic acid imide, N-(n- or i-)propylmaleic acid imide, N-(n-, i-, sec- or t-)butylmaleic acid imide, N-benzylmaleic acid imide, N-hydroxyethylmaleic acid imide, N-phenylmaleic acid imide, N-tolylmaleic acid imide, N-(hydroxyphenyl)maleic acid imide, N-(sulfamoylphenyl)maleic acid imide, N-(phenylsulfonyl) maleic acid imide, and N-(tolylsulfonyl)maleic acid imide.

The specific examples of itaconates include dimethyl itaconate, diethyl itaconate, di-(n- or i-)propyl itaconate, di-(n-, i-, sec- or t-)butyl itaconate, diphenyl itaconate, diallyl itaconate, monomethyl itaconate, monoethyl itaconate, mono-(n- or i-)propyl itaconate, mono-(n-, i-, sec- or t-)butyl itaconate, dibenzyl itaconate, monobenzyl itaconate, methylethyl itaconate, methylpropyl itaconate and ethylpropyl itaconate.

The specific examples of itaconic acid amides include itaconic acid amide, N-methylitaconic acid amide, N-ethylitaconic acid amide, N-(n- or i-)propylitaconic acid amide, N-(n-, i-, sec- or t-)butylitaconic acid amide, N-benzylitaconic acid amide, N-hydroxyethylitaconic acid amide, N-phenylitaconic acid amide, N-tolylitaconic acid amide, N-(hydroxyphenyl)itaconic acid amide, N-(sulfamoylphenyl)itaconic acid amide, N-(phenylsulfonyl)itaconic acid amide, N-(tolylsulfonyl) itaconic acid amide, N,N-dimethylitaconic acid amide, N-methyl-N-phenylitaconic acid amide, N-hydroxyethyl-N-methylitaconic acid amide, N-methylitaconic acid monoamide, N-ethylitaconic acid monoamide, N,N-dimethylitaconic acid monoamide, N-methyl-N'-ethylitaconic acid amide, and N-methyl-N'-phenylitaconic acid amide.

The specific examples of itaconic acid imides include itaconic acid imide, N-methylitaconic acid imide, N-ethylitaconic acid imide, N-(n- or i-)propylitaconic acid imide, N-(n-, i-, sec- or t-)butylitaconic acid imide, N-benzylitaconic acid imide, N-hydroxyethylitaconic acid imide, N-phenylitaconic acid imide, N-tolylitaconic acid imide, N-(hydroxyphenyl)itaconic acid imide, N-(sulfamoylphenyl)itaconic acid imide, N-(phenylsulfonyl)itaconic acid imide, and N-(tolylsulfonyl)itaconic acid imide.

The specific examples of fumarates include dimethyl fumarate, diethyl fumarate, di-(n- or i-)propyl fumarate, di-(n-, i-, sec- or t-)butyl fumarate, diphenyl fumarate, diallyl fumarate, monomethyl fumarate, monoethyl fumarate, mono-(n- or i-)propyl fumarate, mono-(n-, i-, sec- or t-)butyl fumarate, dibenzyl fumarate, monobenzyl fumarate, methylethyl fumarate, methylpropyl fumarate, and ethylpropyl fumarate.

The specific examples of fumaric acid amides include fumaric acid amide, N-methylfumaric acid amide, N-ethylfumaric acid amide, N-(n- or i-)propylfumaric acid amide, N-(n-, i-, sec- or t-)butylfumaric acid amide, N-benzylfumaric acid amide, N-hydroxyethylfumaric acid amide, N-phenylfumaric acid amide, N-tolylfumaric acid amide, N-(hydroxyphenyl)fumaric acid amide, N-(sulfamoylphenyl)fumaric acid amide, N-(phenylsulfonyl)fumaric acid amide, N-(tolylsulfonyl) fumaric acid amide, N,N-dimethylfumaric acid amide, N-methyl-N-phenylfumaric acid amide, N-hydroxyethyl-N-methylfumaric acid amide, N-methylfumaric acid monoamide, N-ethylfumaric acid monoamide, N,N-dimethylfumaric acid monoamide, N-methyl-N'-ethylfumaric acid amide, and N-methyl-N'-phenylfumaric acid amide.

The specific examples of mesaconates include dimethyl mesaconate diethyl mesaconate, di-(n- or i-)propyl mesaconate, di-(n-, i-, sec- or t-)butyl mesaconate, diphenyl mesaconate, diallyl mesaconate, monomethyl mesaconate, monoethyl mesaconate, mono-(n- or i-)propyl mesaconate, mono-(n-, i-, sec- or t-)butyl mesaconate, dibenzyl mesaconate, monobenzyl mesaconate, methylethyl mesaconate, methylpropyl mesaconate, and ethylpropyl mesaconate.

The specific examples of mesaconic acid amides include mesaconic acid amide, N-methylmesaconic acid amide, N-ethylmesaconic acid amide, N-(n- or i-)propylmesaconic acid amide, N-(n-, i-, sec- or t-)butylmesaconic acid amide, N-benzylmesaconic acid amide, N-hydroxyethylmesaconic acid amide, N-phenylmesaconic acid amide, N-tolylmesaconic acid amide, N-(hydroxyphenyl) mesaconic acid amide, N-(sulfamoylphenyl)mesaconic acid amide, N-(phenylsulfonyl)mesaconic acid amide, N-(tolylsulfonyl)mesaconic acid amide, N,N-dimethylmesaconic acid amide, N-methyl-N-phenylmesaconic acid amide, N-hydroxyethyl-N-methylmesaconic acid amide, N-methylmesaconic acid monoamide, N-ethylmesaconic acid monoamide, N,N-dimethylmesaconic acid monoamide, N-methyl-N'-ethylmesaconic acid amide, and N-methyl-N'-phenylmesaconic acid amide.

The specific examples of styrenes include styrene, methylstyrene, dimethylstyrene, trimethylstyrene, ethylsytrene, propylstyrene, cyclohexylstyrene, chloromethylsytrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene, and sodium 4-vinylbenzenesulfonate.

As the specific examples of α,β-unsaturated lactones, the following compounds can be exemplified.

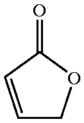
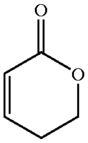
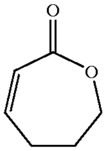
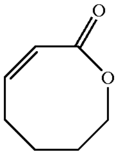
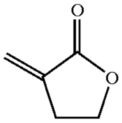
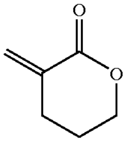
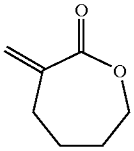
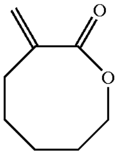
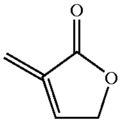
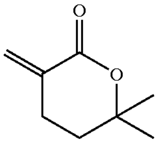
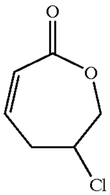
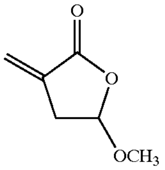
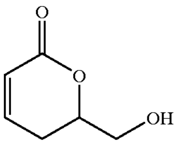
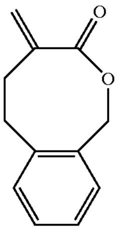
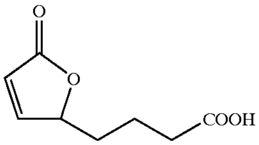

-continued

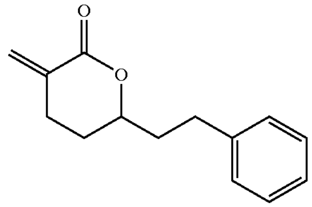
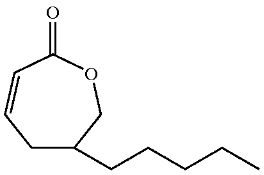
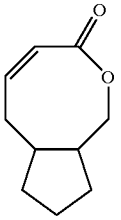

As the specific examples of α,β-unsaturated lactams, the following compounds can be exemplified.

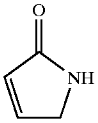
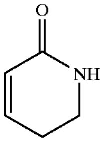
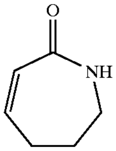
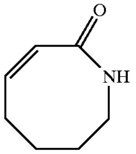
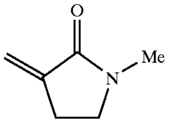
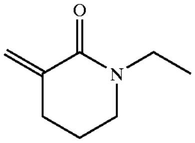
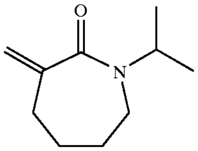
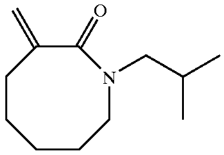
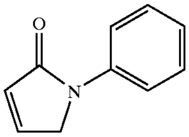
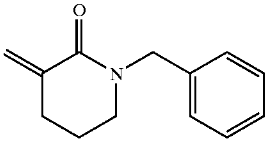
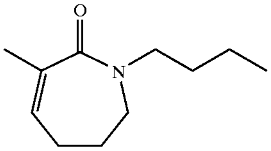
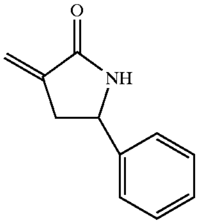
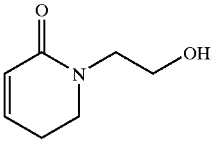
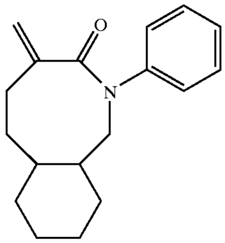

-continued

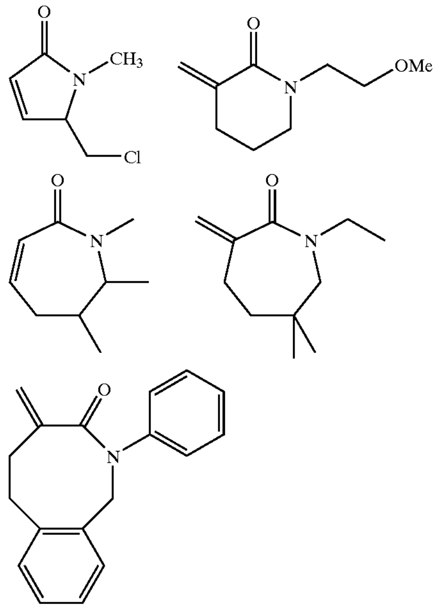

As the specific examples of unsaturated hydrocarbons, the following compounds can be exemplified.

$H_2C{=}CH_2$ $H_2C{=}CHCH_3$ $HC{\equiv}CH$ $HC{=}CCH_3$

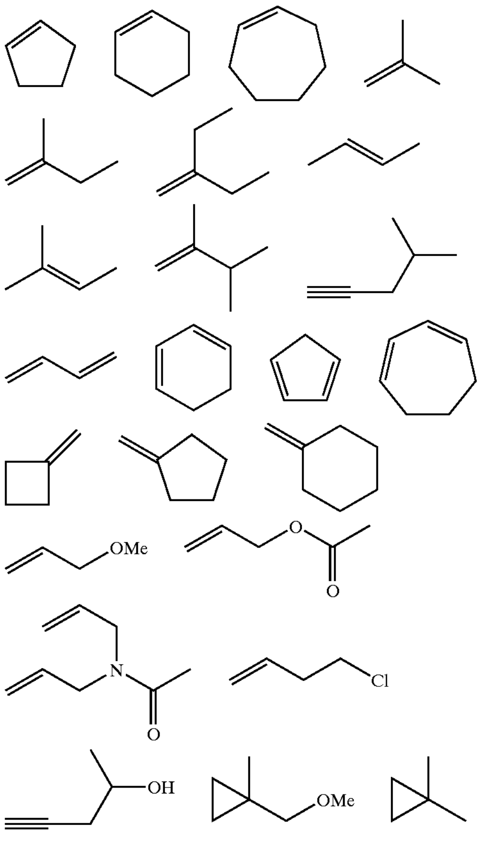

As the specific examples of vinyl ethers, the following compounds can be exemplified.

$H_2C{=}CHOCH_3$ $H_2C{=}CHOCH_2CH_3$

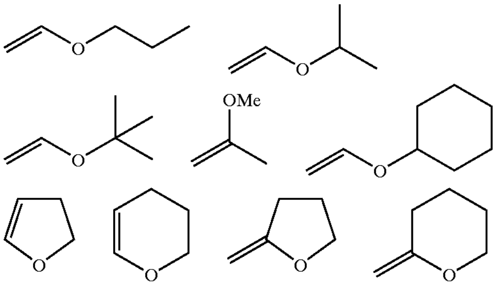

As the specific examples of vinyl esters, the following compounds can be exemplified.

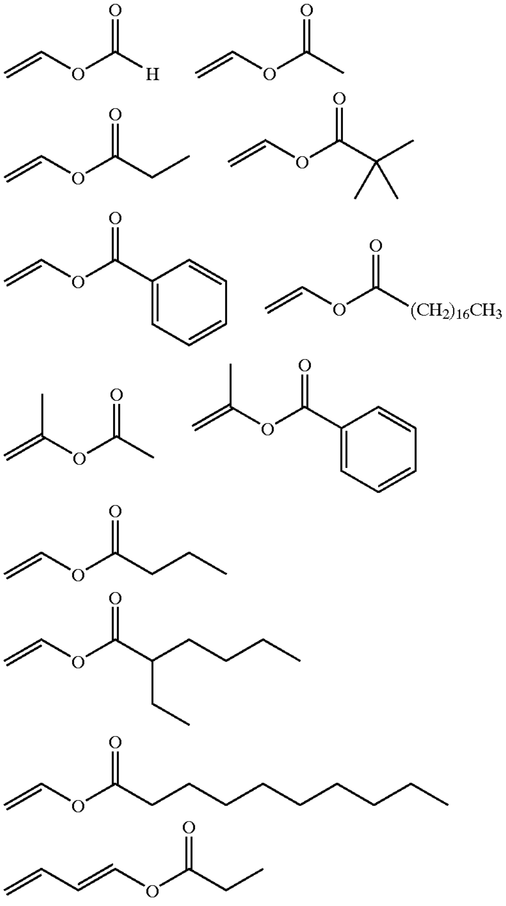

As the specific examples of α,β-unsaturated ketones, the following compounds can be exemplified.

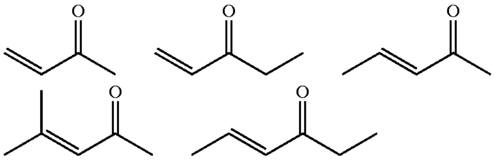

-continued

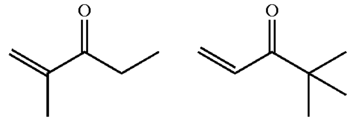

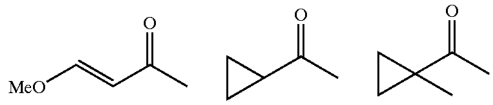

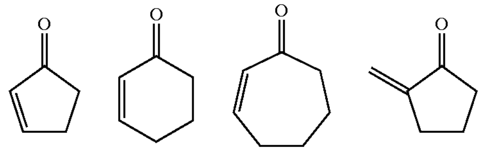

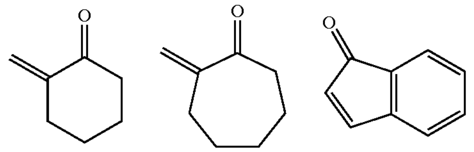

The proportion of the monomers having a hydrophobic functional group which is used for synthesizing the positive polarity conversion high molecular compound having a hydrophobic functional group which is converted into hydrophilic by heat is preferably 5 wt % or more, more preferably from 10 to 95 wt %. When the proportion of the monomer is less than 5 wt %, the positive polarity conversion high molecular compound is not converted into hydrophilic, even when the hydrophobic functional group on the side chain is converted into hydrophilic. As a result, a non-image area is stained. Further, when the above-described other monomers are used in the synthesis of the positive polarity conversion high molecular compound for use in the present invention, the proportion of copolymerizable other monomers is not particularly restricted as long as the monomer having a specific functional group is used in a preferred amount. These copolymerizable other monomers may be used alone or two or more of the monomers may be used as mixture.

The specific examples of the positive polarity conversion high molecular compounds having the hydrophobic functional group are shown below but the present invention is not limited thereto.

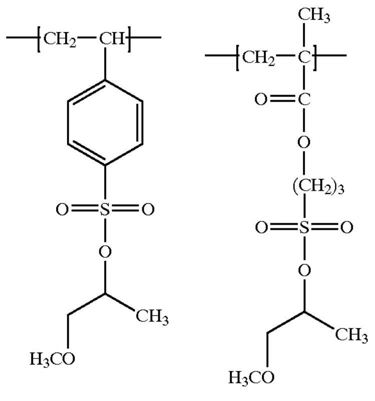

-continued

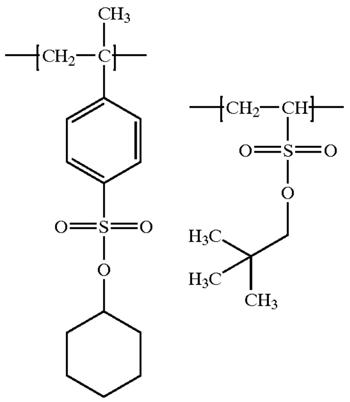

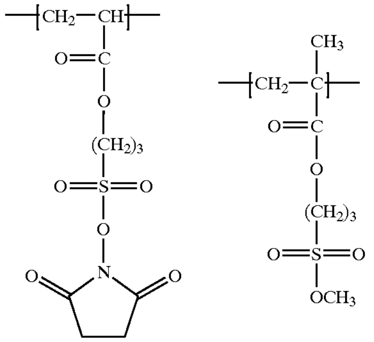

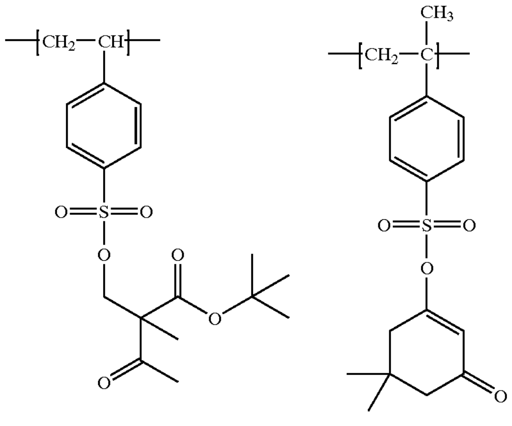

-continued
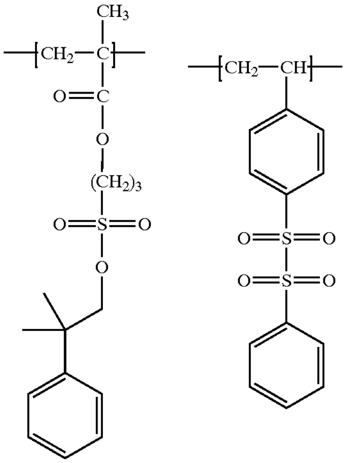
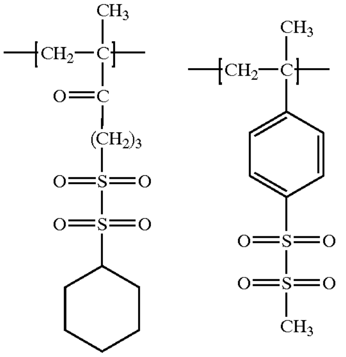
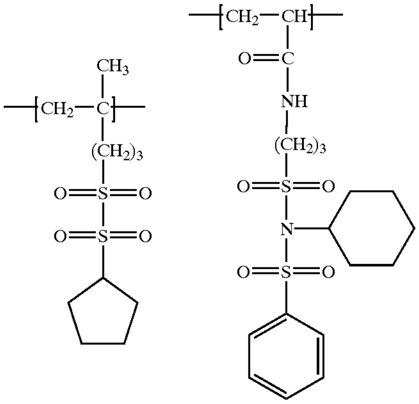
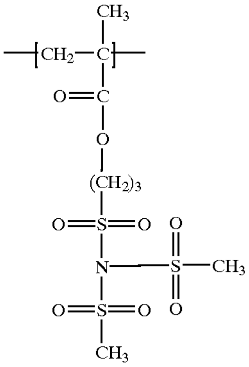
-continued
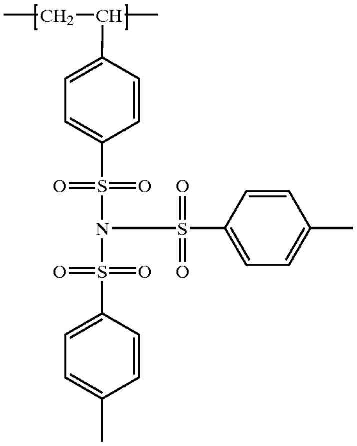
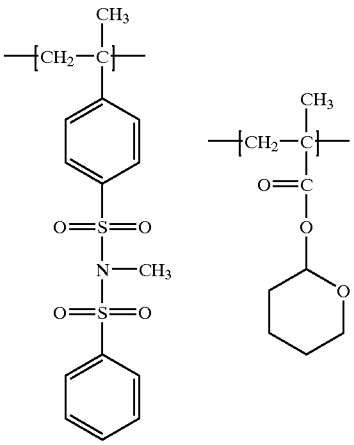
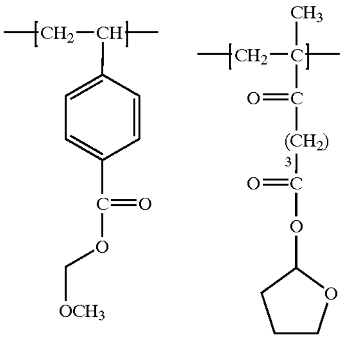
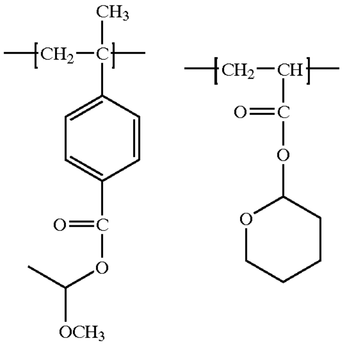

-continued

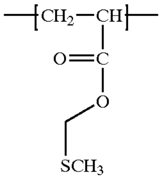

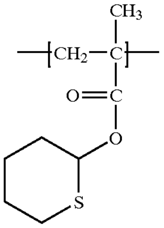

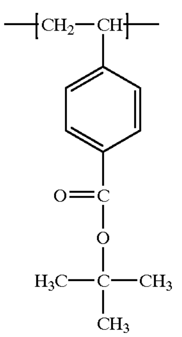

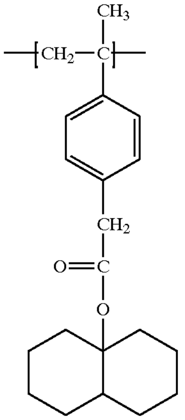

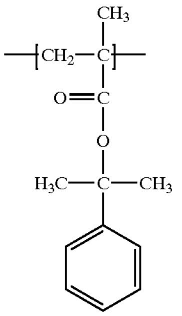

The polarity conversion high molecular compounds for use in the lithographic printing plate precursor of the present invention preferably have a weight average molecular weight measured by GPC of preferably 2,000 or more, more preferably from 5,000 to 300,000, and a number average molecular weight of preferably 800 or more, more preferably from 1,000 to 250,000. The degree of polydispersion (a weight average molecular weight/a number average molecular weight) of the polarity conversion high molecular compounds is preferably 1 or more, more preferably from 1.1 to 10.

These polarity conversion high molecular compounds may be any of a random polymer, a block polymer and a graft polymer but a random polymer is preferred.

As the solvents which are used for synthesizing the polarity conversion high molecular compound of the present invention, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, and water can be exemplified. These solvents may be used alone or two or more of the solvents may be used as mixture.

Well-known compounds such as azo-series initiators and peroxide initiators can be used as the radical polymerization initiator for the synthesis of the polarity conversion high molecular compound for use in the present invention.

When the polarity conversion high molecular compound as described above is contained in an image-forming layer, the polarity conversion high molecular compound may be used alone or two or more of the compounds may be used as mixture.

The proportion of the polarity conversion high molecular compound contained in an image-forming layer is preferably 40 wt % or more, more preferably 50 wt % or more. When the content is less than 40 wt %, the image strength becomes poor and the press life is deteriorated.

In the next place, as the hydrophobic high molecular compounds converted into hydrophilic by heat for use in the image-forming layer of the present invention, resins soluble in an alkali aqueous solution which can be preferably used similarly to the above-described positive polarity conversion high molecular compounds are described below.

[Resin Soluble in Alkali Aqueous Solution]

An alkali aqueous solution-soluble high molecular compound (b) for use in the present invention is a compound having an acid radical structure as shown below on the main chain or side chain of a high molecular compound:

A phenolic hydroxyl group (—Ar—OH), a carboxylic acid group (—$CO_2H$), a sulfonic acid group (—$SO_3H$), a phosphoric acid group (—$OPO_3H$), a sulfonamido group (—$SO_2NH$—R), a substituted sulfonamido-series group (an active imido group) (—$SO_2NHCOR$, —$SO_2NHSO_2R$, —$CONHSO_2R$), wherein Ar represents a divalent aryl group which may have a substituent, and R represents a hydrocarbon group which may have a substituent.

Of these, preferred acid radicals are (b-1) a phenolic hydroxyl group, (b-2) a sulfonamido group, and (b-3) an active imido group, and an alkali aqueous solution-soluble resin having (b-1) a phenolic hydroxyl group (hereinafter referred to as "a resin having a phenolic hydroxyl group") can be most preferably used.

As the high molecular compounds having (b-1) a phenolic hydroxyl group, novolak resins, e.g., a condensed polymer of phenol and formaldehyde (hereinafter referred to as "a phenol/formaldehyde resin"), a condensed polymer of m-cresol and formaldehyde (hereinafter referred to as "an m-cresol/formaldehyde resin"), a condensed polymer of p-cresol and formaldehyde, a condensed polymer of m-/p-mixed cresol and formaldehyde, and a condensed polymer of phenol, cresol (m-, p-, or m-/p-mixed) and formaldehyde, and a condensed polymer of pyrogallol and acetone can be exemplified. Further, copolymers obtained by copolymerizing monomers having a phenol group on the side chain can also be used. As such monomers having a phenol group, acrylamide, methacrylamide, acrylic ester, methacrylic ester and hydroxystyrene each having a phenol group can be exemplified.

Specifically, N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate can be preferably used.

In view of the image-forming property, these resins preferably have a weight average molecular weight of from $5.0\times10^2$ to $2.0\times10^4$ and a number average molecular weight of from $2.0\times10^2$ to $1.0\times10^4$. These resins may be used alone or in combination of two or more.

When they are used in combination, as disclosed in U.S. Pat. No. 4,123,279, a condensed polymer of phenol and formaldehyde having an alkyl group having from 3 to 8 carbon atoms as a substituent, e.g., a condensed polymer of t-butyl-phenol and formaldehyde, and a condensed polymer of octylphenol and formaldehyde can be used in combination.

It is preferred that these resins having a phenolic hydroxyl group have a weight average molecular weight of from 500 to 20,000 and a number average molecular weight of from 200 to 10,000.

As the alkali aqueous solution-soluble high molecular compound having (b-2) a sulfonamido group, a high molecular compound which can be obtained by homopolymerizing a polymerizable monomer having (b-2) a sulfonamido group which is a primary monomer constituting this high molecular compound, and a high molecular compound which can be obtained by copolymerizing a polymerizable monomer having (b-2) a sulfonamido group with other polymerizable monomer can be exemplified. As the polymerizable monomer having a sulfonamido group, monomers comprising low molecular compounds having, in one molecule, one or more of a sulfonamido group —NH—$SO_2$— in which at least one hydrogen atom is bonded to the nitrogen atom, and a polymerizable unsaturated bond respectively can be exemplified. Of these monomers, low molecular compounds having an acryloyl group, an allyl group or a vinyloxy group, and a substituted or mono-substituted aminosulfonyl group or a substituted sulfonylimino group are preferred.

As such a compound, e.g., the compounds represented by the following formulae (11) to (15) can be exemplified.

(11)

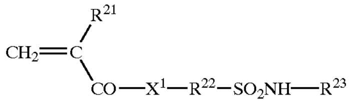

(12)

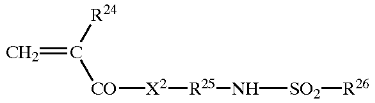

(13)

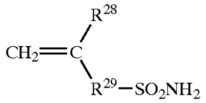

(14)

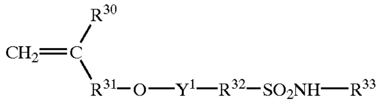

(15)

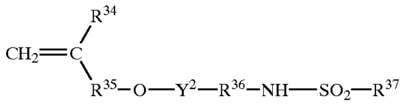

wherein $X^1$ and $X^2$ each represents —O— or —$NR^{27}$—; $R^{21}$ and $R^{24}$ each represents a hydrogen atom or —$CH_3$; $R^{22}$, $R^{26}$, $R^{29}$, $R^{32}$ and $R^{36}$ each represents an alkylene group having from 1 to 12 carbon atoms which have a substituent, a cycloalkylene group, an arylene group, or an aralkylene group; $R^{23}$, $R^{27}$ and $R^{33}$ each represents a hydrogen atom, an alkyl group having from 1 to 12 carbon atoms which may have a substituent, a cycloalkyl group, an aryl group, or an aralkyl group; $R^{26}$ and $R^{27}$ each represents an alkyl group having from 1 to 12 carbon atoms which may have a substituent, a cycloalkyl group, an aryl group, or an aralkyl group; $R^{28}$, $R^{30}$ and $R^{34}$ each represents a hydrogen atom or —$CH_3$; $R^{31}$ and $R^{35}$ each represents an alkylene group having from 1 to 12 carbon atoms which may have a single bond or a substituent, a cycloalkylene group, an arylene group, or an aralkylene group; and $Y^1$ and $Y^2$ each represents a single bond or —CO—.

Specifically, m-aminosulfonylphenyl methacrylate, N-(p-aminosulfonylphenyl)methacrylamide, and N-(p-aminosulfonylphenyl)acrylamide can be preferably used as such monomers.

In the case of an alkali aqueous solution-soluble high molecular compound having (b-3) an active imido group, the compound has the active imido group represented by the formula shown below in the molecule. As the monomer having (b-3) an active imido group which is a primary monomer constituting this high molecular compound, high molecular compounds which can be obtained by copolymerizing monomers comprising low molecular weight compounds having, in one molecule, one or more of the imino group represented by the following formula and a polymerizable unsaturated bond respectively can be exemplified.

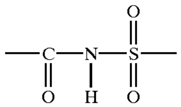

As the specific examples of such compounds, N-(p-toluenesulfonyl)methacrylamide and N-(p-toluenesulfonyl)acrylamide can be preferably used.

The monomers having acid radicals (b-1), (b-2) and (b-3) in the alkali aqueous solution-soluble polymers usable in the present invention need not be one kind, and those obtained by copolymerizing two or more monomers having the same acid radical and two or more monomers having different acid radicals can be used.

Well-known copolymerization such as graft copolymerization, block copolymerization and random copolymerization can be used for copolymerization.

It is preferred that the above copolymers contain 10 mol % or more of the monomers having acid radicals (b-1) to (b-3) as the copolymer components, more preferably 20 mol % or more. When the content of the copolymer components is less than 10 mol %, the interaction with a resin containing a phenolic hydroxyl group is insufficient, as a result, the improving effect of development latitude, which is the advantage of using the copolymer components, becomes unsatisfactory.

Other copolymer components may be contained in the copolymers besides the monomers having acid radicals (b-1) to (b-3).

As other copolymer components, e.g., monomers of the following (1) to (12) can be exemplified.

(1) Acrylates and methacrylates having an aliphatic hydroxyl group, e.g., 2-hydroxyethyl acrylate and 2-hydroxyethyl methacrylate.

(2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(4) Acrylamide or methacrylamide, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(5) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters, e.g., vinyl acetate, vinyl chloroacetate, vinyl butyrate, and vinyl benzoate.

(7) Styrenes, e.g., styrene, α-methylstyrene, methylstyrene, and chloromethylstyrene.

(8) Vinyl ketones, e.g., methyl vinyl ketone, ethyl vinyl ketone, propyl vinyl ketone, and phenyl vinyl ketone.

(9) Olefins, e.g., ethylene, propylene, isobutylene, butadiene, and isoprene.

(10) N-vinylpyrrolidone, N-vinylcarbazole, 4-vinylpyridine, acrylonitrile, and methacrylonitrile.

(11) Unsaturated imide, e.g., maleimide, N-acryloylacrylamide, N-acetylmethacrylamide, N-propionylmethacrylamide, and N-(p-chlorobenzoyl) methacrylamide.

(12) Unsaturated carboxylic acids, e.g., acrylic acid, methacrylic acid, maleic anhydride, and itaconic acid.

From the viewpoint of film strength, it is preferred that the alkali aqueous solution-soluble high molecular compounds in the present invention have a weight average molecular weight of 2,000 or more and a number average molecular weight of 500 or more, more preferably a weight average molecular weight of from 5,000 to 300,000 and a number average molecular weight of from 800 to 250,000, and degree of polydispersion (a weight average molecular weight/a number average molecular weight) of from 1.1 to 10, no matter whether it is homopolymer or copolymer.

In the above-described copolymers, the compounding ratio by weight of the monomers having acid radicals of (b-1) to (b-3) to other monomers is preferably within the range of from 50/50 to 5/95, more preferably from 40/60 to 10/90, in view of development latitude.

These high molecular compounds soluble in an alkali aqueous solution may be used alone or may be comprised of two or more in combination, and the addition amount of the high molecular compound is from 30 to 99 wt % of the entire solid contents of the image-forming layer, preferably from 40 to 95 wt %, and particularly preferably from 50 to 90 wt %. When the addition amount of the alkali-soluble high molecular compound is less than 30 wt %, the durability of the image-forming layer is deteriorated, on the other hand when it exceeds 99 wt %, the sensitivity and durability are both disadvantageously lowered.

[Solid Particles]

Besides the light-to-heat converting agents, solid particles may be added to the image-forming layer of the present invention. As such solid particles, particles which can not only accelerate the removal of the image-forming layer but also efficiently utilize the heat generated in the image-forming layer by varying the distribution of heat conductivity are preferably used. Inorganic particles, organic particles and metallic particles are exemplified as such solid particles.

As such inorganic particles, e.g., metallic oxides, such as zinc oxide, titanium dioxide, iron oxide, and zirconia; silicon-containing oxides which themselves do not have absorption in the visible region and called white carbon, such as silicic anhydride, hydrated calcium silicate, and hydrated aluminum silicate; and clay mineral particles, such as clay, talc, kaolin and zeolite can be used.

Further, as metallic particles, e.g., aluminum, copper, nickel, silver and iron can be used. The inorganic particles and the metallic particles have an average particle size of 10 μm or less, preferably from 0.01 to 10 μm, and more preferably from 0.1 to 5 μm.

When the average particle size of inorganic particles and metallic particles is less than 0.01 μm, the removing property of the image-forming layer and the variation of the distribution of heat conductivity are improved only to bring poor results. While when the average particle size is more than 10 μm, the definition of the printed matters becomes worse, and the adhesion of the image-forming layer to the support becomes extremely worse, as a result the strength of the image area lowers.

The content of inorganic particles and metallic particles is not limited as long as other components are contained in appropriate amounts, but the content is preferably from 2 to 90 wt % to the entire solid contents in the image-forming layer, more preferably 5 to 80 wt %. When the content of these particles is less than 2 wt %, the removing property of the image-forming layer and the variation of the distribution of heat conductivity are improved only to bring poor results, while when it exceeds 90 wt %, the definition of the printed matters becomes worse, and the adhesion of the image-forming layer to the support becomes extremely worse, as a result the strength of the image area lowers.

Besides inorganic particles and metallic particles, organic particles can also be used as particulate matter. Organic particles are not especially restricted as long as they can improve the removing property of the image-forming layer and efficiently utilize the heat generated in the image-forming layer by varying the distribution of heat conductivity, but resin particles can be used as organic particles. It is necessary to pay attention to the following facts when resin particles are used. That is, when a solvent is used for dispersing resin particles, resin particles which are not dissolved in the solvent should be selected, or a solvent which does not dissolve the resin particles should be selected. Further, when resin particles are dispersed by a thermoplastic polymer and heat, resin particles which do not melt, do deform and do not decompose by the heat of dispersion should be selected.

For mitigating these points, crosslinked resin particles can be preferably used. Organic particles have an average particle diameter of from 0.01 to 10 μm, preferably from 0.05 to 10 μm, and more preferably from 0.1 to 5 μm. When the average particle diameter of organic particles is less than 0.01 μm, the removing property of the image-forming layer and the variation of the distribution of heat conductivity are improved only to bring poor results, while when it exceeds 10 μm, the definition of the printed matters becomes worse, and the adhesion of the image-forming layer to the support becomes extremely worse, resulting in the deterioration of the strength of the image area.

The content of organic particles is not limited as long as other components are contained in appropriate amounts, but the content is preferably from 2 to 90 wt % to the entire solid contents in the image-forming layer, more preferably 5 to 80 wt %. When the content of the particles is less than 2 wt %, the removing property of the image-forming layer and the variation of the distribution of heat conductivity are improved only to bring poor results, while when it exceeds 90 wt %, the definition of the printed matters becomes worse, and the adhesion of the image-forming layer to the support becomes extremely worse, as a result the strength of the image area lowers.

As organic particles, polystyrene particles (particle size: from 4 to 10 μm) and silicone resin particles (particle size: from 2 to 4 μm) are exemplified. As crosslinked resin particles, e.g., microgels (particle size: from 0.01 to 1 μm) comprising two or more ethylenic unsaturated monomers, crosslinked resin particles (particle size: from 4 to 10 μm) comprising styrene and divinylbenzene, and crosslinked resin particles (particle size: from 4 to 10 μm) comprising methyl methacrylate and diethylene glycol dimethacrylate, i.e., microgels of acrylate resins, crosslinked polystyrene and crosslinked methyl methacrylate can be exemplified. These organic particles are prepared by general methods, e.g., an emulsion polymerization method, a soap-free emulsion polymerization method, a seed emulsion polymerization method, a dispersion polymerization method, and a suspension polymerization method.

It is also possible to prepare inorganic particles from a solution. For example, by adding a metallic lower alkoxide to a solvent, e.g., ethanol, in the presence of water and an acid or an alkali, inorganic particles containing the metal are obtained. An inorganic particle dispersion solution can be obtained by adding the thus-obtained inorganic particle solution to a solvent-soluble thermoplastic polymer solution. Alternatively, by adding a metallic lower alkoxide to a thermoplastic polymer solution in advance and then adding water and an acid or an alkali, an inorganic particle dispersion solution containing the metal can be obtained.

When inorganic particles are prepared by adding a metallic lower alkoxide to a solution of thermoplastic polymer precursor, a composite of the polymer and inorganic particles is obtained when the polymer precursor is made thermoplastic polymer by heat. As metallic lower alkoxide, tetraethoxysilane and tetraethoxytitanium can be used.

[Surfactant]

Surfactants can be added to the image-forming layer of the lithographic printing plate precursor of the present invention for widening the stability to printing conditions, e.g., nonionic surfactants as disclosed in JP-A-62-251740 and JP-A-3-208514 (the term "JP-A" as used herein means an "unexamined published Japanese patent application"), and ampholytic surfactants as disclosed in JP-A-59-121044 and JP-A-4-13149 can be added.

The specific examples of nonionic surfactants include sorbitan tristearate, sorbitan monopalmitate, sorbitan trioleate, stearic acid monoglyceride, polyoxyethylenenonylphenyl ether, etc.

The specific examples of ampholytic surfactants include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine type (e.g., Amorgen K, trade name, manufactured by Daiichi Kogyo Seiyaku Co., Ltd.).

The proportion of the above-described nonionic and ampholytic surfactants contained in the total solid contents in the image-forming layer is preferably from 0.05 to 15 wt %, more preferably from 0.1 to 5 wt %.

Other Constitutional Components

Plasticizers are added to the image-forming layer of the lithographic printing plate precursor according to the present invention for improving the flexibility of the film, if necessary, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid can be used.

The image-forming layer of the lithographic printing plate precursor according to the present invention can be generally prepared by dissolving the above-described each component in a solvent and coating the coating solution on an appropriate support and, if necessary, performing various treatments, e.g., hydrolysis of acids, hydrolysis of bases, thermal decomposition, photo-decomposition, oxidation and reduction. The examples of the solvents used include tetrahydrofuran, ethylene dichloride, cyclohexanone, methyl ethyl ketone, acetone, methanol, ethanol, propanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, dimethoxyethane, N,N-dimethylformamide, N,N-dimethylacetanhide, toluene, ethyl acetate, ethyl lactate, methyl lactate, dimethyl sulfoxide, water, sulfolane and γ-butyrolactone, but solvents are not limited thereto.

These solvents are used alone or as mixture. When a coating solution is prepared, the concentration of the above constitutional components of the image-forming layer (total solid contents inclusive of additives) in a solvent is preferably from 1 to 50 wt %.

Various coating methods can be used, e.g., bar coating, rotary coating, spray coating, curtain coating, dip coating, air knife coating, blade coating, and roll coating can be used.

Surfactants, e.g., fluorine surfactants disclosed in JP-A-62-170950, can be added to the image-forming layer of the lithographic printing plate precursor according to the present invention for improving coating property. Addition amount is preferably from 0.01 to 1 wt %, more preferably from 0.05 to 0.5 wt %, of the total solid contents of the image-forming layer.

The coating amount of the image-forming layer obtained after coating and drying (solid contents) varies according to purposes, but the coating amount of a general lithographic printing plate precursor is generally from 0.1 to 5.0 $g/m^2$, preferably from 0.2 to 2.5 $g/m^2$, and more preferably from 0.5 to 2.0 $g/m^2$.

[Support]

A support (a substrate) for use in a lithographic printing plate precursor, on which an image-forming layer is coated, is a plate having dimensional stability, and any of well-known supports so far been used as support of printing plates can be preferably used. The examples of such supports include paper; paper laminated with plastics (e.g., polyethylene, polypropylene, polystyrene); metal plates, e.g., aluminum (including aluminum alloys), zinc, iron and copper; plastic films, e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal; and paper or plastic films laminated or deposited with metals as above; and an aluminum plate is particularly preferably used. Aluminum plates include a pure aluminum plate and an aluminum alloy plate. Various aluminum alloys can be used, e.g., alloys of aluminum with metals such as silicon, copper, manganese, magnesium, chromium, zinc, lead, bismuth, or nickel. It is admitted that these alloy compositions include a negligible amount of impurities in addition to a certain amount of iron and titanium.

A support is subjected to surface treatment, if necessary. For example, in case of preparing a lithographic printing plate precursor, the surface of the support is subjected to hydrophilization treatment prior to coating of an image-forming layer.

In case of a metal support, in particular, a support having an aluminum surface, it is preferred to perform surface treatment such as surface graining treatment, immersion treatment in an aqueous solution of sodium silicate, potassium fluorozirconate, or phosphate, or anodizing treatment. Further, as disclosed in U.S. Pat. No. 2,714,066, an aluminum plate subjected to immersion treatment in an aqueous solution of sodium silicate after surface graining treatment, or an aluminum plate subjected to immersion treatment in an aqueous solution of alkali metal silicate after anodizing treatment as disclosed in U.S. Pat. No. 3,181,461 are also preferably used. Anodizing treatment is carried out by turning on electricity with the aluminum plate being the anode in an electrolytic solution comprising alone or combination of two or more of an aqueous solution or nonaqueous solution of an inorganic acid such as phosphoric acid, chromic acid, sulfuric acid or boric acid, or an organic acid such as oxalic acid or sulfamic acid, or salts of these acids.

Electrodeposition of silicate as disclosed in U.S. Pat. No. 3,658,662 is also useful surface treatment.

These hydrophilization treatments are conducted for preventing harmful reactions of a support with the layer provided on the support, or for improving the adhesion of the support with the image-forming layer, besides making the support surface hydrophilic.

Prior to surface roughening of an aluminum plate by graining, if desired, the surface of an aluminum plate may be subjected to pre-treatment to remove a rolling oil from the plate surface or to expose clean aluminum plate surface. In general, solvents such as Triclene and surfactants are used in degreasing treatment for removing a rolling oil, and alkali etching agents, e.g., sodium hydroxide and potassium hydroxide are widely used for exposing clean surface.

As surface graining methods, any of mechanical, chemical and electrochemical methods can be used. Mechanical methods include a ball abrading method, a blasting method, and a brushing method of rubbing water dispersion slurry of an abrasive such as pumice on the surface of a plate with a nylon brush. As a chemical method, a method of immersing a plate in a saturated aqueous solution of an aluminum salt of mineral acid as disclosed in JP-A-54-31187 is preferred, and as an electrochemical method, a method of performing alternating current electrolysis in an acid electrolytic solution of hydrochloric acid, nitric acid or combination of these acids can be exemplified as preferred method. Of these surface roughening methods, a method of combining mechanical roughening with electrochemical roughening as disclosed in JP-A-55-137993 is preferred because strong adhesion of an image-forming layer to the support can be obtained.

Surface graining as described above is preferably performed so as to reach the central line surface roughness (Ra) of the surface of an aluminum plate of from 0.3 to 1.0 $\mu$m.

The aluminum plate thus surface treated is subjected to washing and chemical etching, if necessary.

An etching solution is generally selected from among aqueous solutions of base or acid for dissolving aluminum. In this case, an etching solution is selected such that a film different from the aluminum derived from the ingredients of the etching solution is not formed on the etched surface. The examples of preferred etching agent include, as basic substances, sodium hydroxide, potassium hydroxide, trisodium phosphate, disodium phosphate, tripotassium phosphate, and dipotassium phosphate; and as acid substances, sulfuric acid, persulfuric acid, phosphoric acid, hydrochloric acid and salts of these acids. Salts of metals having a lower tendency to ionization than that of aluminum, e.g., zinc, chromium, cobalt, nickel, and copper are not preferred because they form unnecessary films on the etched surface.

The concentration and temperature of these etching agents are most preferably set up such that the dissolution rate of the aluminum or alloy to be used falls within the range of from 0.3 to 40 g/m$^2$ per immersion time of 1 minute, but the dissolution rate may be lower than or higher than the above range.

Etching is performed by immersing an aluminum plate in the above etching solution or coating the etching solution on the aluminum plate, and the etching is preferably carried out so that the amount of etching becomes from 0.5 to 10 g m$^2$.

Since the etching speed is fast with the above etching agents, it is preferred to use a basic aqueous solution. In this case, as smutting is generated, desmutting treatment is generally performed. As acids for use in desmutting treatment, nitric acid, sulfuric acid, phosphoric acid, chromic acid, hydrofluoric acid, and borofluoric acid are used.

The etching-treated aluminum plate is subjected to washing and anodizing, if necessary. Anodization can be effected by methods so far been used in this field. Specifically, by applying a direct or alternating electric current to an aluminum plate in an aqueous solution or nonaqueous solution comprising single or combination of two or more of sulfuric acid, phosphoric acid, chromic acid, oxalic acid, sulfamic acid, or benzenesulfonic acid, an anodic oxide film can be formed on the surface of the aluminum support.

Treatment conditions of anodization cannot be determined unconditionally as conditions fluctuate variously depending upon the electrolytic solution to be used, but generally appropriately the concentration of an electrolytic solution is from 1 to 80 wt %, the temperature of an electrolytic solution is from 5 to 70° C., electric current density is from 0.5 to 60 ampere/dm$^2$, voltage is from 1 to 100 V, and electrolytic time is from 30 seconds to 5 minutes.

Of these anodizing treatments, a method of effecting anodization in sulfuric acid at high electric current density as disclosed in British Patent 1,412,768, and a method of effecting anodization with phosphoric acid as the electrolytic bath as disclosed in U.S. Pat. No. 3,511,661 are particularly preferred.

The thus surface roughened and anodized aluminum plate may be hydrophilized, if necessary. As preferred examples of hydrophilization treatments, there are methods of treatment with alkali metal silicate, e.g., an aqueous solution of sodium silicate as disclosed in U.S. Pat. Nos. 2,714,066 and 3,181,461, treatment with potassium fluorozirconate as disclosed in JP-B-36-22063 (the term "JP-B" as used herein means an "examined Japanese patent publication"), and with polyvinylsulfonic acid as disclosed in U.S. Pat. No. 4,153, 461.

[Other Layer]

The back surface of a support is provided with a back coating layer, if necessary. Coating layers comprising a metallic oxide obtained by hydrolyzing and polycondensing the organic high molecular compounds disclosed in JP-A-5-45885 and the organic or inorganic metallic compounds disclosed in JP-A-6-35174 are preferably used as such a back coating layer.

Of these coating layers, alkoxyl compounds of silicon such as $Si(OCH_3)_4$, $Si(OC_2H_5)_4$, $Si(OC_3H_7)_4$, $Si(OC_4H_9)_4$ are inexpensive and easily available, and coating layers of the metallic oxides obtained from these compounds are excellent in hydrophilic property and particularly preferred.

Plate-Making Method

The method of making a lithographic printing plate from the lithographic printing plate precursor according to the present invention will be described. Heat-sensitive recording is performed directly imagewise on the lithographic printing plate precursor by means of a thermal recording head, or recording is effected by imagewise exposure with light.

As the light sources of actinic rays for use in image exposure, e.g., a mercury lamp, a metal halide lamp, a xenon lamp, a chemical lamp, and a carbon arc lamp are used. Radiations include electron beams, X-rays, ion beams, and far infrar rays. Further, g-rays, i-rays, Deep-UV rays, high density energy beams (laser beams) are also used. As laser beams, a helium-neon laser, an argon laser, a krypton laser, a helium-cadmium laser, a KrF excimer laser, a solid state laser and a semiconductor laser can be used.

A solid state laser and a semiconductor laser emitting infrared rays of the wavelength of from 760 to 1,200 nm are particularly preferably used in the present invention.

After image recording by the above method, the lithographic printing plate precursor of the present invention undergoes development with a developing solution, further, if necessary, subjected to gumming and burning treatment, and then mounted on a printing machine and printing can be effected. Further, the lithographic printing plate precursor of the present invention can be mounted on printing machine immediately after image recording to perform printing without undergoing a development process. In this case, the heated area or exposed area is swollen by a fountain solution and the swollen part is removed at initial stage of printing, thereby a lithographic printing plate is formed. That is, in the plate-making method using the lithographic printing plate precursor according to the present invention, plate-making can be effected without undergoing development and other treatments.

In recent years, an automatic processor is used prevailingly in the plate-making/printing industry for the purpose of rationalization and standardization of plate-making work. Such an automatic processor generally comprises a development part and a post-treatment part and equipped with a unit for conveying a printing plate, processing solution tanks, and spraying unit. Development is effected by spraying each processing solution pumped up to an exposed printing plate by means of a spray nozzle while conveying the printing plate horizontally. A method of development processing an exposed printing plate by conveying the printing plate with being immersed in a processing solution tank filled with a processing solution by means of guide roll-in-liquid is also known. In such automatic processing, processing can be effected with replenishing each replenisher to each processing solution corresponding to the processing amount and the operating time.

Moreover, a nonreturnable system in which processing is performed with substantially a virgin solution is also applicable to the lithographic printing plate precursor of the present invention.

When the image-recorded lithographic printing plate precursor of the present invention is development processed with an automatic processor as described above, an aqueous solution (a replenisher) having high alkalinity so far been used maybe used as a developing solution, but an aqueous solution containing environmentally benign and easily handleable weak bases such as sodium carbonate, potassium carbonate, sodium bicarbonate, potassium bicarbonate and organic carboxylate can also be used. Further, if necessary, various surfactants and organic solvents may be added to a developing solution for the purpose of acceleration and inhibition of developing properties, dispersion of developing scum and improvement of ink affinity with the image area of a printing plate. Anionic surfactants, cationic surfactants, nonionic surfactants and ampholytic surfactants are preferably used.

Further, a developing solution can contain a reducing agent such as hydroquinone, resorcin, sodium salts and potassium salts of inorganic acid such as sulfurous acid and hydrogen sulfurous acid, and further organic carboxylic acid, defoaming agents, and water softeners, if necessary.

The printing plate having been subjected to development process with the above-described developing solution is post-treated with a washing water, a rinsing water containing surfactants, and a desensitizing solution containing gum arabic and starch derivatives. When an image is recorded on the lithographic printing plate precursor of the present invention having an image-forming layer and the printing plate precursor is used as a printing plate, these treatments can be used in various combinations as post-treatment.

When an unnecessary image area is present on the printing plate of the present invention obtained by image exposure, development, washing and/or rinsing and/or gumming (e.g., the film edge trace of the original film), the unnecessary image area is erased. For this erasure, a method of coating an erasing solution on the unnecessary image area, allowing to stand for predetermined time, and then washing with water as disclosed in JP-A-2-13293 is preferably used, and a method of irradiating the unnecessary image area with an actinic ray introduced by an optical fiber and then performing development as disclosed in JP-A-59-174842 is also utilized.

The lithographic printing plate obtained through these treatments is coated with a desensitizing gum, if necessary, and set in offset printing machine and used for printing of a large number of sheets.

EXAMPLE

The present invention is described in detail below with reference to the specific examples, but it should not be construed as the present invention is limited thereto.

Examples 1 to 6

Preparation of Lithographic Printing Plate Precursor (1)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized with a 7% sulfuric acid aqueous solution as the electrolytic solution by direct current and electric density of 15 $A/dm^2$. The anodic oxidation film obtained was 3 $g/m^2$. The plate was then washed with water and dried. The aluminum plate was then immersed in a 2.5 wt % disodium trisilicate aqueous solution (70° C.) for 14 seconds, washed with water and dried.

Coating solution (1) for image-forming layer shown below was coated on the thus-treated aluminum plate by rotary coating at revolving speed of 150 rpm and dried at 80° C. for 3 minutes. The coating weight of the solid contents at this time was 1.2 $g/m^2$. Thus lithographic printing plate precursor (1) was prepared.

Image-forming Layer Coating Solution (1)

| | |
|---|---|
| Polarity conversion high molecular compound (1) (shown below) | 1.288 g |
| Infrared ray absorber (1) (shown below) | 0.236 g |
| 1-Methoxy-2-propanol | 24 g |
| Methanol | 24 g |

Preparation of Lithographic Printing Plate Precursor (2)

Lithographic printing plate precursor (2) was prepared in the same manner as in the preparation of lithographic printing plate precursor (1), except for using image-forming layer coating solution (2) having the composition shown below in place of image-forming layer coating solution (1). The coating weight of the solid contents was 1.1 g/m$^2$.

Image-forming Layer Coating Solution (2)

| | |
|---|---|
| Polarity conversion high molecular compound (2) (shown below) | 1.288 g |
| Infrared ray absorber (1) (shown below) | 0.236 g |
| 1-Methoxy-2-propanol | 24 g |
| Methanol | 24 g |

Preparation of Lithographic Printing Plate Precursor (3)

Lithographic printing plate precursor (3) was prepared in the same manner as in the preparation of lithographic printing plate precursor (1), except for using image-forming layer coating solution (3) having the composition shown below in place of image-forming layer coating solution (1). The coating weight of the solid contents was 1.1 g/m$^2$.

Image-forming Layer Coating Solution (3)

| | |
|---|---|
| Polarity conversion high molecular compound (3) (shown below) | 1.288 g |
| Infrared ray absorber (2) (shown below) | 0.236 g |
| 1-Methoxy-2-propanol | 24 g |
| Methanol | 24 g |

Preparation of Lithographic Printing Plate Precursor (4)

Lithographic printing plate precursor (4) was prepared in the same manner as in the preparation of lithographic printing plate precursor (1), except for using image-forming layer coating solution (4) having the composition shown below in place of image-forming layer coating solution (1). The coating weight of the solid contents was 1.5 g/m$^2$.

Image-forming Layer Coating Solution (4)

| | |
|---|---|
| Polarity conversion high molecular compound (4) (shown below) | 1.288 g |
| Infrared ray absorber (1) (shown below) | 0.236 g |
| Fluorine surfactant, Megafac F-177 (manufactured by Dainippon Chemicals and Ink Co., Ltd.) | 0.06 g |
| 1-Methoxy-2-propanol | 24 g |
| Methanol | 24 g |

Preparation of Lithographic Printing Plate Precursor (5)

Image-forming layer coating solution (5) shown below was coated on an aluminum plate subjected to the same treatment as in the preparation of lithographic printing plate precursor (1) by a rod bar #10 after shaking the solution well with a paint shaker for 1 hour, and dried at 80° C. for 3 minutes. The dry coating weight was 1.3 g/m$^2$. Thus lithographic printing plate precursor (5) was prepared.

Image-forming layer coating solution (5)

| | |
|---|---|
| Polarity conversion high molecular compound (5) (shown below) | 3.56 g |
| Infrared ray absorber (2) (shown below) | 0.236 g |
| Silica gel particles, Sylysia #445 (manufactured by Fuji Silysia) | 0.5 g |
| Glass beads | 5.0 g |
| 1-Methoxy-2-propanol | 24 g |
| Methanol | 24 g |

Preparation of Lithographic Printing Plate Precursor (6)

Lithographic printing plate precursor (6) was prepared in the same manner as in the preparation of lithographic printing plate precursor (5), except for using image-forming layer coating solution (6) having the composition shown below in place of image-forming layer coating solution (5). The coating weight of the solid contents was 1.5 g/m$^2$.

Image-forming Layer Coating Solution (6)

| | |
|---|---|
| Polarity conversion high molecular compound (6) (shown below) | 3.56 g |
| Infrared ray absorber (1) (shown below) | 0.236 g |
| Fluorine surfactant, Megafac F-177 (manufactured by Dainippon Chemicals and Ink Co., Ltd.) | 0.06 g |
| Silica gel particles, Sylysia #445 (manufactured by Fuji Silysia Chemical Co., Ltd.) | 0.5 g |
| 1-Methoxy-2-propanol | 24 g |
| Methanol | 24 g |

Polarity Conversion High Molecular Compound (1)

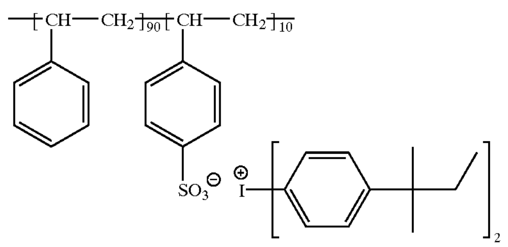

Polarity Conversion High Molecular Compound (2)

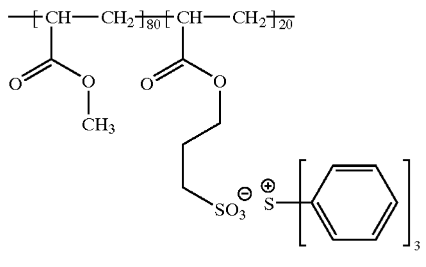

Polarity Conversion High Molecular Compound (3)
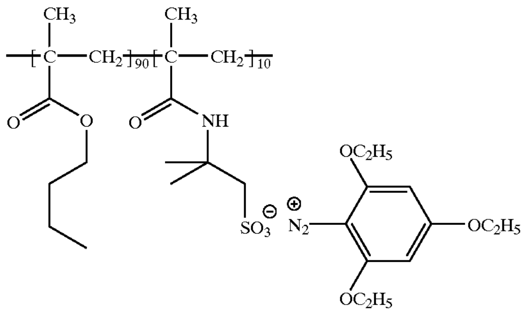
Polarity Conversion High Molecular Compound (4)
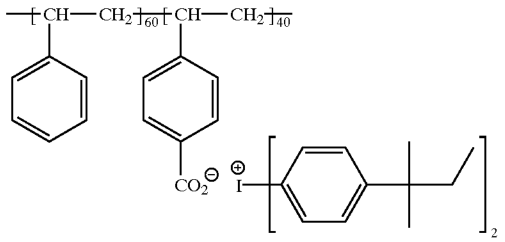
Polarity Conversion High Molecular Compound (5)
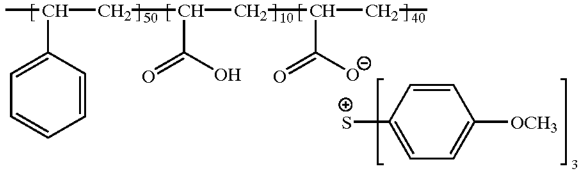
Polarity Conversion High Molecular Compound (6)
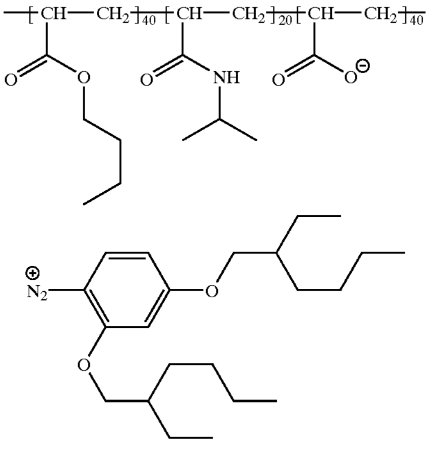
Infrared Ray Absorber (1)
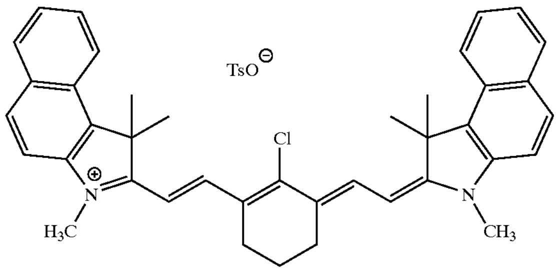
Infrared Ray Absorber (2)
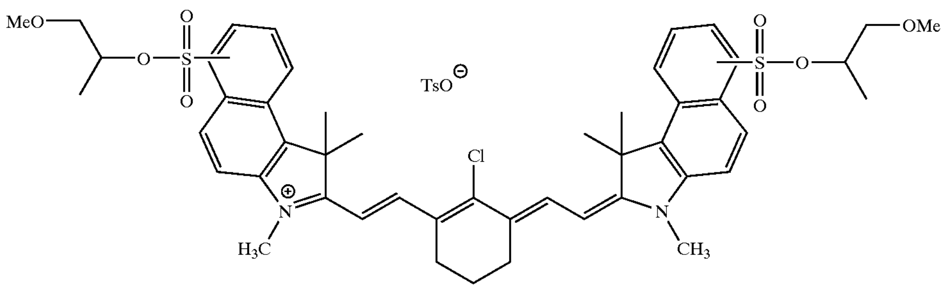

Evaluation of Performance of Lithographic Printing Plate Precursor

Each of the above prepared lithographic printing plate precursors (1) to (6) in Examples 1 to 6 was exposed with a semiconductor laser emitting infrared ray of the wavelength of 840 at main scanning speed of 2.0 m/s. After exposure, lithographic printing plate precursors (1) to (3) were immersed in distilled water and (4) to (6) were immersed in a 1N sodium carbonate aqueous solution respectively for 1 minute, and the line width of non-image area of each sample was observed with an optical microscope. The irradiated energy of the laser corresponding to the line width was obtained and this was taken as sensitivity.

Further, after each of lithographic printing plate precursors (1) to (6) was exposed with a semiconductor laser emitting infrared ray of the wavelength of 840 nm at main scanning speed of 2.0 m/s and 4.0 m/s respectively, printing was performed in a usual manner with no treatment at all with lithographic printing plate precursors (1) to (3), and after being immersed in a 1N sodium carbonate aqueous solution with lithographic printing plate precursors (4) to (6), Heidel KOR-D printing machine was used in printing. Whether staining occurred on the non-image area of the 3,000th sheet of the printed matter or not, and how many sheets of good printed matters could be obtained were evaluated.

The results obtained are shown in Table 1 below.

TABLE 1

| Example No. | Lithographic Printing Plate Precursor | Line Width Sensitivity ($mJ/cm^2$) | Staining in Non-Image Area 2.0 m/s | Staining in Non-Image Area 4.0 m/s | Number of Sheets of Good Printed Matters 2.0 m/s | Number of Sheets of Good Printed Matters 4.0 m/s |
|---|---|---|---|---|---|---|
| Ex. 1 | (1) | 160 | absent | absent | 50,000 | 50,000 |
| Ex. 2 | (2) | 150 | absent | absent | 45,000 | 45,000 |
| Ex. 3 | (3) | 150 | absent | absent | 45,000 | 45,000 |
| Ex. 4 | (4) | 200 | absent | absent | 50,000 | 50,000 |
| Ex. 5 | (5) | 180 | absent | absent | 40,000 | 40,000 |
| Ex. 6 | (6) | 170 | absent | absent | 40,000 | 40,000 |

As is apparent from the results in Table 1, each of lithographic printing plate precursors (1) to (6) according to the present invention showed high sensitivity, staining did not occur on the non-image area of the 3,000th sheet in both cases of exposure at main scanning speed of 2.0 m/s and 4.0 m/s, and 40,000 sheets or more good printed matters could be obtained.

Preparation of Lithographic Printing Plate Precursor (7)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized with a 7% sulfuric acid aqueous solution as the electrolytic solution by direct current and electric density of 15 $A/dm^2$. The anodic oxidation film obtained was 3 $g/m^2$. The plate was then washed with water and dried.

Solution (1) shown below was coated on the thus-treated aluminum plate by rotary coating at revolving speed of 150 rpm and dried at 80° C. for 3 minutes, thereby lithographic printing plate precursor (7) was prepared. The dry coating weight was 1.0 $g/m^2$.

Solution (1)

| | |
|---|---|
| Positive polarity conversion high molecular compound (1) (shown below) | 1.00 g |
| Infrared ray absorber (1) (shown below) | 0.15 g |
| Methyl ethyl ketone | 10 g |
| Methanol | 5 g |
| 1-Methoxy-2-propanol | 5 g |

Preparation of Lithographic Printing Plate Precursor (8)

Lithographic printing plate precursor (8) was prepared in the same manner as in the preparation of lithographic printing plate precursor (7), except for using solution (2) having the composition shown below in place of solution (1). The coating weight of the solid contents was 1.1 $g/m^2$.

Solution (2)

| | |
|---|---|
| Positive polarity conversion high molecular compound (2) (shown below) | 1.00 g |
| Infrared ray absorber (1) | 0.15 g |
| Methyl ethyl ketone | 10 g |
| Methanol | 5 g |
| 1-Methoxy-2-propanol | 5 g |

Preparation of Lithographic Printing Plate Precursor (9)

Lithographic printing plate precursor (9) was prepared in the same manner as in the preparation of lithographic printing plate precursor (7), except for using solution (3) having the composition shown below in place of solution (1). The coating weight of the solid contents was 1.2 $g/m^2$.

Solution (3)

| | |
|---|---|
| Positive polarity conversion high molecular compound (3) (shown below) | 1.00 g |
| Infrared ray absorber (1) | 0.15 g |
| Methanol | 15 g |
| 1-Methoxy-2-propanol | 5.0 g |

Preparation of Lithographic Printing Plate Precursor (10)

Lithographic printing plate precursor (10) was prepared in the same manner as in the preparation of lithographic printing plate precursor (7), except for using solution (4) having the composition shown below in place of solution (1). The coating weight of the solid contents was 1.3 $g/m^2$.

Solution (4)

| | |
|---|---|
| Positive polarity conversion high molecular compound (4) (shown below) | 1.00 g |
| Infrared ray absorber (1) | 0.15 g |
| Dye (Victoria Pure Blue BOH having 1-naphthalenesulfonic acid as the counter ion) | 0.02 g |
| Methanol | 15 g |
| 1-Methoxy-2-propanol | 5.0 g |

Preparation of Lithographic Printing Plate Precursor (11)

Lithographic printing plate precursor (11) was prepared in the same manner as in the preparation of lithographic printing plate precursor (7), except for using solution (5) having the composition shown below in place of solution (1). The coating weight of the solid contents was 1.0 $g/m^2$.

Solution (5)

| | |
|---|---|
| m,p-Cresol/novolak (resin soluble in an alkali aqueous solution, m/p ratio: 6/4, weight average molecular weight: 3,500, contained 0.5 wt % of unreacted cresol) | 1.0 g |
| Infrared absorber (2) (shown below) | 0.2 g |
| Dye (Victoria Pure Blue BOH having 1-naphthalenesulfonic acid as the counter ion) | 0.02 g |
| Fluorine surfactant, Megafac F-177 (manufactured by Dainippon Chemicals and Ink Co., Ltd.) | 0.05 g |
| γ-Butyrolactone | 3.0 g |
| Methyl ethyl ketone | 8.0 g |
| Methanol | 3.0 g |
| 1-Methoxy-2-propanol | 4.0 g |

Preparation of Lithographic Printing Plate Precursor (12)

Lithographic printing plate precursor (12) was prepared in the same manner as in the preparation of lithographic printing plate precursor (7), except for using solution (6) having the composition shown below in place of solution (1). The coating weight of the solid contents was 1.8.g/$m^2$.

Solution (6)

| | |
|---|---|
| Alkali aqueous solution-soluble resin (1) | 11.00 g |
| Infrared absorber (2) | 0.1 g |
| Dye (Victoria Pure Blue BOH having 1-naphthalenesulfonic acid as the counter ion) | 0.02 g |
| Fluorine surfactant, Megafac F-177 (manufactured by Dainippon Chemicals and Ink Co., Ltd.) | 0.05 g |
| γ-Butyrolactone | 8.0 g |
| Methyl ethyl ketone | 8.0 g |
| Methanol | 3.0 g |
| 1-Methoxy-2-propanol | 4.0 g |

Preparation of Lithographic Printing Plate Precursor (13)

Lithographic printing plate precursor (13) was prepared in the same manner as in the preparation of lithographic printing plate precursor (7), except for using solution (7) having the composition shown below in place of solution (1). The coating weight of the solid contents was 1.1 g/$m^2$.

Solution (7)

| | |
|---|---|
| Positive polarity conversion high molecular compound (1) (shown below) | 1.00 g |
| Infrared ray absorber (3) (shown below) | 0.15 g |
| 1-Methoxy-2-propanol | 10 g |
| Acetonitrile | 10 g |

Preparation of Lithographic Printing Plate Precursor (14)

Lithographic printing plate precursor (14) was prepared in the same manner as in the preparation of lithographic printing plate precursor (7), except for using solution (8) having the composition shown below in place of solution (1). The coating weight of the solid contents was 1.2 g/$m^2$.

Solution (8)

| | |
|---|---|
| Positive polarity conversion high molecular compound (3) | 1.00 g |
| Infrared ray absorber (4) (shown below) | 0.15 g |

-continued

| | |
|---|---|
| Methanol | 15 g |
| 1-Methoxy-2-propanol | 5.0 g |

Positive Polarity Conversion High Molecular Compound (1)

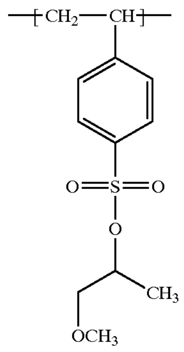

Positive Polarity Conversion High Molecular Compound (2)

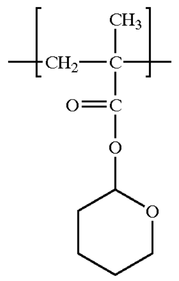

Positive Polarity Conversion High Molecular Compound (3)

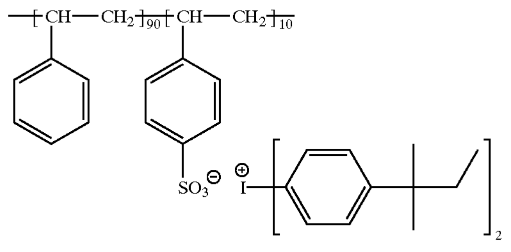

Positive Polarity Conversion High Molecular Compound (4)

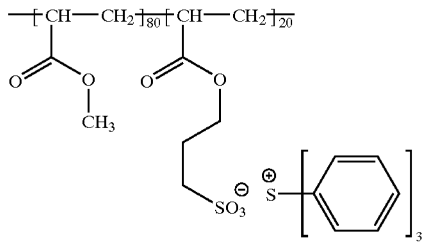

Alkali Aqueous Solution-Soluble Resin (1)

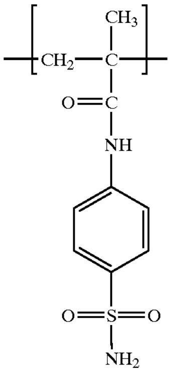

Infrared Ray Absorber (1)

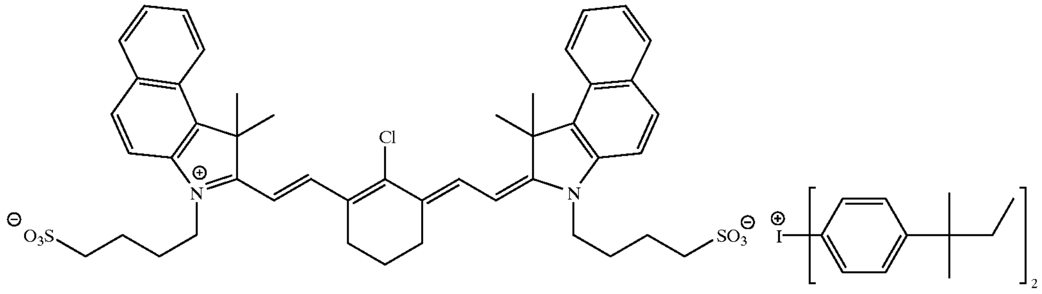

Infrared Ray Absorber (4)

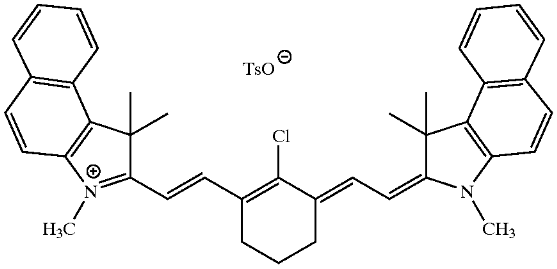

Example 7 and Comparative Example 1

The above-prepared lithographic printing plate precursors (7) and (13) were exposed with an IR laser (beam hole: 28 $\mu$m) emitting infrared ray of the wavelength of 830 nm. After exposure, printing was performed using F Gloss Chinese ink and city water by Lithron printing machine. At this time, whether staining occurred on the non-image area of the printed matter or not, and how many sheets of good printed matters could be obtained were evaluated. Stains were not observed on the non-image area of lithographic printing plate precursor (7) using infrared ray absorber (1) of the present invention and 50,000 sheets of good printed matters could be obtained. On the other hand, in lithographic printing plate precursor (13) using water-soluble infrared ray absorber (3), only 35,000 sheets of good printed matters could be obtained, although stains were not observed on the non-image area.

The reason why difference is generated in number of good printed matters is presumably due to the fact that water-soluble infrared ray absorber (3) contained in the image area of lithographic printing plate precursor (13) is dissolved by Infrared Ray Absorber (2)

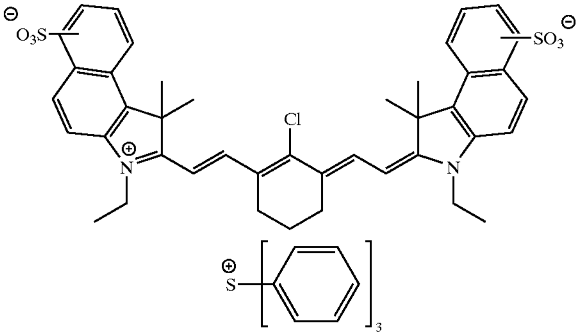

Infrared Ray Absorber (3)

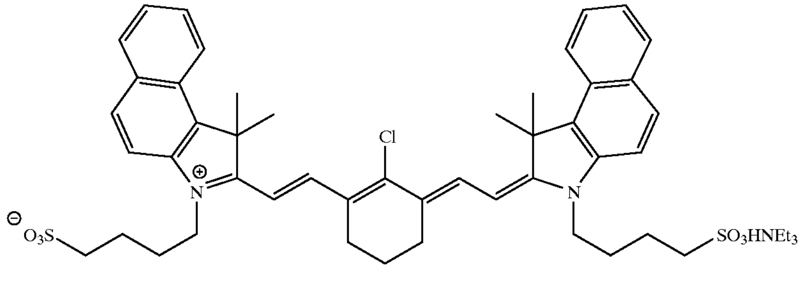

the fountain solution during printing and comes out of the image area, thus the durability of the image area is gradually deteriorated. On the other hand, since hydrophobic infrared ray absorber (1) is contained in the image area of lithographic printing plate precursor (7), the durability of the image area is not deteriorated by the fountain solution during printing.

Example 8 and Comparative Example 2

The above-prepared lithographic printing plate precursors (9) and (14) were exposed with an IR laser (beam hole: 28 μm) emitting infrared ray of the wavelength of 830 nm. After exposure, printing was performed using F Gloss Chinese ink and city water by Lithron printing machine. At this time, whether staining occurred on the non-image area of the printed matter or not, and how many sheets of good printed matters could be obtained were evaluated. Stains were not observed on the non-image areas of both lithographic printing plate precursors and 50,000 sheets of good printed matters could be obtained. However, when lithographic printing plate precursors (9) and (14) subjected to the same exposure were printed using a red ink containing varnish and city water by Lithron printing machine, stains were not observed on the non-image area of lithographic printing plate precursor (9) in which infrared ray absorber (1) of the present invention was used, and 50,000 sheets of good printed matters could be obtained. Contrary to this, stains were observed a little on the non-image area of lithographic printing plate precursor (14) in which hydrophobic infrared ray absorber (4) was used, although 50,000 sheets of good printed matters could be obtained.

The reason why difference is generated in stain resistance of the non-image area is presumably due to the fact that hydrophobic infrared ray absorber (4) contained in the exposed area of lithographic printing plate precursor (14) is almost removed with the high molecular compound but the infrared ray absorber is not dissolved by fountain solution during printing and a part of infrared ray absorber (4) remains in the image area without coming out. On the other hand, since hydrophobic infrared ray absorber (1) in the exposed area of lithographic printing plate precursor (9) is converted into hydrophilic, the infrared ray absorber is easily removed by the fountain solution during printing and does not remain in the non-image area.

Examples 9 to 12

Each of the above obtained lithographic printing plate precursors (8), (10) to (12) was exposed with an IR laser (beam hole: 28 μm) emitting infrared ray of the wavelength of 830 nm. After exposure, lithographic printing plate precursor (10) was subjected to printing in a usual manner by Lithron printing machine, and other lithographic printing plate precursors were development processed using an automatic processor PS Processor 900VR (manufactured by Fuji Photo Film Co., Ltd.) charged with a developing solution DP-4 and a rinsing solution FR-3 (1/7) (products of Fuji Photo Film Co., Ltd.). DP-4 was diluted to 1/6. At this time, whether staining occurred on the non-image area of the printed matter or not, and how many sheets of good printed matters could be obtained were evaluated. The results obtained are shown in Table 2 below.

Further, the part scanned with the laser of the obtained printing plate was observed with a microscope, and sensitivity was estimated by measuring the obtained line width. The nearer the line width to 28 μm of the irradiation beam hole, the higher is the sensitivity.

TABLE 2

| Example No. | Lithographic Printing Plate Precursor | Staining | Nunber of Sheets of Good Printed Matters | Sensitivity (μm) |
|---|---|---|---|---|
| Example 9 | (8) | absent | 40,000 | 24 |
| Example 10 | (10) | absent | 50,000 | 24 |
| Example 11 | (11) | absent | 65,000 | 25 |
| Example 12 | (12) | absent | 60,000 | 26 |

As is apparent from the results in Table 2, any of lithographic printing plate precursors (7) to (12) according to the present invention is high in sensitivity, generates no stains on the non-image area of the printed matters, and can provide 40,000 sheets or more good printed matters (press life), thus satisfactory results can be obtained. Contrary to this, comparative lithographic printing plate precursors (13) and (14) are unsatisfactory either in stain resistance or in press life.

Examples 13 to 20 and Comparative Example 3

Preparation of Lithographic Printing Plate Precursor (15)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized with a 7% sulfuric acid aqueous solution as the electrolytic solution by direct current and electric density of 15 $A/dm^2$. The anodic oxidation film obtained was 3 $g/m^2$. The plate was then washed with water and dried. The aluminum plate was then immersed in a 2.5 wt % disodium trisilicate aqueous solution (70° C.) for 14 seconds, washed with water and dried.

Coating solution (1) for image-forming layer shown below was coated on the thus-treated aluminum plate by rotary coating at revolving speed of 150 rpm and dried at 80° C. for 3 minutes. The coating weight of the solid contents at this time was 1.2 $g/m^2$. Thus lithographic printing plate precursor (15) was prepared.

Image-forming Layer Coating Solution (1)

| | |
|---|---|
| Polarity conversion high molecular compound (1) (shown below) | 1.288 g |
| Infrared ray absorber (1) (shown below) | 0.236 g |
| Decomposition accelerating compound (1) (shown below) | 0.1 g |
| 1-Methoxy-2-propanol | 24 g |
| Methanol | 24 g |

Preparation of Lithographic Printing Plate Precursor (16)

Lithographic printing plate precursor (16) was prepared in the same manner as in the preparation of lithographic printing plate precursor (15), except for using image-forming layer coating solution (2) having the composition shown below in place of image-forming layer coating solution (1). The coating weight of the solid contents was 1.1 $g/m^2$.

Image-forming Layer Coating Solution (2)

| | |
|---|---|
| Polarity conversion high molecular compound (2) (shown below) | 1.288 g |
| Infrared ray absorber (1) (shown below) | 0.236 g |
| Decomposition accelerating compound (1) | 0.193 g |
| 1-Methoxy-2-propanol | 24 g |
| Methanol | 24 g |

Preparation of Lithographic Printing Plate Precursor (17)

Lithographic printing plate precursor (17) was prepared in the same manner as in the preparation of lithographic printing plate precursor (15), except for using image-forming layer coating solution (3) having the composition shown below in place of image-forming layer coating solution (1). The coating weight of the solid contents was 1.1 g/m$^2$.

Image-forming layer coating solution (3)

| | |
|---|---|
| Polarity conversion high molecular compound (3) (shown below) | 1.288 g |
| Infrared ray absorber (2) (shown below) | 0.236 g |
| Decomposition accelerating compound (2) (shown below) | 0.230 g |
| 1-Methoxy-2-propanol | 24 g |
| Methanol | 24 g |

Preparation of Lithographic Printing Plate Precursor (18)

Lithographic printing plate precursor (18) was prepared in the same manner as in the preparation of lithographic printing plate precursor (15), except for using image-forming layer coating solution (4) having the composition shown below in place of image-forming layer coating solution (1). The coating weight of the solid contents was 1.5 g/m$^2$.

Image-forming Layer Coating Solution (4)

| | |
|---|---|
| Polarity conversion high molecular compound (4) (shown below) | 1.288 g |
| Infrared ray absorber (1) | 0.236 g |
| Decomposition accelerating compound (3) (shown below) | 0.377 g |
| Fluorine surfactant, Megafac F-177 (manufactured by Dainippon Chemicals and Ink Co., Ltd.) | 0.06 g |
| 1-Methoxy-2-propanol | 24 g |
| Methanol | 24 g |

Preparation of Lithographic Printing Plate Precursor (19)

Image-forming layer coating solution (5) shown below was coated on an aluminum plate subjected to the same treatment as in the preparation of lithographic printing plate precursor (15) by a rod bar #10 after shaking the solution well with a paint shaker for 1 hour, and dried at 80° C. for 3 minutes. The dry coating weight was 1.3 g/m$^2$. Thus lithographic printing plate precursor (19) was prepared.

Image-forming layer coating solution (5)

| | |
|---|---|
| Polarity conversion high molecular compound (5) (shown below) | 3.56 g |
| Infrared ray absorber (2) | 0.236 g |
| Decomposition accelerating compound (3) | 1.32 g |
| Silica gel particles, Sylysia #445 (manufactured by Fuji Silysia Chemical Co., Ltd.) | 0.5 g |
| Glass beads | 5.0 g |
| 1-Methoxy-2-propanol | 24 g |
| Methanol | 24 g |

Preparation of Lithographic Printing Plate Precursor (20)

Lithographic printing plate precursor (20) was prepared in the same manner as in the preparation of lithographic printing plate precursor (19), except for using image-forming layer coating solution (6) having the composition shown below in place of image-forming layer coating solution (5). The coating weight of the solid contents was 1.5 g/m$^2$.

Image-forming Layer Coating Solution (6)

| | |
|---|---|
| Polarity conversion high molecular compound (6) (shown below) | 3.56 g |
| Infrared ray absorber (1) | 0.236 g |
| Decomposition accelerating compound (4) (shown below) | 2.12 g |
| Fluorine surfactant, Megafac F-177 (manufactured by Dainippon Chemicals and Ink Co., Ltd.) | 0.06 g |
| Silica gel particles, Sylysia #445 (manufactured by Fuji Silysia Chemical Co., Ltd.) | 0.5 g |
| 1-Methoxy-2-propanol | 24 g |
| Methanol | 24 g |

Preparation of Lithographic Printing Plate Precursor (21)

Lithographic printing plate precursor (21) was prepared in the same manner as in the preparation of lithographic printing plate precursor (15), except for using image-forming layer coating solution (7) having the composition shown below in place of image-forming layer coating solution (1). The coating weight of the solid contents was 1.3 g/m$^2$.

Image-forming Layer Coating Solution (7)

| | |
|---|---|
| Polarity conversion high molecular compound (7) (shown below) | 1.288 g |
| Infrared ray absorber (1) | 0.236 g |
| 1-Methoxy-2-propanol | 24 g |
| Methanol | 24 g |

Preparation of Lithographic Printing Plate Precursor (22)

Lithographic printing plate precursor (22) was prepared in the same manner as in the preparation of lithographic printing plate precursor (15), except for using image-forming layer coating solution (8) having the composition shown below in place of image-forming layer coating solution (1). The coating weight of the solid contents was 1.2 g/m$^2$.

Image-forming Layer Coating Solution (8)

| | |
|---|---|
| Polarity conversion high molecular compound (8) (shown below) | 1.288 g |
| Infrared ray absorber (2) | 0.236 g |
| Fluorine surfactant, Megafac F-177 (manufactured by Dainippon Chemicals and Ink Co., Ltd.) | 0.06 g |

-continued

| | |
|---|---|
| 1-Methoxy-2-propanol | 24 g |
| Methanol | 24 g |

Preparation of Lithographic Printing Plate Precursor (23)

Lithographic printing plate precursor (23) was prepared in the same manner as in the preparation of lithographic printing plate precursor (15), except for using image-forming layer coating solution (9) having the composition shown below in place of image-forming layer coating solution (1). The coating weight of the solid contents was 1.0 g/m$^2$.

Image-forming Layer Coating Solution (9)

| | |
|---|---|
| Polarity conversion high molecular compound (1) | 1.288 g |
| Infrared ray absorber (1) | 0.236 g |
| 1-Methoxy-2-propanol | 24 g |
| Methanol | 24 g |

Polarity Conversion High Molecular Compound (1)

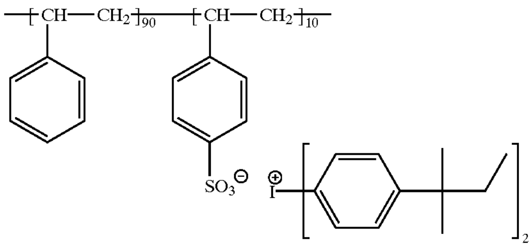

Polarity Conversion High Molecular Compound (2)

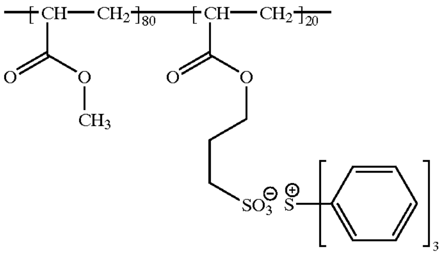

Polarity Conversion High Molecular Compound (3)

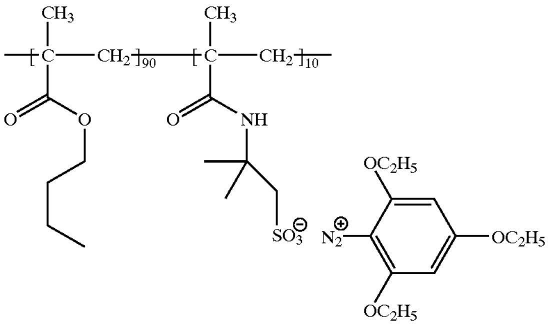

Polarity Conversion High Molecular Compound (4)

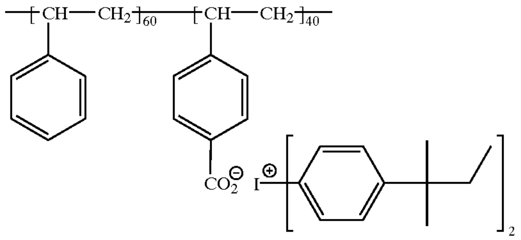

Polarity Conversion High Molecular Compound (5)

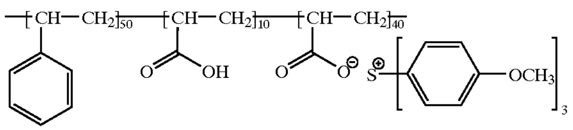

Polarity Conversion High Molecular Compound (6)

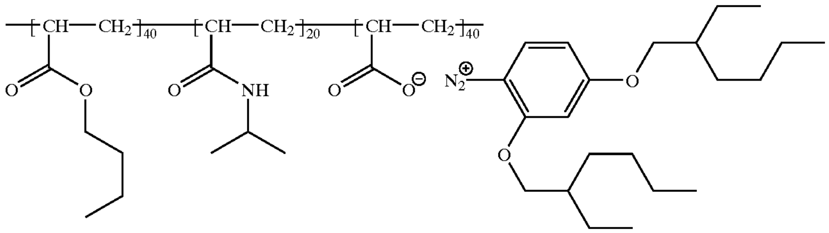

Polarity Conversion High Molecular Compound (7)

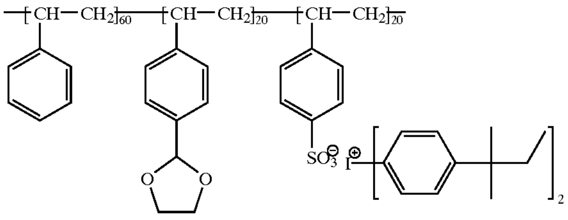

Polarity Conversion High Molecular Compound (8)

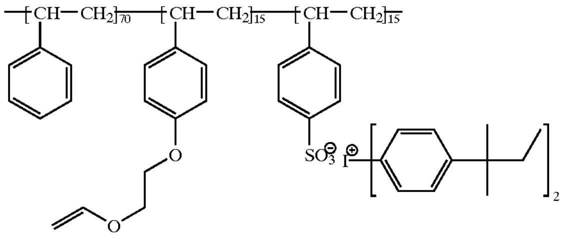

Infrared Ray Absorber (1)

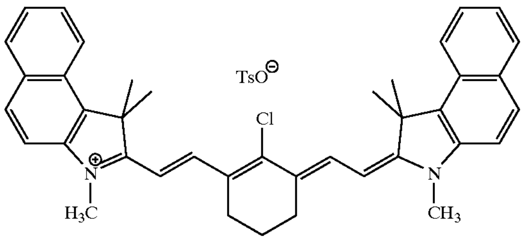

Infrared Ray Absorber (2)

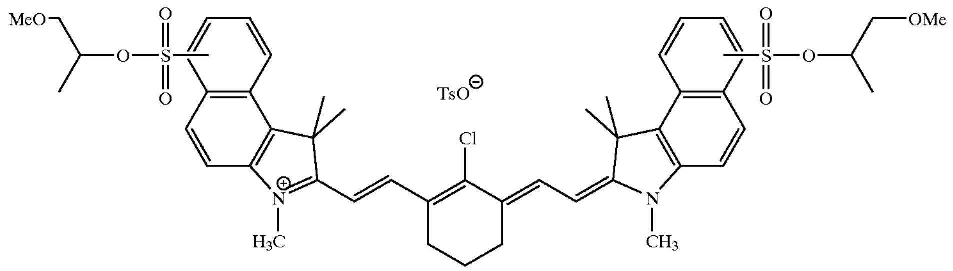

Decomposition Accelerating Compound (1)

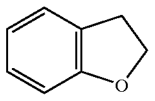

Decomposition Accelerating Compound (2)

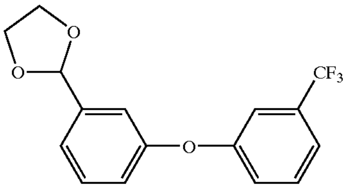

Decomposition Accelerating Compound (3)

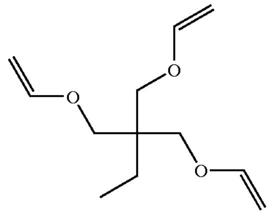

Decomposition Accelerating Compound (4)

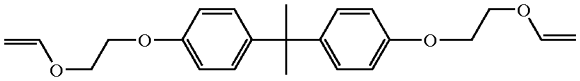

Evaluation of Performance of Lithographic Printing Plate Precursor

Each of the above prepared lithographic printing plate precursors (15) to (23) in Examples 13 to 20 and Comparative Example 3 was exposed with a semiconductor laser emitting infrared ray of the wavelength of 840 nm at main scanning speed of 2.0 m/s. After exposure, lithographic printing plate precursors (15) to (17), (21) to (23) were immersed in distilled water and (18) to (20) were immersed in a 1N sodium carbonate aqueous solution respectively for 1 minute, and the line width of non-image area of each sample was observed with an optical microscope. The irradiated energy of the laser corresponding to the line width was obtained and this was taken as sensitivity.

Further, after each of lithographic printing plate precursors (15) to (23) was exposed with a semiconductor laser emitting infrared ray of the wavelength of 840 nm at main scanning speed of 2.0 m/s and 4.0 m/s respectively, printing was performed in a usual manner with no treatment at all with lithographic printing plate precursors (15) to (17) and (21) to (23), and after being immersed in a 1N sodium carbonate aqueous solution with lithographic printing plate precursors (18) to (20). Heidel KOR-D printing machine was used in printing. Whether staining occurred on the non-image area of the 3,000th sheet of the print or not, and how many sheets of good printed matters could be obtained were evaluated. The results obtained are shown in Table 3 below.

TABLE 3

| Example No. | Lithographic Printing Plate Precursor | Line Width Sensitivity (mJ/cm$^2$) | Staining in Non-Image Area 2.0 m/s | Staining in Non-Image Area 4.0 m/s | Number of Sheets of Good Printed Matters 2.0 m/s | Number of Sheets of Good Printed Matters 4.0 m/s |
|---|---|---|---|---|---|---|
| Ex. 13 | (15) | 120 | absent | absent | 50,000 | 50,000 |
| Ex. 14 | (16) | 130 | absent | absent | 45,000 | 45,000 |
| Ex. 15 | (17) | 120 | absent | absent | 45,000 | 45,000 |
| Ex. 16 | (18) | 130 | absent | absent | 50,000 | 50,000 |
| Ex. 17 | (19) | 100 | absent | absent | 40,000 | 40,000 |
| Ex. 18 | (20) | 110 | absent | absent | 40,000 | 40,000 |
| Ex. 19 | (21) | 90 | absent | absent | 50,000 | 50,000 |
| Ex. 20 | (22) | 120 | absent | absent | 45,000 | 45,000 |
| Comp. Ex. 3 | (23) | 160 | absent | absent | 50,000 | 50,000 |

As is apparent from the results in Table 3, each of lithographic printing plate precursors (15) to (22) according to the present invention showed high sensitivity, staining did not occur on the non-image area of the 3,000th sheet in both cases of exposure at main scanning speed of 2.0 m/s and 4.0 m/s, and 40,000 sheets or more good printed matters could be obtained.

Preparation of Lithographic Printing Plate Precursor (24)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 g/m$^2$. The plate was anodized with a 7% sulfuric acid aqueous solution as the electrolytic solution by direct current and electric density of 15 A/dm$^2$. The anodic oxidation film obtained was 3 g/m$^2$. The plate was then washed with water and dried.

Solution (1) shown below was coated on the thus-treated aluminum plate by rotary coating at revolving speed of 150 rpm and dried at 80° C. for 3 minutes, thereby lithographic printing plate precursor (24) was prepared. The dry coating weight was 1.0 g/m$^2$.

Image-forming Layer Coating Solution (1)

| | |
|---|---|
| Positive polarity conversion high molecular compound (1) (shown below) | 1.00 g |
| Infrared ray absorber (1) (shown below) | 0.15 g |
| Decomposition accelerating compound (1) (shown below) | 0.02 g |
| Methyl ethyl ketone | 10 g |
| Methanol | 5 g |
| 1-Methoxy-2-propanol | 5 g |

Preparation of Lithographic Printing Plate Precursor (25)

Lithographic printing plate precursor (25) was prepared in the same manner as in the preparation of lithographic printing plate precursor (24), except for using image-forming layer coating solution (2) having the composition shown below in place of image-forming layer coating solution (1). The coating weight of the solid contents was 1.1 g/m$^2$.

Image-forming Layer Coating Solution (2)

| | |
|---|---|
| Positive polarity conversion high molecular compound (2) (shown below) | 1.00 g |
| Infrared ray absorber (2) (shown below) | 0.20 g |
| Decomposition accelerating compound (2) (shown below) | 0.01 g |
| Methyl ethyl ketone | 10 g |
| Methanol | 5 g |
| 1-Methoxy-2-propanol | 5 g |

Preparation of Lithographic Printing Plate Precursor (26)

Lithographic printing plate precursor (26) was prepared in the same manner as in the preparation of lithographic printing plate precursor (24), except for using image-forming layer coating solution (3) having the composition shown below in place of image-forming layer coating solution (1). The coating weight of the solid contents was 1.2 g/m$^2$.

Image-forming Layer Coating Solution (3)

| | |
|---|---|
| Positive polarity conversion high molecular compound (3) (shown below) | 1.00 g |
| Infrared ray absorber (1) | 0.15 g |
| Decomposition accelerating compound (3) (shown below) | 0.01 g |
| Methanol | 15.0 g |
| 1-Methoxy-2-propanol | 5.0 g |

Preparation of Lithographic Printing Plate Precursor (27)

Lithographic printing plate precursor (27) was prepared in the same manner as in the preparation of lithographic printing plate precursor (24), except for using image-forming layer coating solution (4) having the composition shown below in place of image-forming layer coating solution (1). The coating weight of the solid contents was 1.3 g/m$^2$.

Image-forming Layer Coating Solution (4)

| | |
|---|---|
| Positive polarity conversion high molecular compound (4) (shown below) | 1.00 g |
| Infrared ray absorber (1) | 0.20 g |
| Decomposition accelerating compound (4) (shown below) | 0.03 g |
| Dye (Victoria Pure Blue BOR having 1-naphthalenesulfonic acid as the counter ion) | 0.02 g |
| Methanol | 15.0 g |
| 1-Methoxy-2-propanol | 5.0 g |

Preparation of Lithographic Printing Plate Precursor (28)

Lithographic printing plate precursor (28) was prepared in the same manner as in the preparation of lithographic printing plate precursor (24), except for using image-forming layer coating solution (5) having the composition shown below in place of image-forming layer coating solution (1). The coating weight of the solid contents was 1.0 g/m$^2$.

Image-forming Layer Coating Solution (5)

| | |
|---|---|
| m,p-Cresol/novolak (resin soluble in an alkali aqueous solution, m/p ratio: 6/4, weight average molecular weight: | 1.00 g |

-continued

| | |
|---|---|
| 3,500, contained 0.5 wt % of unreacted cresol) | |
| Infrared absorber (2) (shown below) | 0.2 g |
| Decomposition accelerating compound (2) | 0.01 g |
| Dye (Victoria Pure Blue BOH having 1-naphthalenesulfonic acid as the counter ion) | 0.02 g |
| Fluorine surfactant, Megafac F-177 (manufactured by Dainippon Chemicals and Ink Co., Ltd.) | 0.05 g |
| γ-Butyrolactone | 3.0 g |
| Methyl ethyl ketone | 8.0 g |
| Methanol | 3.0 g |
| 1-Methoxy-2-propanol | 4.0 g |

Preparation of Lithographic Printing Plate Precursor (29)

Lithographic printing plate precursor (29) was prepared in the same manner as in the preparation of lithographic printing plate precursor (24), except for using image-forming layer coating solution (6) having the composition shown below in place of image-forming layer coating solution (1). The coating weight of the solid contents was 1.8 g/m$^2$.

Image-forming Layer Coating Solution (6)

| | |
|---|---|
| Alkali aqueous solution-soluble resin (1) (shown below) | 11.00 g |
| Infrared absorber (1) | 0.2 g |
| Decomposition accelerating compound (4) | 0.06 g |
| Dye (Victoria Pure Blue BOH having 1-naphthalenesulfonic acid as the counter ion) | 0.02 g |
| Fluorine surfactant, Megafac F-177 (manufactured by Dainippon Chemicals and Ink Co., Ltd.) | 0.05 g |
| γ-Butyrolactone | 8.0 g |
| Methyl ethyl ketone | 8.0 g |
| Methanol | 3.0 g |
| 1-Methoxy-2-propanol | 4.0 g |

Preparation of Lithographic Printing Plate Precursor (30)

Lithographic printing plate precursor (30) was prepared in the same manner as in the preparation of lithographic printing plate precursor (24), except for using image-forming layer coating solution (7) having the composition shown below in place of image-forming layer coating solution (1). The coating weight of the solid contents was 1.1 g/m$^2$.

Image-forming Layer Coating Solution (7)

| | |
|---|---|
| Positive polarity conversion high molecular compound (1) | 1.00 g |
| Infrared ray absorber (1) | 0.20 g |
| Methyl ethyl ketone | 10.0 g |
| Methanol | 5.0 g |
| 1-Methoxy-2-propanol | 5.0 g |
| Acetonitrile | 10 g |

Preparation of Lithographic Printing Plate Precursor (31)

Lithographic printing plate precursor (31) was prepared in the same manner as in the preparation of lithographic printing plate precursor (24), except for using image-forming layer coating solution (8) having the composition shown below in place of image-forming layer coating solution (1). The coating weight of the solid contents was 1.1 g/m$^2$.

Image-forming Layer Coating Solution (8)

| | |
|---|---|
| Positive polarity conversion high molecular compound (3) | 1.00 g |
| Infrared ray absorber (1) | 0.20 g |
| Methanol | 15.0 g |
| 1-Methoxy-2-propanol | 5.0 g |

Positive Polarity Conversion High Molecular Compound (1)

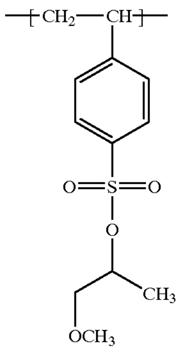

Positive Polarity Conversion High Molecular Compound (2)

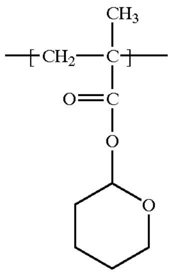

Positive Polarity Conversion High Molecular Compound (3)

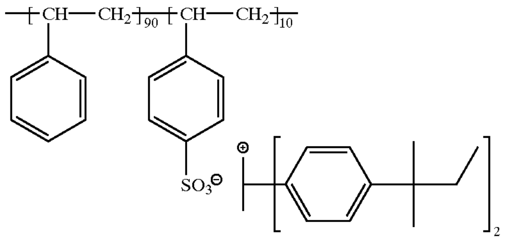

Positive Polarity Conversion High Molecular Compound (4)

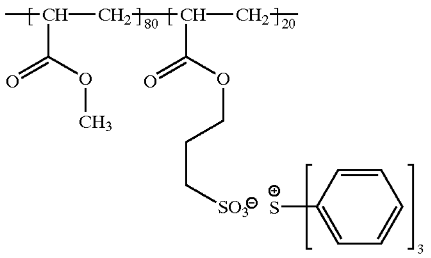

Alkali Aqueous Solution-Soluble Resin (1)

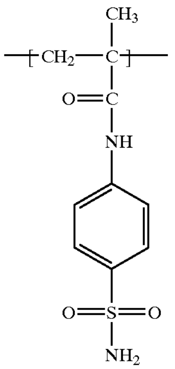

Infrared Ray Absorber (1)

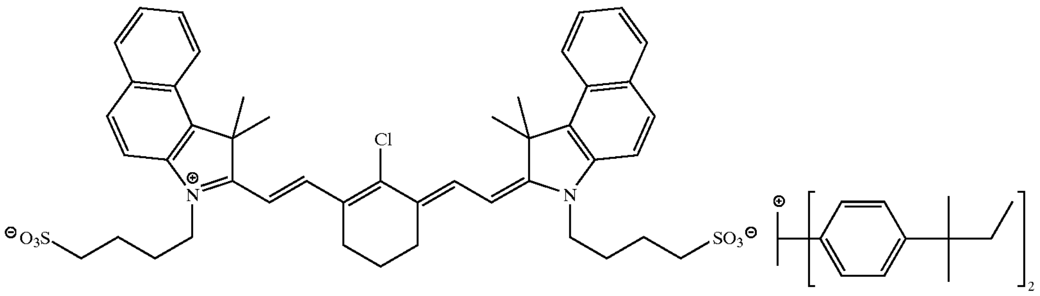

Infrared Ray Absorber (2)

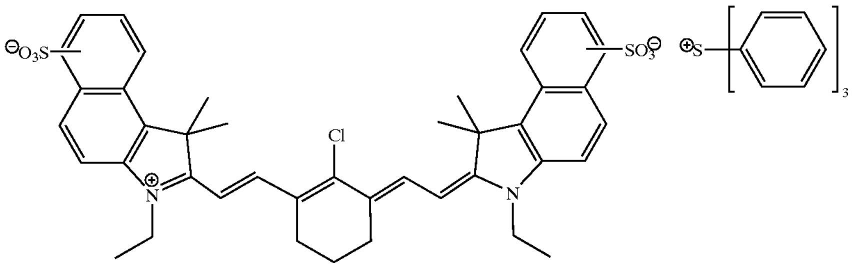

Decomposition Accelerating Compound (1)

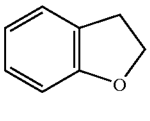

Decomposition Accelerating Compound (2)

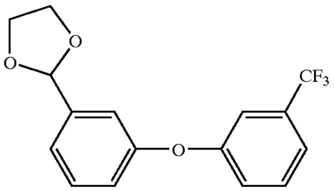

Decomposition Accelerating Compound (3)

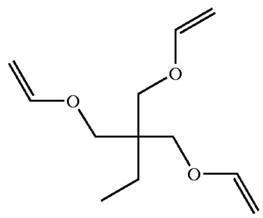

Decomposition Accelerating Compound (4)

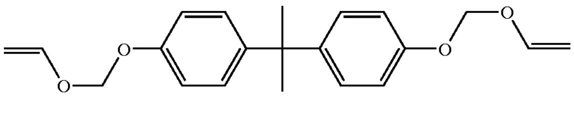

Examples 21 to 26 and Comparative Examples 4 and 5

The above-prepared lithographic printing plate precursors (24) and (31) were exposed with an IR laser (beam hole: 28 mm) emitting infrared ray of the wavelength of 830 nm. After exposure, printing was performed using F Gloss Chinese ink and city water by Lithron printing machine. At this time, whether staining occurred on the non-image area of the printed matter or not, and how many sheets of good prints could be obtained were evaluated.

Further, the part scanned with the laser of the obtained printing plate was observed with a microscope, and sensitivity was estimated by measuring the obtained line width. The nearer the line width to 28 mm of the irradiation beam hole, the higher is the sensitivity. The results obtained are shown in Table 4.

TABLE 4

| Example No. | Lithographic Printing Plate Precursor | Staining | Number of Sheets of Good Printed Matters | Sensitivity ($\mu$m) |
|---|---|---|---|---|
| Example 21 | (24) | absent | 50,000 | 28 |
| Example 22 | (25) | absent | 45,000 | 27 |
| Example 23 | (26) | absent | 40,000 | 27 |
| Example 24 | (27) | absent | 50,000 | 27 |
| Example 25 | (28) | absent | 65,000 | 27 |
| Example 26 | (29) | absent | 60,000 | 28 |
| Comp. Ex. 4 | (30) | absent | 50,000 | 24 |
| Comp. Ex. 5 | (31) | absent | 45,000 | 23 |

As is apparent from the results in Table 4, any of lithographic printing plate precursors (24) to (29) according to the present invention is high in sensitivity, generates no stains on the non-image area of the printed matters, and can provide 40,000 sheets or more good printed matters (press life), thus satisfactory results can be obtained.

EFFECT OF THE INVENTION

The lithographic printing plate precursor according to the present invention contains, in an image-forming layer, a hydrophobic high molecular compound having a specific functional group which is converted into hydrophilic by irradiation with actinic radiation and/or heating. Due to this constitution, the lithographic printing plate precursor of the present invention has high sensitivity and can provide clear printed matters having no residual colors. In particular, the lithographic printing plate precursor according to the present invention is capable of direct plate-making from digital data by recording with a solid state laser emitting infrared rays and a semiconductor laser.

Further, the present invention can provide an extremely simple and practicable lithographic printing plate precursor capable of being developed with water or a weak alkali aqueous solution, or requiring no special treatment such as wet development process or rubbing.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a support having a hydrophilic surface having provided thereon an image-forming layer containing a hydrophobic high molecular compound having at least either a functional group represented by formula (1) or a functional group represented by formula (2):

(1)

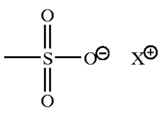

-continued (2)

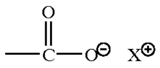

wherein $X^+$ represents an iodonium ion, a sulfonium ion or a diazonium ion represented by formula (7):

(7)

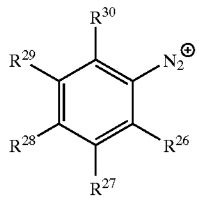

wherein $R^{26}$ to $R^{30}$ each represents a hydrogen atom, a halogen atom, a cyano group, a nitro group, an alkyl group, an aryl group, an alkynyl group, an alkenyl group, or a functional group represented by any of the following formulae:

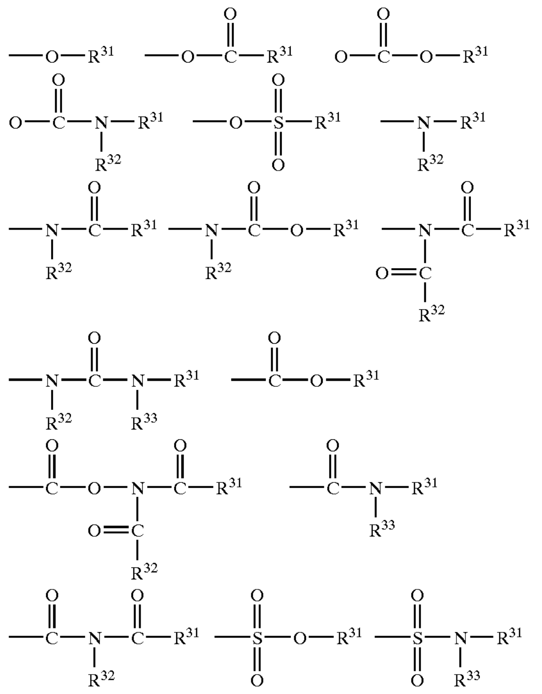

wherein $R^{31}$, $R^{32}$ and $R^{33}$ each represents a hydrogen atom, an alkyl group, an aryl group, an alkynyl group or an alkenyl group and arbitrary two of $R^{26}$ to $R^{30}$ may form a ring.

2. The lithographic printing plate precursor as claimed in claim 1, wherein the image-forming layer contains a compound having at least either a functional group represented by formula (3) or a functional group represented by formula (4):

(3)

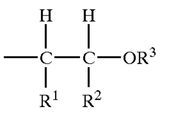

-continued

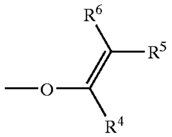

(4)

wherein $R^1$ and $R^2$ each represents a hydrogen atom, an alkyl group, an aryl group, an alkynyl group or an alkenyl group; $R^3$ represents an alkyl group, an aryl group, an alkynl group or an alkenyl group; $R^4$ represents a hydrogen atom, an alkyl group, an aryl group, an alkynyl group or an alkenyl group; either $R^5$ or $R^6$ represents a hydrogen atom and the other represents a hydrogen atom, an alkyl group, an aryl group, an alkynyl group or an alkenyl group; and arbitrary two of $R^1$, $R^2$ and $R^3$ may form a ring, and arbitrary two of $R^4$, $R^5$ and $R^6$ may form a ring.

* * * * *